United States Patent [19]
Murata et al.

[11] Patent Number: 5,243,182
[45] Date of Patent: Sep. 7, 1993

US005243182A

[54] PHOTOELECTRIC SWITCH INCLUDING SYNCH TIMING SIGNAL EMITTER AND DETECTOR AND PHOTOELECTRIC DETECTOR SYSTEM USING THE SAME

[75] Inventors: Hisashi Murata; Kazuo Hasegawa; Hironobu Watanabe, all of Furukawa; Ikuo Ouchi, Hanamaki, all of Japan

[73] Assignee: Alps Electric Co., Ltd., Tokyo, Japan

[21] Appl. No.: 847,976

[22] Filed: Mar. 5, 1992

[30] Foreign Application Priority Data

| Mar. 14, 1991 | [JP] | Japan | 3-73715 |
| Apr. 10, 1991 | [JP] | Japan | 3-103542 |
| Apr. 15, 1991 | [JP] | Japan | 3-33295 |
| Apr. 15, 1991 | [JP] | Japan | 3-33333 |
| Jul. 3, 1991 | [JP] | Japan | 3-188328 |
| Jul. 3, 1991 | [JP] | Japan | 3-188329 |
| Jul. 26, 1991 | [JP] | Japan | 3-66014 |
| Aug. 27, 1991 | [JP] | Japan | 3-238864 |

[51] Int. Cl.$^5$ .................................................. G01V 9/04
[52] U.S. Cl. .................................. 250/222.1; 250/221; 340/556
[58] Field of Search .................. 250/222.1, 221, 208.3, 250/208.4, 214 R; 340/556, 555

[56] References Cited

U.S. PATENT DOCUMENTS

| 4,381,446 | 4/1983 | Fukuyama et al. | 250/214 R |
| 4,650,990 | 3/1987 | Jönsson | 250/221 |
| 5,003,169 | 3/1991 | Sakaguchi et al. | 250/221 |
| 5,077,467 | 12/1991 | Barron, Jr. et al. | 250/221 |
| 5,130,532 | 7/1992 | Clemens | 250/221 |

*Primary Examiner*—David C. Nelms
*Assistant Examiner*—Que T. Le
*Attorney, Agent, or Firm*—Guy W. Shoup; Patrick T. Bever

[57] ABSTRACT

This invention relates to a photoelectric switch and a photoelectric detector for detecting the presence or absence of an object by using a light, and more particularly to prevention of mutual interference in the case of using a plurality of photoelectric switches. For example, an LED in a light emitting unit intermittently emits a sensing light at the timing of an output pulse from a pulse generator. The resultant pulse is divided in frequency by a frequency divider and then delayed by a one-shot circuit. At the timing of an output pulse from the one-shot circuit, another LED emits a transmission light to a photoelectric switch at next stage. Therefore, the transmission light is always delayed from the sensing light. The transmission light from the preceding photoelectric switch of the same construction is received by a photodiode, and an output pulse is outputted from a pulse generator in synchronism with a synch timing signal produced from the light receiving unit. Thus, the sensing lights from the respective photoelectric switches are emitted at the timings shifted from one another through delays effected by the one-shot circuits.

18 Claims, 59 Drawing Sheets

$$P_A = P^N \quad \cdots\cdots\cdots\cdots\cdots\cdots\cdots\cdots \quad (1)$$
$$P_B \neq {}_NC_m P^{m+1}(1-P)^{N-m-1} \quad \cdots\cdots \quad (2)$$

| N | MALFUNCTION RATE DURING LIGHT RECEPTION $P_A$ | ALLOWANCE NUMBER OF INTERFERENCES m | MALFUNCTION RATE DURING LIGHT INTERRUPION $P_B$ |
|---|---|---|---|
| 4 | $1.0 \times 10^{-8}$ | 0 | 0.039 |
| | | 1 | $5.9 \times 10^{-4}$ |
| 8 | $1.0 \times 10^{-16}$ | 0 | 0.773 |
| | | 2 | $5.4 \times 10^{-5}$ |
| | | 4 | $5.5 \times 10^{-9}$ |
| 12 | $4.1 \times 10^{-21}$ | 4 | $2.3 \times 10^{-6}$ |
| | | 6 | $9.3 \times 10^{-10}$ |
| 15 | $3.3 \times 10^{-26}$ | 5 | $2.7 \times 10^{-7}$ |
| | | 7 | $1.5 \times 10^{-10}$ |

PHOTOELECTRIC SWITCH INCLUDING SYNCH TIMING SIGNAL EMITTER AND DETECTOR AND PHOTOELECTRIC DETECTOR SYSTEM USING THE SAME

FIELD OF THE INVENTION

The present invention relates to a photoelectric switch for determining the presence or absence of an object by emitting a light and detecting the presence or absence of the reflected light from the object, and a photoelectric switch system using a plurality of such photoelectric switches.

DESCRIPTION OF THE RELATED ART

Photoelectric switches are known as one means for detecting the presence or absence of an object moved over a conveyor line or the like. A photoelectric switch for that use is arranged to emit a light toward a transfer path of the object and detect the presence or absence of the reflected light from the object moved while passing there, thereby determining the presence or absence of an object. In this type photoelectric switch, the light is intermittently emitted in the form of pulses for the purpose of reducing power consumption and preventing mutual interference (this emission light will be hereinafter referred to as a sensing light).

FIG. 100 is an exploded perspective view showing one example of such conventional photoelectric switches. The illustrated photoelectric switch is so called an optical fiber type and mainly comprises a body 1 and a detection unit 2. The body 1 comprises a case 3, a circuit board 4 housed in the case 3, a wire 5 connected to the circuit board 4 for transmitting power and an output signal therethrough, a light emitting element 6 and a light receiving element 7 both provided on the circuit board 4 for detection, a top plate 8 covering a top portion of the case 3, indicator lamps 9 and sensitivity adjusting thumbs 10 all provided on the top plate 8, and a connector 13 fitted into one side of the case 3 and having insertion holes 11, 12 respectively opposite to the light emitting element 6 and the light receiving element 7. The detection unit 2 comprises a detection head 15 disposed in opposite relation to an object 14 to be detected, and a pair of optical fibers 16, each having one end connected to the detection head 15 and the other end respectively connected to the light emitting element 6 and the light receiving element 7 through the insertion holes 11, 12. In this conventional photoelectric switch, when a sensing light is intermittently outputted from the light emitting element 6 in response to a timing signal having a predetermined cycle (or period), the sensing light is led through one of the optical fibers 16 and irradiated to the object 14 from the detection head 15. At this time, when the light reflected by the object 14 enters the detection head 15, the reflected light is led through the other optical fiber 16 and received by the light receiving element 7. Upon receiving the reflected light, a detection signal is outputted from the circuit board 4 and transmitted to the outside of the photoelectric switch via the wire 5. In the absence of the object 14 to be detected, since no reflected light is received by the light receiving element, no detection signal is outputted from the circuit board 4.

FIG. 101 is an exploded perspective view showing another example of conventional photoelectric switches. The illustrated photoelectric switch is so called a lens type. This lens type photoelectric switch has a detection unit which is different from the above optical fiber type. Specifically, a pulse light outputted from a light emitting element 17 is irradiated via a light projecting lens 18 to the object 14 to be detected, and the reflected light from the object 14 is received by a light receiving element 20 via a light collecting lens 19.

Here, to detect the presence or absence of an object, a plurality of photoelectric switches are used in most cases. For a conveyor line, by way of example, a plurality of photoelectric switches, such as a photoelectric switch for emitting a light laterally, a photoelectric switch for emitting a light from below and a photoelectric switch for emitting a light from above, are concentratedly installed in one place for more accurate detection of the object. However, with such an arrangement that a plurality of the photoelectric switches are closely located near each other and operated to emit lights successively, these photoelectric switches may each malfunction by receiving sensing lights emitted from other photoelectric to switches. Such a malfunction is called mutual interference. In order to prevent the mutual interference, conventional photoelectric switches are arranged such that each switch is controlled to intermittently emit a sensing light which does overlap with sensing light emissions of any other photoelectric switches, and also includes means for discriminating the reflected light resulted from its own light emission from the sensing lights (interference lights) emitted from other photoelectric switches.

FIG. 102 is a block diagram showing a part of the above-mentioned photoelectric switch comprising a cyclic pulse generator 21, a light emitting unit 22, a light receiving unit 23, a gate circuit 24, an integrator 25, and a decision circuit 26.

The cyclic pulse generator 21 generates a pulse P1 of constant cycle, and the light emitting unit 22 is driven by the pulse P1 to emit a pulse-like sensing light with the same cycle and duty ratio as those of the pulse P1. When the sensing light is reflected upon hitting on an object (not shown), the reflected light is received by the light receiving unit 23 which in turn outputs a pulse P2. If this pulse P2 results from receiving the reflected light based on the light emission out of its own light emitting unit 22, it is matched in timing with the pulse P1, but if resulted from receiving the sensing light out of any other photoelectric switch, it is not matched in timing with the pulse P1. Therefore, by designing the gate circuit 24 so as to gate a train of output pulses P2 from the light receiving unit 23 with the pulse P1, only the reflected light P2 resulted from the emission out of its own light emitting unit 22 is extracted from among the train of pulses P2. An output pulse of the gate circuit 24 is then taken into the integrator 25 at the timing of the pulse P1 for integration and, when an integrated value exceeds a preset threshold, the decision circuit 26 determines that the object is present.

In general, at the time the sensing light irradiated from the light emitting unit 22 to an object is reflected by the object, the reflected light is scattered and a part of the scattered light is received by the light receiving unit 23. Accordingly, the light receiving unit 23 produces the pulse P2 based on a portion of the transmitted sensing light and, if the presence or absence of an object is determined for each occurrence of the pulse P2, the accuracy of determining the presence or absence of an object becomes low. For that reason, the integrator 25 is provided to integrate the pulses extracted by the gate circuit 24 and a decision is made depending on the magnitude of the integrated value to thereby increase the decision accuracy. The integrator 25 usually comprises a pulse counter. Thus, the pulses P2 are successively counted at the timing of the pulse P1 and a decision indicating the presence of an object is made by the decision circuit 26 when the counted value reaches eight, for example.

When determining the presence or absence of an object by using a plurality of such photoelectric switches, a sufficient decrease in the duty ratio of the output pulse P1 of each switch in comparison with the cycle thereof leads to a reduction in both the probability of mutual interference between the photoelectric switches and power consumption. However, because the photoelectric switches are operated independently of one another and light emission cycles of the photoelectric switches are almost the same, two or more photoelectric switches may overlap with each other in timing to emit respective sensing lights. When this occurs, despite the absence of an object, the pulse P2, matching in timing with the output pulse P1 from its own photoelectric switch, can result due to the light emission from any other photoelectric switch. The pulse P2 cannot be removed by the gate circuit 4, thus leading to an error in determining the presence or absence of an object.

In view of the above, a variety of photoelectric switches with a function of preventing the above mutual interference have been proposed recently. One type is to monitor a match in timing between the light emission and the interference light received, and shift the light emission timing when such a match in timing is detected. The other type is to transmit a synch timing signal at the same time as emitting a light for detection, and select the light emission timing of each photoelectric switch in response to the synch timing signal.

Examples of the former type photoelectric switch are as follows. First one disclosed in Japanese Patent Publication No. 60-51043 additionally includes an interference discriminator 27 and a phase shift circuit 28, as shown in FIG. 103. The interference discriminator 27 discriminates whether or not the output pulse of the gate circuit 24 is due to an interference light. If it is due to an interference light, the phase at which the pulse generator 21 generates the pulse P1 is advanced or retarded by the phase shift circuit 28.

The second one disclosed in Japanese Patent Laid-Open No. 61-138192 is arranged to generate a pulse having the same frequency as, but different in phase from a pulse signal obtained by receiving interference light thereby driving the light emitting unit to emit a light pulse having the same frequency as, but the different phase from the interference light.

The third one disclosed in Japanese Patent Laid-Open No. 63-263917 is arranged to gradually shift the light emission cycle from the standard cycle if the pulse matches with the light emission timing, and returns the light emission cycle to the original standard cycle when a predetermined number of resultant pulses are obtained. With this technique, when the light emission timing of a first photoelectric switch has almost the same light emission cycle as that of a second photoelectric switch, the self-emission timing of the second photoelectric switch is gradually shifted because the pulse matches the light emission timing obtained from the light receiving unit. On the other hand, the light emission cycle of the first photoelectric switch is not changed. Accordingly, the light emission timing of second photoelectric switch is deviated from that of the other photoelectric switch, and the output pulse of the light receiving unit due to the light emitted from the first photoelectric switch is removed by the gate circuit. The light receiving unit continues to receive the light emitted from the first photoelectric switch and the output pulse of the light receiving unit is matched with the self-emission timing. When the predetermined number of pulses are obtained, the self-emission cycle is returned to the original standard cycle. At this time, the light emission timing of the second photoelectric switch is deviated from the previous light emission timing through the above operation and hence from the light emission timing of the first photoelectric switch.

Next, examples of the latter type photoelectric switch are as follows. First one disclosed in Japanese Patent Laid-Open No. 2-49183 includes a synch timing signal emitting unit 29, a synch timing signal receiving unit 30 and a frequency divider 31, as shown in FIG. 104. The synch timing signal emitting unit 29 emits a light pulse synch timing signal which matches with the timing of an emission light for detection by an adjacent photoelectric switch, and the synch timing signal receiving unit 30 receives the light pulse synch timing signals emitted from adjacent photoelectric switches. During a period in which a pulse signal obtained from the synch timing signal receiving unit 30 is supplied to the frequency divider 31, operation of the frequency divider 31 is stopped so that the emission light for detection will not be produced while receiving the light pulse synch timing signal.

Second one disclosed in Japanese Patent Laid-Open No. 2-285277, is directed to prevent mutual interference by changing the frequency of sensing light emissions. When a synch signal received by the light receiving unit in a period immediately before generation of an output pulse from the synch pulse generator, the capacity of a capacitor is altered to change the cycle of the output pulse. When the output pulse is emitted the light pulse synch timing signal emitted from the light emitting unit is transmitted to other photoelectric switches and, simultaneously, light pulse synch timing signals from those other adjacent photoelectric switches are transmitted to the light receiving unit, thereby ensuring the above function of preventing the mutual interference.

A third example, disclosed in Japanese Utility Model Laid-Open No. 2-133025, additionally includes a delay circuit and a signal select switch. The delay circuit delays the synch timing signal supplied to a signal input terminal by a predetermined time. The signal select switch selects whether the synch timing signal controlled by a signal from an output of the timing signal generator or from an output of the delay circuit.

The above former type conventional photoelectric switches with a function of preventing mutual interference are each intended to prevent the mutual interference by shifting the light emission timing of its own photoelectric switch from that of any other photoelectric switch, and is fairly effective when the number of photoelectric switches installed in one place is small. In the case of installing many photoelectric switches in one place, however, the light emission timings from those many photoelectric switches must be made different from one another to achieve prevention of the mutual interference, but the light emission cycle of each photoelectric switch cannot be set to a long interval. Accordingly, the range in which the respective light emission timings of the many photoelectric switches can be changed is limited to a very narrow one. This implies that differences in the light emission timings of the photoelectric switches are quite slight. Therefore, even if the light emission timings of two photoelectric switches are shifted if the two photoelectric switches would match each other in their light emission timings, the light emission timing of either of the two photoelectric switches may now match with the light emission timing of another photoelectric switch, making it quite difficult to perfectly prevent the mutual interference.

Further, with the photoelectric switches each having a function of preventing mutual interference, the photoelectric switches causing the mutual interference are all shifted in their light emission timings. But, to shift light emission timings so that photoelectric switches will be out of the mutual interference, the amount and direction of shift must be set for each photoelectric switch individually. This results in large difficulties in setting operation and also necessarily leads to a complicated circuit arrangement for prevention of the mutual interference.

The latter type of photoelectric switch discussed above use a synch timing signal to prevent the mutual interference with other photoelectric switches. Specifically, this type photoelectric switches are arranged to send the synch timing signal separately from the light emission for sensing and, therefore, are more reliable in preventing mutual interference than the former type. However, since the light emission timing for detection is the same as the timing to generate the synch timing signal, the circuit constituting the light emitting unit for detection and the circuit constituting the synch timing signal generator are simultaneously brought into a driven state, resulting in the quite large amount of fluctuations in total current. This raises a problem that such load fluctuations adversely affect other circuit portions of both the photoelectric switches. For example, instability in the operating point of an amplifier used in the light receiving unit to detect a weak light reception signal in synchronism with the light emission for detection, and a substantial decrease in the effective detection sensitivity due to an influence of noise.

Moreover, in the case of branching a part of the emission light for detection to produce the synch timing signal, the produced synch timing signal has a low level of light intensity and becomes a pulse light with a width as narrow as the emission light for detection. This raises other problems of requiring the light receiving unit for the synch timing signal to have an ability comparable to the light receiving unit for detecting the sensing light, making the circuit system more expensive, and inviting difficulties in setting a light intensity level of the synch timing signal.

SUMMARY OF THE INVENTION

An object of the present invention is to provide a photoelectric detector which can operate a plurality of photoelectric switches, concentratedly installed in one place, without causing mutual interference.

To achieve the above object, the present invention provides, as first technical means, a photoelectric switch and a photoelectric detector in which a sensing light is intermittently emitted at a predetermined cycle and the presence or absence of an object is determined depending on whether a light pulse matching in timing with said sensing light is received or not, the photoelectric switch and detector comprising reception means for externally receiving a cyclic synch timing signal, light emitting means for emitting said sensing light in synchronism with said synch timing signal, and delay timing signal generating means for generating and transmitting a delay timing signal delayed by a predetermined period of time from said received synch timing signal.

As second technical means, the present invention provides a photoelectric switch in which a sensing light is intermittently emitted and the presence or absence of an object is determined depending on whether a light pulse matching in timing with said sensing light is received or not, the photoelectric switch comprising pulse generating means for generating a pulse at a predetermined cycle, white noise generating means for generating white noise, pulse position modulating means for position-modulating the pulse, generated by said pulse generating means, at random based on the white noise generated by said white noise generating means, and light emitting means for emitting said sensing light in synchronism with the pulse position-modulated by said pulse position modulating means.

As third technical means, the present invention provides a photoelectric switch in which a sensing light is intermittently emitted and the presence or absence of an object is determined depending on whether a light pulse matching in timing with said sensing light is received or not, the photoelectric switch comprising white noise generating means for generating white noise, pulse generating means for successively outputting pulses with pulse widths changed depending on a level of said white noise, pulse position modulating means for frequency-dividing the pulses outputted from said pulse generating means and generating pulses having a constant pulse width and position-modulated at random, and light emitting means for emitting said sensing light in synchronism with the pulses position-modulated by said pulse position modulating means.

As fourth technical means, the present invention provides a photoelectric detector comprising a plurality of photoelectric switches which are arranged closely or close-contactly to each other and each have a detection light emitting element for intermittently emitting a sensing light in response to a timing signal of a predetermined cycle and a detection light receiving element for receiving a light reflected by an object to be detected, whereby the presence or absence of an object is determined depending on whether a light pulse matching in timing with said sensing light is received or not, each of said photoelectric switches comprising a transmission light receiving element for receiving a cyclic light pulse signal transmitted through a transmission optical fiber, synch timing signal generating means for generating a synch timing signal, in synchronism with said light pulse signal, based on said light pulse signal and outputting said synch timing signal to said detection light emitting element, delay timing signal generating means for generating a delay timing signal delayed by a predetermined period of time from said synch timing signal, a transmission light emitting element for emitting a cyclic light pulse signal in synchronism with said delay timing signal, and another transmission optical fiber for transmitting the light pulse signal, emitted from said transmission light emitting element, to the photoelectric switch at next stage.

As fifth technical means, the present invention provides a photoelectric detector comprising a plurality of photoelectric switches which are arranged closely or close-contactly to each other and each have a detection light emitting element for intermittently emitting a sensing light in response to a timing signal of a predetermined cycle and a detection light receiving element for receiving a light reflected by an object to be detected, whereby the presence or absence of an object is determined depending on whether a light pulse matching in timing with said sensing light is received or not, each of said photoelectric switches comprising a transmission light receiving element for receiving a cyclic light pulse signal transmitted through a transmission optical fiber, signal generating means for generating a delay timing signal, delayed by a predetermined period of time from said light pulse signal, based on said light signal and outputting said delay timing signal to said detection light emitting element, a transmission light emitting element for emitting a cyclic light pulse signal in synchronism with said delay timing signal, and another transmission optical fiber for transmitting the light pulse signal, emitted from said transmission light emitting element, to the photoelectric switch at next stage.

As sixth technical means, the present invention provides a photoelectric detector comprising a plurality of photoelectric switches which are arrange closely or close-contactly to each other and each have a detection light emitting element for intermittently emitting a sensing light in response to a timing signal of a predetermined cycle and a detection light receiving element for receiving a light reflected by an object to be detected, whereby the presence or absence of an object is determined depending on whether a light pulse matching in timing with said sensing light is received or not, each of said photoelectric switches comprising a transmission light receiving element for receiving a cyclic light pulse signal, signal generating means for generating, based on said light pulse signal, a synch timing signal in synchronism with said light pulse signal or a delay timing signal delayed by a predetermined period of time from said light pulse signal, and outputting said synch timing signal or said delay timing signal to said detection light emitting element, and a transmission light emitting element for emitting a cyclic light pulse signal in synchronism with said synch timing signal or said delay timing signal, wherein said transmission light receiving element and said transmission light emitting element are arranged to direct away from each other on a straight line substantially parallel to the direction in which said photoelectric switches are arrayed, and the light receiving axis of said transmission light receiving element and the light emitting axis of said transmission light emitting element are set to align with said straight line, so that said light pulse signal is transmitted from said transmission light emitting element at preceding stage to said transmission light receiving element at next stage.

As seventh technical means, the present invention provides a photoelectric detector comprising a plurality of photoelectric switches which are arranged closely or close-contactly to each other and each have a detection light emitting element for intermittently emitting a sensing light in response to a timing signal of a predetermined cycle and a detection light receiving element for receiving a light reflected by an object to be detected, whereby the presence or absence of an object is determined depending on whether a light pulse matching in timing with said sensing light is received or not, each of said photoelectric switches comprising a reception light refractor for refracting an optical path of a cyclic light pulse signal incident upon said refractor, transmission light receiving element for receiving said light pulse signal refracted by said light refractor, signal generating means for generating, based on said light pulse signal, a synch timing signal in synchronism with said light pulse signal or a delay timing signal delayed by a predetermined period of time from said light pulse signal, and outputting said synch timing signal or said delay timing signal to said detection light emitting element, a transmission light emitting element for emitting a cyclic light pulse signal in synchronism with said synch timing signal or said delay timing signal, and a transmission light refractor for refracting an optical path of the light pulse signal emitted from said transmission light emitting element and leading said light pulse signal to the photoelectric switch at next stage.

As eighth technical means, the present invention provides a photoelectric detector comprising a plurality of photoelectric switches which are arranged closely or close-contactly to each other and each have alight emitting element for intermittently emitting a sensing light in response to a timing signal of a predetermined cycle, a light receiving element for receiving a light reflected by an object to be detected, and a case housing said light emitting element and said light receiving element therein, whereby the presence or absence of an object is determined depending on whether a light pulse matching in timing with said sensing light is received or not, each of said photo-electric switches comprising reception means disposed on one side of said photoelectric switch for receiving a pulse-like magnetic signal, signal generating means for generating, based on said magnetic signal, a synch timing signal in synchronism with said magnetic signal or a delay timing signal delayed by a predetermined period of time from said magnetic signal, and outputting said synch timing signal or said delay timing signal to said light emitting element, and excitation means disposed on the other side of said photoelectric switch for externally outputting a pulse-like magnetic signal in synchronism with said synch timing signal or said delay timing signal, wherein at least one of said reception means and said excitation means includes an auxiliary core provided on a side wall of said case, said reception means, said excitation means and said auxiliary core being arranged on the same axis parallel to the direction in which said photoelectric switches are arrayed, so that said magnetic signal is transmitted from said excitation means of the photoelectric switch at preceding stage to said reception means of the photoelectric switch at next stage via said auxiliary core.

As ninth technical means, the present invention provides a photoelectric detector in which a plurality of photoelectric switches can be arrayed into line, each of said photoelectric switches comprising a light emitting unit for outputting a pulse-like sensing light emitted to an object to be detected, a light receiving unit for receiving said sensing light reflected by said object or said sensing light not interrupted by said object, excitation means for generating a pulse-like magnetic signal and outputting said magnetic signal to the photoelectric switch at next stage, reception means for receiving said magnetic signal outputted from said excitation means of the photoelectric switch at preceding stage among said photoelectric switches arrayed into line, and a control unit for setting, in response to said magnetic signal received by said reception means, the output timing of said sensing light in said light emitting unit and the output timing of said magnetic signal in said excitation means, said photoelectric switches being arranged such that respective said excitation means and said reception means lie on the same axis parallel to the direction in which said photoelectric switches are arrayed.

As tenth technical means, the present invention provides a photoelectric detector in which a plurality of photoelectric switches can be arrayed into line, each of said photoelectric switches comprising a light emitting unit for outputting a pulse-like sensing light emitted to an object to be detected, a light receiving unit for receiving said sensing light reflected by said object or said sensing light not interrupted by said object, excitation means for generating a pulse-like magnetic signal and outputting said magnetic signal externally, reception means for receiving said magnetic signal outputted from said excitation means of the photoelectric switch at preceding stage among said photoelectric switches arrayed into line, and a control unit for setting, in response to said magnetic signal received by said reception means, the output timing of said sensing light in said light emitting unit and the output timing of said magnetic signal in said excitation means, wherein said excitation means comprises two coils wound in opposite directions and connected in series, and said reception means also comprises two coils wound in opposite directions and connected in series, and said coils of said excitation means and said reception means are arranged such that when said photoelectric switches are arrayed into line, one coil of said excitation means is closely opposite to one coil of said reception means of the adjacent photoelectric switch and the other coil of said excitation means is closely opposite to the other coil of said reception means of said adjacent photoelectric switch.

With the first technical means, the synch timing signal received by the reception means and the delay timing signal sent from the delay timing signal generating means are shifted in timing from each other. When a plurality of photoelectric switches are arrayed in series, the synch timing signal received by the reception means is that one sent from the delay timing signal generating means, and the delay timing signal sent from the delay timing signal generating means becomes the synch timing signal received by the reception means of the photoelectric switch at next stage. Therefore, the synch timing signals received by the respective photoelectric switches are successively shifted from each other by a predetermined period of time in order of the array of the photoelectric switches. In this case, because the photoelectric switches emit the sensing lights in match with the timings of the received synch timing signals, the emission timing of the sensing lights from the photoelectric switches are successively shifted from each other by a predetermined period of time without overlapping. Consequently, mutual interference between the photoelectric switches can be prevented.

With the second and third technical means, the output pulse of the pulse generating means is position-modulated at random with white noise, whereby the sensing light is generated at the random timing. Since the photoelectric switches emit the sensing lights at random in this manner, mutual interference between the photoelectric switches will hardly occurs.

With the fourth and fifth technical means, when the cyclic light pulse signal is transmitted to the photoelectric switch via the transmission optical fiber, the signal generating means in the photoelectric switch generates a synch timing signal or a delay timing signal and outputs the synch timing signal or the delay timing signal to the detection light emitting element. Then, in response to the synch timing signal or the delay timing signal, the detection light emitting element intermittently emits the sensing light and the light reflected by the object to be detected is received by the detection light receiving unit, whereby the presence or absence of an object is determined depending on whether a light pulse matching in timing with the sensing light is received or not. Further, the transmission light emitting element in the photoelectric switch emits a light pulse signal in synchronism with the synch timing signal or the delay timing signal, and this light pulse signal is transmitted to the transmission light receiving element of the photoelectric switch at next stage via another transmission optical fiber. The photoelectric switch at next stage also determines the presence or absence of an object in a like manner.

With sixth technical means, the transmission light emitting element in the photoelectric switch emits a light pulse signal in synchronism with the synch timing signal or the delay timing signal, and this light pulse signal is transmitted, via the light emitting axis of the transmission light emitting element, to the transmission light receiving element of the photoelectric switch at next stage having the light receiving axis directed in match with the direction of the above light emitting axis. The photoelectric switch at next stage also determines the presence or absence of an object in a like manner.

With the seventh technical means, when a cyclic light pulse signal is emitted to the photoelectric switch, the reception light refractor in the photoelectric switch refracts an optical path of the light pulse signal for leading the light pulse signal to the transmission light receiving element so that the transmission light receiving element receives the light pulse signal, whereby the presence or absence of an object is determined depending on whether a light pulse matching in timing with the sensing light is received or not. Further, the transmission light emitting element emits a light pulse signal in synchronism with the synch timing signal or the delay timing signal, and this light pulse signal is transmitted to the photoelectric switch at next stage after being refracted by the transmission optical refractor. The photoelectric switch at next stage also determines the presence or absence of an object in a like manner.

With the eighth technical means, the reception means and the excitation means are disposed on one side and the other side wall of the photoelectric switch, respectively. Both of the reception means and the excitation means, for example, includes auxiliary cores provided on side walls of the case, and the reception means, the excitation means and the auxiliary core are arranged on the same axis parallel to the direction in which the photoelectric switches are arrayed. Therefore, when a plurality of the photosensitive switches are concentratedly provided, the excitation means of the photoelectric switch at preceding stage emits a pulse-like magnetic signal, whereupon the reception means of the photoelectric switch at next stage receives the magnetic signal and outputs this magnetic signal or a delay timing signal, produced by the signal generating means based on the magnetic signal, to the light receiving element. Then, in response to the magnetic signal or the delay timing signal, the light emitting element intermittently emits the sensing light and the light reflected by the object to be detected is received by the light receiving element, whereby the presence or absence of an object is determined depending on whether a light pulse matching in timing with the sensing light is received or not. This permits a plurality of the photosensitive switches, concentratedly provided in one place, to be operated successively. Further, the auxiliary cores provided on the side walls of the two cases adjacent to each other are positioned in an extremely close and precisely opposite relation, the magnetic signal outputted from the excitation means in one case can be efficiently received by the reception means in the other case.

With the ninth technical means, between every two photoelectric switches adjacent to each other, the excitation means and the reception means of those two photoelectric switches are positioned in a precisely opposite relation, so that the magnetic signal outputted from the excitation means of one photoelectric switch can be efficiently received by the reception means of the other photoelectric switches with the result of high transmission efficiency of the synch timing signal.

With the tenth technical means, between two photoelectric switches adjacent to each other, magnetic signals outputted from the two coils of the excitation means of one photoelectric switch have their phases inverted to each other. However, when these magnetic signals are respectively received by the two coils of the reception means of the other photoelectric switch, voltages induced in these coils have the same phase and added to each other, because these coils are wound in opposite directions.

DETAILED DESCRIPTION OF PREFERRED EMBODIMENTS

Embodiments of each technical means of the present invention will be described below with reference to the drawings.

FIGS. 1 to 7 are concerned with the first technical means of the present invention.

Figure 1:
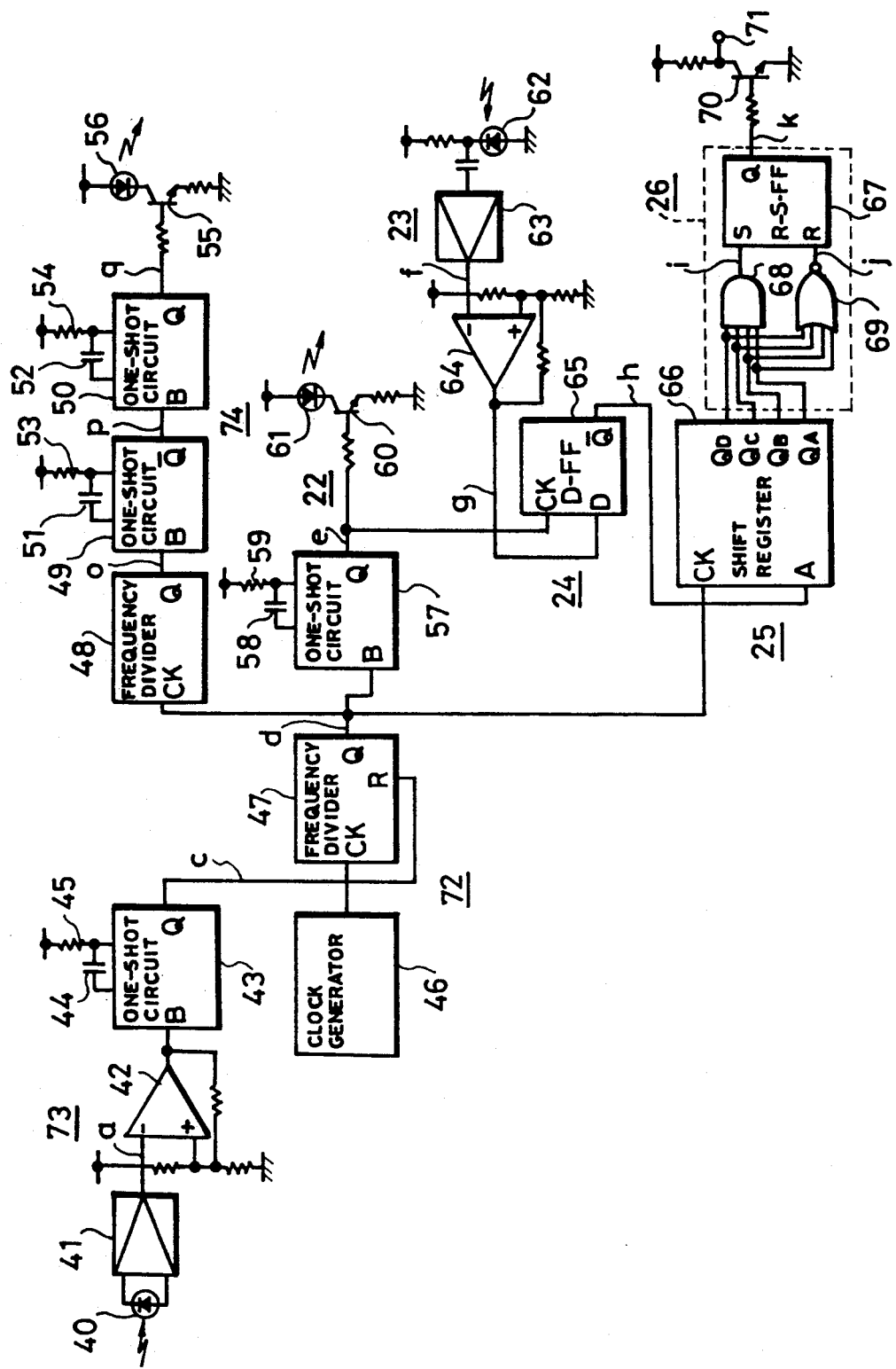
FIG. 1 is a block diagram showing one embodiment of a photoelectric switch according to first technical means of the present invention.

FIG. 1 is a block diagram showing one embodiment of a photoelectric switch according to the first technical means. The photoelectric switch comprises photodiodes 40, 62, amplifiers 41, 63, comparators 42, 64, one-shot circuits 43, 49, 50, 57, capacitors 44, 51, 52, 58, resistors 45, 53, 54, 59, a clock generator 46, frequency dividers 47, 48, transistors 55, 60, 70, light emitting diodes (hereinafter referred to as LEDs) 56, 61, a D-type flip-flop circuit (hereinafter referred to as a D-FF) 65, a shift register 66, an R.S flip-flop circuit (hereinafter referred to as a R.S-FF) 67, an AND gate 68, a NOR circuit 69, an output terminal 71, a pulse generator 72, a synch timing signal light receiving unit 73, and a synch timing signal light emitting unit 74. Note that the components corresponding to those in the prior art are denoted by the same reference numerals.

This embodiment shown in FIG. 1 includes, as basic components, a light emitting unit 22, a light receiving unit 23, a gate circuit 24, an integrator 25, a decision circuit 26, and a pulse generator 72, capable of being externally synchronized, corresponding to the synch pulse generator 21 in the prior art. Added thereto are the synch timing signal light receiving unit 73 and the synch timing signal light emitting unit 74.

Figure 2:
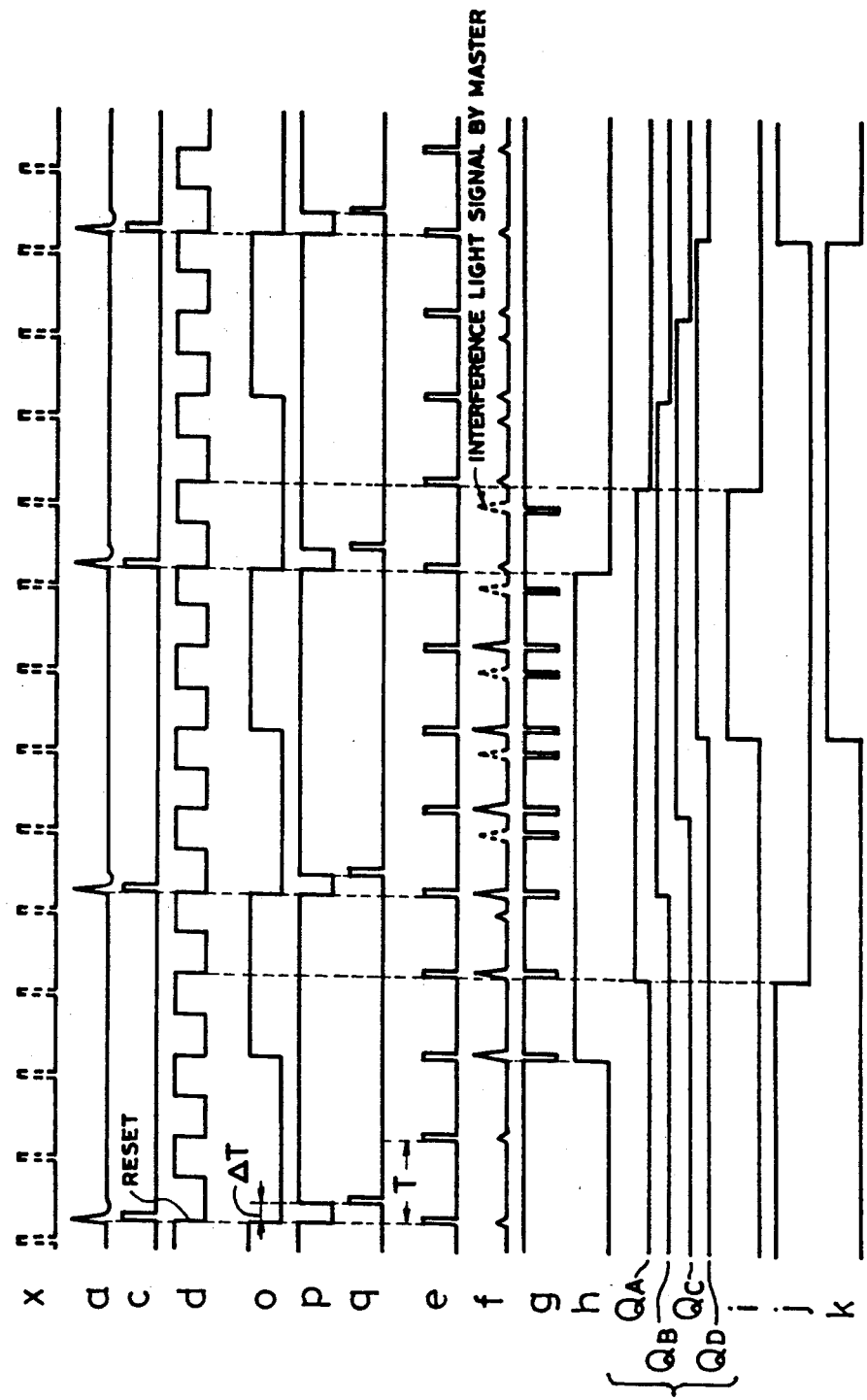
FIG. 2 is a chart showing the timing relationships between signals at various parts in FIG. 1.

First, operation of those basic components will be explained by referring to FIG. 2 as well which shows the timing relationships between signals at various parts. Note that alphabet characters shown at the various parts in FIG. 1 imply that those signals denoted by the same alphabet characters in FIG. 2 are obtained in the corresponding parts. The pulse generator 72 comprises a clock generator 46 for generating a clock pulse of a certain cycle, and a frequency divider 47 for frequency-dividing the clock pulse (e.g., by 16) to produce a pulse d of a certain cycle. The frequency divider 47 is reset by an output pulse c from the one-shot circuit 43 of the synch timing signal light receiving unit 73 (described later) so that the pulse d is synchronized with the output pulse c. The pulse d is supplied to the synch timing signal light emitting unit 74, the light emitting unit 22, and the integrator 25.

The light emitting unit 22 comprises the one-shot circuit 57, the switching transistor 60, and the LED 61. The one-shot circuit 57 is triggered by a falling edge of the output pulse d of the frequency divider 47 and, whenever triggered, produces a pulse e with a narrow width determined by the time constant of the capacitor 58 and the resistor 59. The pulse e is assumed to be "H" (high level). The pulse e corresponds to the pulse P1 in the prior art and turns on the transistor 60 for a high-level period. When the transistor 60 is turned on, a drive current is passed to the LED 61 so that the LED 61 emits a sensing light with the same cycle and duty ratio as the pulse e.

The light receiving unit 23 comprises the photodiode 62, the amplifier 63, and the comparator 64. Upon receiving some light, the photodiode 62 produces a pulse having a width equal to a period of receiving the light. This pulse is amplified by the amplifier 63 and supplied, as a pulse f, to the comparator 64. The comparator 64 compares a level of the pulse f and a reference level, followed by outputting a binary pulse g of "L" (low level) as the comparison result.

If an object (not shown) is present nearby, the sensing light emitted from the LED 61 is reflected by the object and the reflected light is received by the photodiode 62. As indicated by solid lines in FIG. 2, therefore, one type of pulse f is obtained which matches in timing with the output pulse e of the one-shot circuit 57. At this time, if any other photoelectric switch is closely installed, the sensing light therefrom is also received, as an interference light, by the photodiode 62. As a result, another type of pulse f due to the interference light is also obtained as indicated by broken lines in FIG. 2. These two types of pulses f are both binary-coded by the comparator 64 to become pulses g of "L" and supplied to the gate circuit 24 along with the output pulse e of the one-shot circuit 57.

The gate circuit 24 comprises the D-FF 65 receiving, as a data input D, the output pulses g of the comparator 64 and, as a clock input CK, the output pulse e of the one-shot circuit 57. The D-FF 65 sample-holds levels of the pulses g by a rising (leading) edge of the pulse e of "H". Thereby, only those ones among the output pulses g of the comparator 64 which match in timing with the pulse e are sample-held by the D-FF 65. Accordingly, those pulses g which do not match in timing with the pulse e are removed in the D-FF 65. When the N pulses g which match in timing with the pulse e are successively supplied with a cycle T, a pulse h of "H" rising at the supply timing of the first one of those N pulses and having a width of N·T is obtained at an output of the D-FF 65.

The integrator 25 comprises the 4-bit shift register 66. The shift register 66 receives, as the clock input CK, the falling edge of the output pulse d of the frequency divider 47 and, for each application of the clock input CK, takes in the output pulse h of the D-FF 65, followed by shifting those pulses h successively. More specifically, when the pulse h of "H" outputted from the D-FF 65 is taken in upon the clock input CK, a first output $Q_A$ of the shift register 66 becomes "H", following which second, third and fourth outputs $Q_B$, $Q_C$, $Q_D$ become "H" in turn at each time the clock input CK is supplied. Accordingly, when the four or more pulses g which match in timing with the pulse e are successively taken in by the D-FF 65 and the pulse h having a width of 4T or more is outputted from the D-FF 65, there occurs a period in which all the outputs $Q_A$ to $Q_D$ of the shift register 66 become "H" simultaneously.

The decision circuit 26 comprises the AND gate 68 and the NOR circuit 69 each receiving the respective outputs $Q_A$ to $Q_D$, and the R·S-FF 67 receiving an output of the AND gate 68 as a set pulse and an output of the NOR circuit 69 as a reset pulse. The AND gate 68 produces a set pulse i of "H" which rises upon all the outputs $Q_A$ to $Q_D$ of the shift register 66 becoming "H", and falls upon at least one of the outputs $Q_A$ to $Q_D$ becoming "L". A rising edge of the set pulse i sets the R·S-FF 67. The NOR circuit 69 produces a reset pulse j of "L" which falls upon at least one of the outputs $Q_A$ to $Q_D$ of the shift register 66 becoming "H", and rises upon all the outputs $Q_A$ to $Q_D$ becoming "L". A rising edge of the reset pulse j resets the R·S-FF 67. Therefore, an output of the R·S-FF 67, i.e., an output k of the decision circuit 26, becomes a pulse taking "H" for a period spanning from when all the outputs $Q_A$ to $Q_D$ of the shift register 66 turn to "H" until when all the outputs turn to "L".

Thus, when the pulses g which match in timing with the output pulse e of the one-shot circuit 59 are successively obtained from the comparator 64 with the cycle T of the pulse e, the output k of the decision circuit 26 becomes "H", whereupon the transistor 70 is turned on to produce a signal of "L" at the output terminal 71. This corresponds to that the sensing light emitted from the LED 61 is reflected by the object and received by the photodiode 62, i.e., implies that the object is present.

With the photoelectric switch of this embodiment, the presence or absence of an object is determined as stated above. Operation of the synch timing signal light emitting unit 74 will be next described by referring to FIG. 2 as well.

The synch timing signal light emitting unit 74 comprises a frequency divider 48, one-shot circuits 49, 50, a switching transistor 55, and an LED 56. The output pulse d of the frequency divider 47 is frequency-divided by the frequency divider 48. In this embodiment, the frequency divider 48 divides the frequency of the pulse d by four so that a falling edge of an output pulse o of the frequency divider 48 and the falling edge of the pulse d match in timing with each other. The one-shot circuit 49 is triggered by the falling edge of the output pulse o of the frequency divider 48 and produces a pulse p of "L" having a width ΔT determined by the time constant of the capacitor 51 and the resistor 53. The downstream one-shot circuit 50 is triggered by a rising (tailing) edge of the pulse p and produces a pulse q of "H" having a narrow width determined by the time constant of the capacitor 52 and the resistor 54. Accordingly, the generation timing of the pulse q is delayed by a period of time ΔT from the generation timing of the output pulse e of the one-shot circuit 57, and one pulse q is intermittently produced for each arrival of the four output pulses e. The transistor 55 is turned on for a period in which the output pulse q is at "H", and a drive current is passed to the LED 56 to produce the synch timing signal in the form of an emission light.

Assuming now that the frequency dividing ratio of the frequency divider 48 is generally M (M=4 in this embodiment), while the emission cycle of the sensing light in the LED 61 is set as T (FIG. 2) equal to the cycle of the output pulse e of the one-shot circuit 57, the emission cycle of the synch timing signal in the LED 56 is given by M·T. This means that the generation of a light pulse for the synch timing signal is intermittent with respect to the generation of the sensing light. Then, as mentioned above, the light emission timing of the LED 56 is delayed by the time ΔT from the light emission timing of the LED 61.

Although the photoelectric switch of this embodiment can be used solely, it is particularly advantageous that a plurality of photoelectric switches are arranged closely or close-contactly to each other in series. In such an adjacent or close arrangement, the synch timing signal given by the output pulse q of the one-shot circuit 50 from a first photoelectric switch becomes a signal for a synchronizing operation of a second photoelectric switch. The second sequential photoelectric switch in the series of photoelectric switches which receives the synch timing signal from the first switch is referred to as "at next stage" relative to the first photoelectric switch and the first switch is referred to as "at preceding stage" relative to the second switch. Thus, the synch timing signal light emitting unit 74 transmits the synch timing signal, in the form of a light pulse, to the photoelectric switch at next stage. In the following description, the emission light from the LED 61 is called a sensing light, whereas the light pulse emitted from the LED 56 is called a transmission light.

Because the photoelectric switches are arrayed closely or close-contactly with spacings on the order of several millimeters, the intensity of the light emitted from the LED 56 may be weak. It is also preferable that the LED 56 emits a light different in wavelength from the sensing light, e.g., an infrared light. With the intensity of the above emitted light being weak, power consumption in the synch timing signal light emitting unit 74 can be reduced and the probability that the light emitted from the LED 56 becomes an interference light for other photoelectric switches can be fairly reduced. Further, because the cycle of the transmission light emitted from the LED 56 is set longer by using the frequency divider 48 than the cycle of the sensing light emitted from the LED 61, power consumption in the synch timing signal light emitting unit 74 can be reduced.

Operation of the synch timing signal light receiving unit 73 will be described below by referring to FIG. 2 as well.

The synch timing signal light receiving unit 73 comprises the photodiode 40, the amplifier 41, the comparitor 42, and the one-shot circuit 43, and receives the transmission light output from a preceding photoelectric switch in the series of photoelectric switches which has the same construction.

Upon receiving each transmission light outputted from the photoelectric switch at preceding stage, the photodiode 40 outputs a synch timing signal. This synch timing signal is amplified to become a synch timing signal a, followed by binary-coding in the comparator 42. The one-shot circuit 43 is triggered by the binary-coded synch timing signal to produce a synch timing signal c of "H" having a narrow width determined by the time constant of the capacitor 44 and the resistor 45.

Assuming now that x in FIG. 2 represents the emission timing of the sensing light from the photoelectric switch at preceding stage, since the synch timing signal obtained from the transmission light received by the photodiode 40 corresponds to that one created by the synch timing signal light emitting unit 74 of the photoelectric switch at preceding stage, the synch timing signal c outputted from the one-shot circuit 43 is delayed by the time $\Delta T$ from the emission timing of the sensing light out of the photoelectric switch at preceding stage denoted by x in FIG. 2. A rising (leading) edge of the synch timing signal c resets the frequency divider 47 of the pulse generator 72.

In this case, because the rising edge of the synch timing signal c and the falling edge of the output pulse d of the frequency divider 47 match in timing with each other and the output pulse e of the one-shot circuit 57, i.e., the emission timing of the sensing light from the LED 61, matches in timing with the falling edge of the output pulse d of the frequency divider 47, the emission timing of the sensing light from the LED 61 is delayed by the time $\Delta T$ from the emission timing of the sensing light timing out of the photoelectric switch at preceding stage denoted by x in FIG. 2. Likewise, the photoelectric switch at next stage emits the sensing light with a delay by the time $\Delta T$ from the emission timing of the sensing light out of the LED 61.

When a plurality of the photoelectric switches of this embodiment are arrayed in series as mentioned above and each photoelectric switch is operated so as to send the transmission light to the photoelectric switch at next stage, the emission timings of the sensing lights from the respective photoelectric switches are successively shifted from each other by the time $\Delta T$ in the order of array. By properly selecting that delay time $\Delta T$, the emission timings of the sensing lights from the respective photoelectric switches can be made not overlap with one another. With such an arrangement, therefore, those ones among the output pulses g of the comparator 64 in FIG. 1 which match in timing with the output pulse e of the one-shot circuit 57 can be obtained in each photoelectric switch only when the reflected light due to the sensing light emitted from its own LED 61 is received by the photodiode 62. Consequently, mutual interference between the photoelectric switches can be eliminated perfectly and the decision results with very high accuracy can be obtained in the decision circuit 26.

By using the photoelectric switch according to this embodiment, as mentioned above, even when a plurality of the photoelectric switches are arranged closely or closecontactly to each other, the emission timings of the sensing lights from the respective photoelectric switches can be made not overlap with one another perfectly. Therefore, even if a larger number of photoelectric switches than the prior art are concentratedly installed in one place, mutual interference therebetween can be totally prevented. Further, with the photoelectric switch according to this embodiment, since the generation timing of the transmission light is always delayed in comparison with the emission timing of the sensing light, drive loads of the photoelectric switches are distributed over time, making it possible to eliminate adverse effects such as instability in the operating point due to excessive loads and a decrease in effective detection sensitivity.

Figure 3:
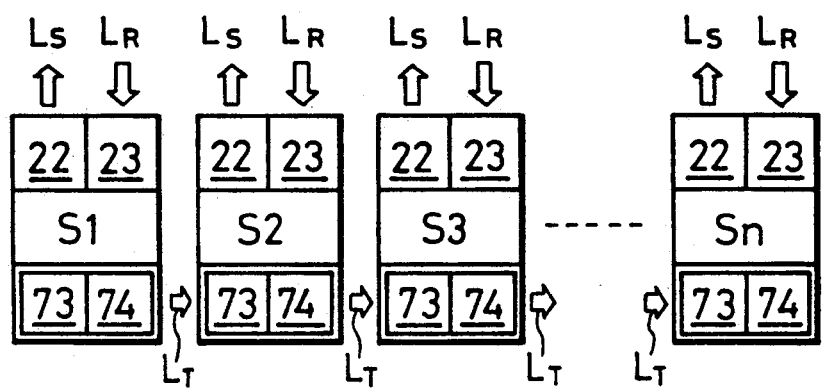
FIG. 3 is a diagram showing one embodiment of a photoelectric detector in which the photoelectric switch shown in FIG. 1 is arrayed plural in number.

FIG. 3 illustrates the structure of an embodiment of a photoelectric switch system in which a plurality of the above-mentioned photoelectric switches are arrayed adjacently in series. S1, S2, ..., Sn represent photoelectric switches, $L_S$ a sensing light, $L_R$ a reflected light from an object, and $L_T$ a transmission light. Note that the components corresponding to those in FIG. 1 are denoted by the same reference numerals.

In FIG. 3, the photoelectric switch S1 emits the sensing light $L_S$ and then sends the transmission light $L_T$ to the photoelectric switch S2 at next stage with a delay of the time $\Delta T$. Upon receiving the transmission light $L_T$ from the photoelectric switch S1 at preceding stage, the photoelectric switch S2 emits the sensing light $L_S$ and then sends the transmission light $L_T$ to the photoelectric switch S2 at further next stage with a delay of the time $\Delta T$. In this way, since the photoelectric switches S1 to Sn are each operated to emit the sensing light $L_S$ upon receiving the transmission light $L_T$ sent from the preceding stage and then send the transmission light with a delay of the time $\Delta T$, the photoelectric switches S1 to Sn necessarily emit the sensing lights $L_S$ with successive delays of the time $\Delta T$ in order of S1, S2, S3, ..., Sn.

Figure 4:
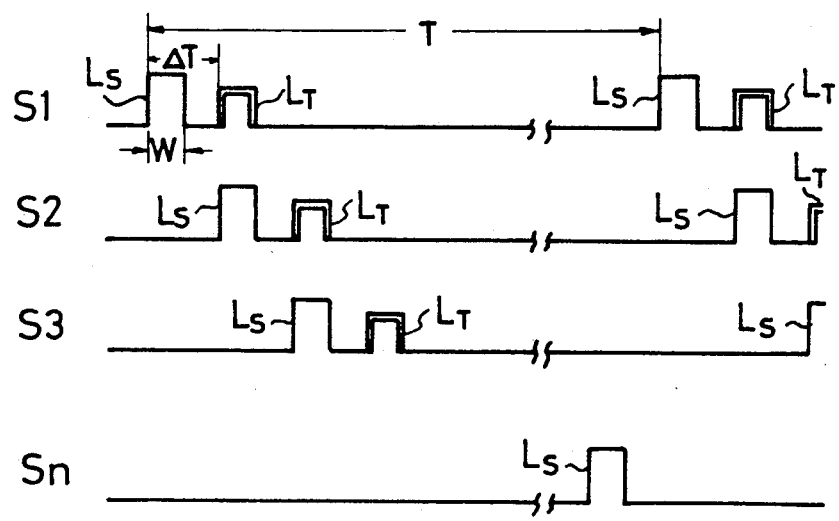
FIG. 4 is a chart showing timings of a sensing light and a transmission light from the respective photoelectric switches according to the first technical means.

By selecting the generation timings of the sensing lights from the photoelectric switches S1 to Sn not to overlap with one another, as shown in FIG. 4, mutual interference between the photoelectric switches S1 to Sn. However, it is preferable that the delay time of the transmission light $L_T$ with respect to the sensing light $L_S$ (i.e., the delay time of the one-shot circuit 49 in FIG. 1) $\Delta T$ in each of the photoelectric switches S1 to Sn is selected to be twice or more a pulse width w of the sensing light $L_S$, i.e., $\Delta T \geq 2w$ (where $\Delta T$ also includes a response delay in the transmission system). Assuming now that the cycle of the sensing light $L_S$ in each of the photoelectric switches S1 to Sn is T, the maximum number n of photoelectric switches capable of being arrayed without causing mutual interference is given by $n \approx T/\Delta T$. Assuming also that the duty ratio D of the sensing light $L_S$ is w/T and $\Delta T = 2w$ holds, $n \approx 1/2D$ is resulted. Given $D = 0.05$, therefore, $n \approx 10$ is resulted, meaning that total ten photoelectric switches can be arrayed closely to each other in practical use. For comparison, the number of conventional photoelectric switches capable of being arrayed closely to each other without causing mutual interference is two at maximum.

With this embodiment, as mentioned above, since the number of photoelectric switches capable of being arrayed closely to each in one place without causing mutual interference can be increased, it is possible to determine not only the presence or absence of an object simply, but also the attitude, the moving speed, the kind and so forth of an object.

Figure 5:
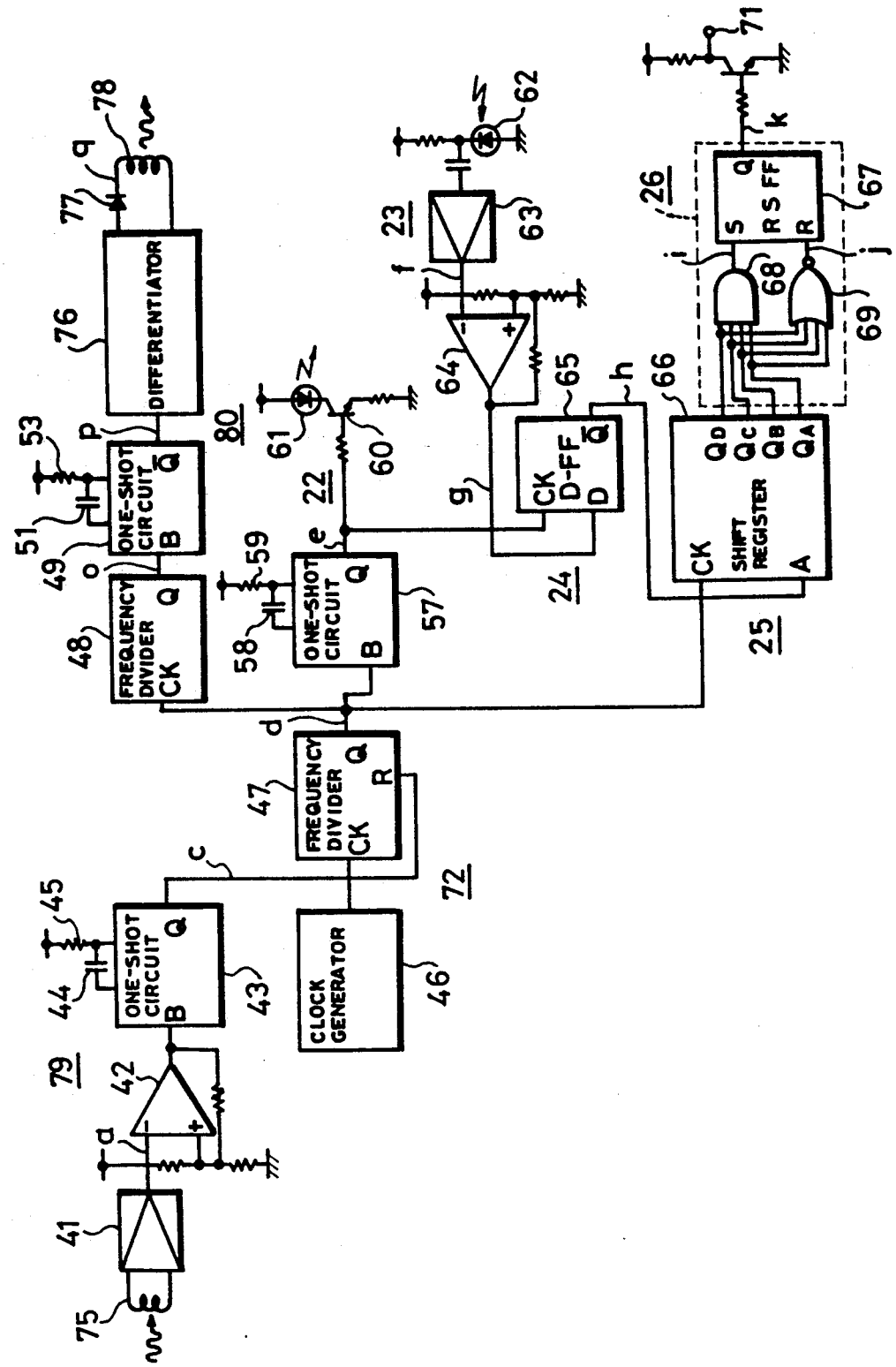
FIG. 5 is a block diagram showing another embodiment of the photoelectric switch according to first technical means.

FIG. 5 is a block diagram showing another embodiment of the photoelectric switch according to the first technical means. The photoelectric switch of this embodiment comprises a magnetism detecting coil 75, a differentiator 76, a diode 77, a magnetism generating coil 78, a synch timing signal receiving unit 79, and a synch timing signal emitting unit (excitation unit) 80.

Note that the components corresponding to those in FIG. 1 are denoted by the same reference numerals.

In this embodiment, the synch timing signal receiving unit 79 is used instead of the synch timing signal light receiving unit 73 in the above embodiment, and the excitation unit 80 is used instead of the synch timing signal light emitting unit 74 in the above embodiment, thereby transmitting the synch timing signal as a pulse-like magnetic signal.

Figure 6:
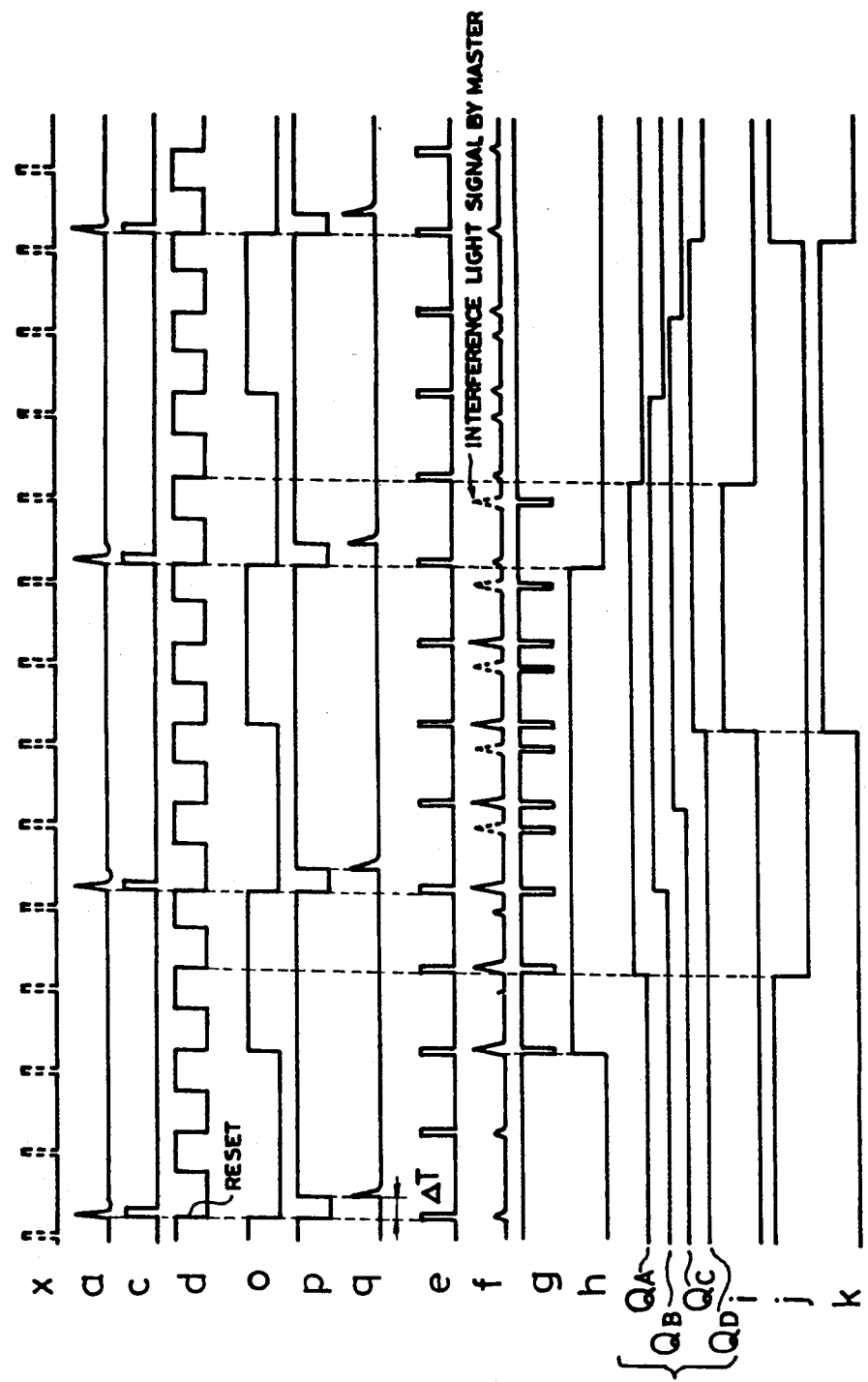
FIG. 6 is a chart showing the timing relationships between signals at various parts in FIG. 5.

Operation of this embodiment will be explained by referring to FIG. 6 as well which shows the timing relationships between signals at various parts in FIG. 5. Herein, too, alphabet characters shown at the various parts in FIG. 5 imply that those signals denoted by the same alphabet characters in FIG. 6 are obtained in the corresponding parts.

The excitation unit 80 comprises the frequency divider 48, the one-shot circuit 49, a differentiator 76, a diode 77, and a magnetism generating coil 78. Instead of the one-shot circuit 50, the transistor 55, the LED 56, etc. used in the synch timing signal light emitting unit 74 in the above embodiment, the differentiator 76, the diode 77 and the magnetism generating coil 78 are used to transmit the synch timing signal in the form of a pulse-like magnetic signal to the photoelectric switch (not shown) at next stage. More specifically, as shown in FIG. 6, the pulse p of "L" obtained at the one-shot circuit 49 and having the width of $\Delta T$ is differentiated by the differentiator 76. Of the resultant differential pulses, a differential pulse q occurred upon a rising (trailing) edge of the pulse p is extracted by the diode 77 to excite the magnetism generating coil 78. With this excitation, the magnetism generating coil 78 generates the pulse-like magnetic signal which is transmitted to the photoelectric switch at next stage.

The synch timing signal receiving unit 79 is constituted by using the magnetism detecting coil 75 instead of the photodiode 40 used in the synch timing signal light receiving unit 73 in the above embodiment. The pulse-like magnetic signal sent from the excitation unit 80 of the photoelectric switch at preceding stage arrives at the magnetism detecting coil 75, whereupon a pulse signal is induced therein and amplified by the amplifier 41 to produce the synch timing signal a.

Figure 7:
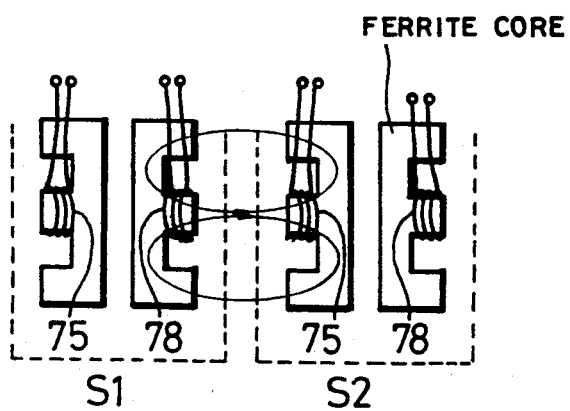
FIG. 7 is a diagram showing the coupling relationship between an excitation unit and a reception unit when the photoelectric switch shown in FIG. 5 is arrayed plural in number.

In this embodiment, the magnetism detecting coil 75 and the magnetism generating coil 78 each comprise a ferrite core with a coil wound around it, as shown in FIG. 7, and are housed in a housing. When using a plurality of photoelectric switches arrayed in series like FIG. 3, the photoelectric switches S1, S2 adjacent to each other are arranged such that, as shown in FIG. 7, the ferrite core of the magnetism generating coil 78 of the excitation unit 80 in one photoelectric switch S1 is opposite to the ferrite core of the magnetism detecting coil 75 of the synch timing signal receiving unit 79 in the other photoelectric switch S2, whereby those two ferrite cores opposite to each other constitute a magnetic path leading from the magnetism generating coil 78 to the magnetism detecting coil 75. If the ferrite cores of the adjacent photoelectric switches S1, S2 are closely contacted with each other, the gap between the opposite ferrite cores is minimized to further increase the magnetic transmission efficiency.

In this embodiment, the generation timing of the pulse-like magnetic signal out of the magnetism generating coil 78 is delayed by $\Delta T$ from the emission timing of the sensing light out of the LED 61, and the generation cycle of the magnetism signal is longer than and intermittent with respect to the emission cycle of the sensing light.

Note that other components in this embodiment than explained above are similar in arrangement and operation to those in the above embodiment and thus will not be explained here.

With this embodiment, like the above one, even when a plurality of photoelectric switches are arrange closely or close-contactly to each other, the emission timings of the sensing lights from the respective photoelectric switches can be made not overlap with one another perfectly. Therefore, even if a larger number of photoelectric switches than the prior art are concentratedly installed in one place, mutual interference therebetween can be totally prevented. Further, since the generation timing of the transmission light or the magnetic signal is always delayed in comparison with the generation timing of the pulse-like magnetic signal, drive loads of the photoelectric switches are distributed over time, making it possible to eliminate adverse effects such as instability in the operating point due to excessive loads and a decrease in effective detection sensitivity. In the case of using the pulse-like magnetic signal as the synch timing signal, response operation in the synch timing signal receiving unit 48 becomes faster than the case of using the pulse-like transmission light, thus enabling speed-up in operation characteristics of the entire photoelectric switch correspondingly. In addition, looking at more detail points, since the magnetism generating coil 78 is excited with the differential waveform obtained by differentiating the synch timing signal in this embodiment, the excitation signal has no useless portion in comparison with the case of exciting the coil with the sine or square waveform, with the results of higher transmission efficiency of the excitation signal and a decrease in power consumption.

The above embodiments have been explained mainly in connection with the case of using a plurality of photoelectric switches arrayed in series. In the photoelectric switch of the present invention, however, even when no synch timing signal is received by the synch timing signal light receiving unit 73 (FIG. 1) or the synch timing signal receiving unit 79 (FIG. 5), the clock generator 46 can solely generate the clock to obtain the pulse d at the output of the pulse generator 72. Accordingly, even the single photoelectric switch has in itself a function of emitting the sensing light and determining the reflected light from an object. This implies that an object can also be detected by using the photoelectric switch alone. Further, in the above-explained embodiments, since the synch timing signal is wirelessly transmitted in the form of a transmission light or magnetic signal, the photoelectric switches can be constructed into independent housings independently of one another. This construction ensures superior resistance abilities against water, surge and noise.

It should be understood that the arrangements of the respective parts or circuits shown in FIGS. 1 and 5 as embodiments are illustrated only by way of example as practicable when constituting those parts of circuits and the present invention is not limited to the illustrated arrangements. In FIGS. 1 and 5, for instance, it is also feasible to omit the frequency divider 48 and produce the pulse-like synch timing signal c for each cycle T and resets the frequency divider 47 by the synch timing signal c for each cycle T, thereby producing the signal d in synchronous relation.

The second and third technical means of the present invention will be described below with reference to FIGS. 8 to 13 and FIGS. 14 and 15, respectively.

Figure 8:
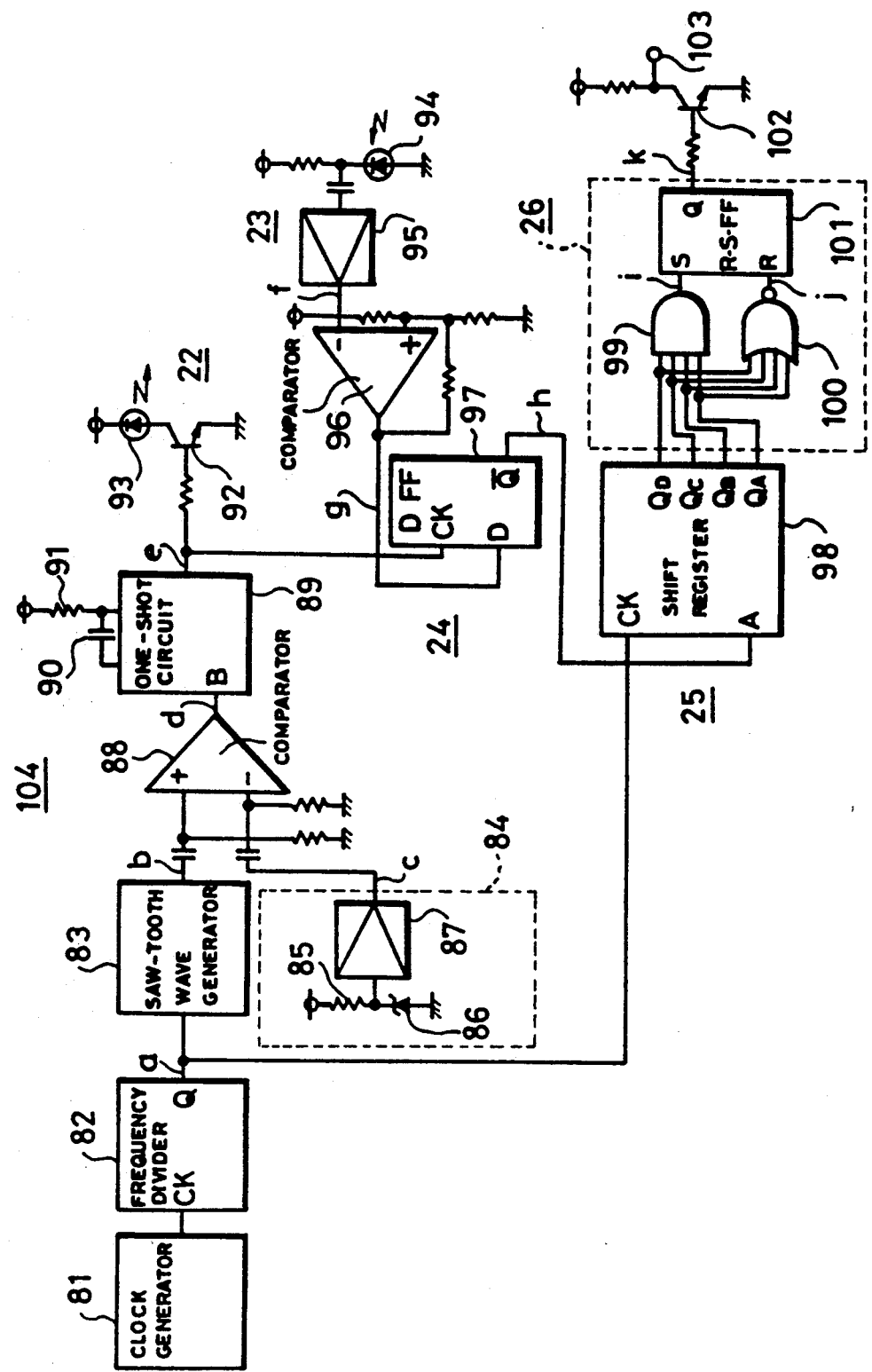
FIG. 8 is a block diagram showing one embodiment of a photoelectric switch according to second technical means of the present invention.

First, FIG. 8 is a block diagram showing one embodiment of a photoelectric switch according to the second technical means of the present invention. The photoelectric switch of this embodiment comprises a clock generator 81, a frequency divider 82, a saw-tooth wave generator 83, a white noise generator 84, resistors 85, 91, a Zener diode 86, amplifiers 87, 95, comparators 88, 96, a one-shot circuit 89, a capacitor 90, transistors 92, 102, and LED 93, a photodiode 94, a D-type flip-flop circuit (hereinafter referred to as a D-FF) 97, a shift register 98, an AND gate 99, a NOR circuit 100, an R·S flip-flop circuit (hereinafter referred to as a R·S-FF) 101, an output terminal 103, and a pulse generator 104. Note that the same components as those in the prior figures are denoted by the same reference numerals.

This embodiment shown in FIG. 8 includes, as basic components, the light emitting unit 22, the light receiving unit 23, the gate circuit 24, the integrator 25, the decision circuit 26, and the pulse generator 104, as in the prior figures. However, besides the described arrangement comprising the clock generator 81 and the frequency divider 82, the pulse generator 104 additionally includes the saw-tooth wave generator 83, the white noise generator 84, the comparator 88, and the one-shot circuit 89.

Figure 9:
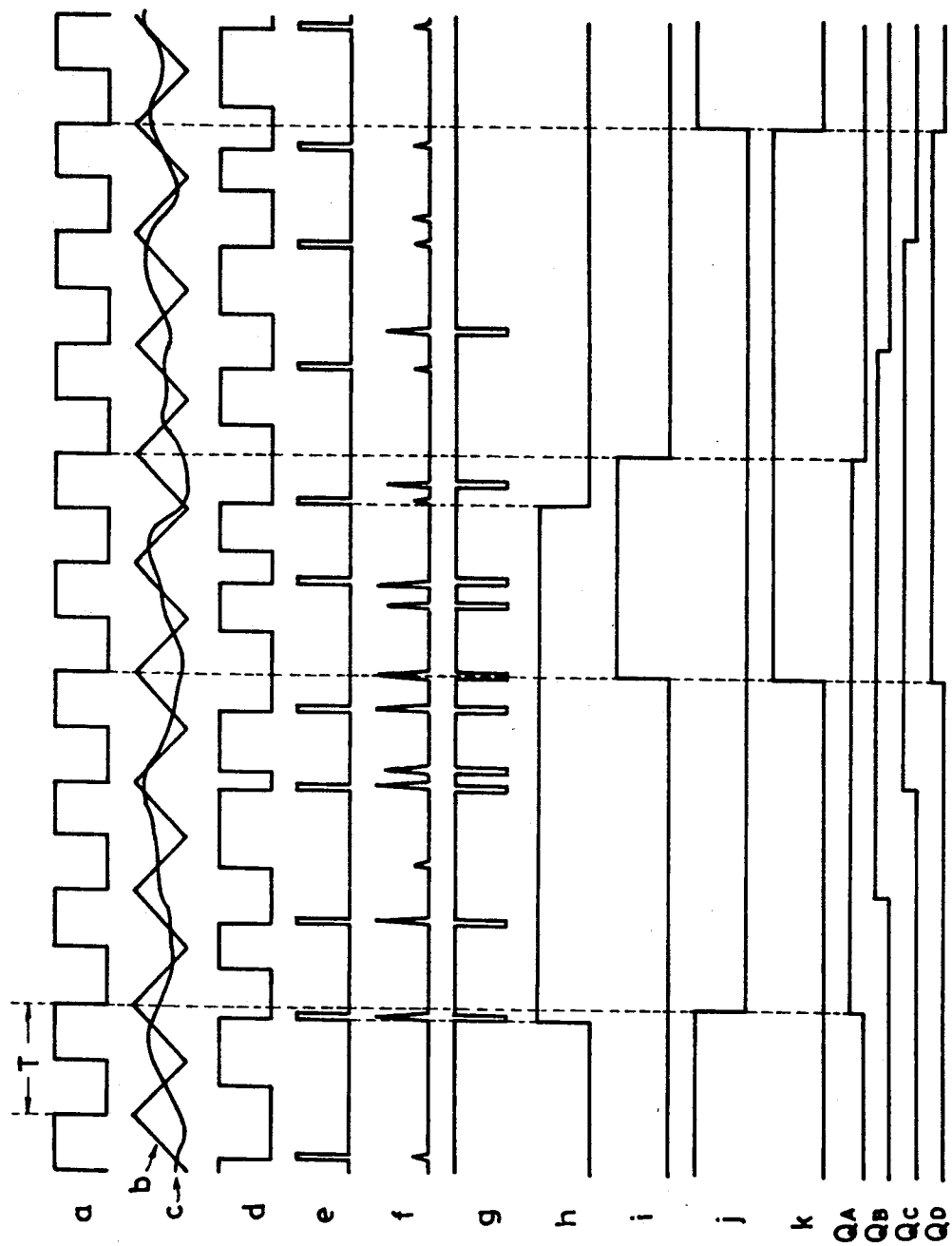
FIG. 9 is a chart showing the timing relationships between signals at various parts in FIG. 8.

Next, operation of this embodiment will be explained by referring to FIG. 9 which shows the timing relationships between signals at various parts.

The clock generator 81 generates a clock pulse of a certain cycle, and the frequency divider 82 frequency-divides the clock pulse (e.g., by 16) to produce a pulse a with the duty ratio of 50%. This pulse a is supplied to the saw-tooth wave generator 83 to create a saw-tooth wave signal b which is supplied to the comparator 88.

On the other hand, the white noise generator 84 is arranged such that the resistor 85 and the Zener diode 86 divide a source voltage and the resultant voltage is supplied, as a bias voltage, to the amplifier 87. Noise characteristics of the Zener diode 86 cause the amplifier 87 to produce white noise c with an amplitude variable at random.

The white noise c is compared in level with the saw-tooth wave signal b from the saw-tooth wave generator 83 in the comparator 88 to thereby create a pulse d taking "H" (high level) for periods in which the relationship of level of the white noise ≧ level of the saw-teeth wave signal b holds. Because the level of the white noise c is changed at random, the pulse d is modulated in its width such that the pulse width is varied at random. The one-shot circuit 89 is triggered by a falling edge of the pulse d so that a pulse e of "H" having a narrow pulse width determined by the time constant of the capacitor 90 and the resistor 91 is produced in synchronism with the falling edge of the pulse d. This pulse e is a pulse position-modulated at random.

The light emitting unit 22 comprises the switching transistor 92 and the LED 93. The output pulse e of the one-shot circuit 89 corresponds to the pulse P1 and turns on the transistor 92 for a high-level period. When the transistor 92 is turned on, a drive current is passed to the LED 93 so that the LED 93 emits a sensing light with the same cycle and duty ratio as the pulse e.

The light receiving unit 23 comprises the photodiode 94, the amplifier 95, and the comparator 96. Upon receiving a light, the photodiode 94 produces a pulse having a pulse width nearly equal to a period of receiving the light. This pulse is amplified by the amplifier 95 and supplied, as a pulse f, to the comparator 96. The comparator 96 compares a level of the pulse f and a reference level, followed by outputting a binary pulse g of "L" (low level). If an object (not shown) is present nearby, the sensing light emitted from the LED 93 is reflected by the object and the reflected light is received by the photodiode 94. As indicated by solid lines in FIG. 9, therefore, one type of pulse f is obtained which matches in timing with the output pulse e of the one-shot circuit 89. At this time, if any other photoelectric switch is closely installed, the sensing light therefrom is also received, as an interference light, by the photodiode 94. As a result, another type of pulse f due to the interference light is also obtained. These two types of pulses f are both binary-coded by the comparator 96 to become pulses g of "L". These pulses g are supplied to the gate circuit 24 along with the output pulse e of the one-shot circuit 89.

The gate circuit 24 comprises the D-FF 97 receiving, as a data input D, the output pulses g of the comparator 96 and, as a clock input CK, the output pulse e of the one-shot circuit 89. The D-FF 97 sample-holds levels of the pulses g by a rising (leading) edge of the pulse e of "H". Thereby, only those ones among the output pulses g of the comparator 96 which match in timing with the pulse e are extracted and held by the D-FF 97. Accordingly, those pulses g which do not match in timing with the pulse e are removed in the D-FF 97. When the N pulses g which match in timing with the pulse e are successively supplied, a pulse h of "H" rising at the timing of the first one of those N pulses and falling at the timing of the first pulse e after the N-the pulse is outputted from the D-FF 97.

The integrator 25 comprises the 4-bit shift register 98. The shift register 98 receives, as the clock input CK, the falling edge of the output pulse a of the frequency divider 82 and, for each application of the clock input CK, takes in the output pulse of the D-FF 97, followed by shifting those pulses successively. Assuming now that the pulse h of "H" is outputted from the D-FF 97, this pulse is taken it upon the clock input CK, whereby a $Q_A$ output of the shift register 98 becomes "H", following which other $Q_B$, $Q_C$, $Q_D$ outputs become "H" in turn at each time the clock input CK is supplied. With the pulse a having a cycle T, accordingly, when the four or more pulses g which match in timing with the pulse e are successively taken in by the D-FF 97 and the pulse h having a pulse width of 4T or more is outputted from the D-FF 97, there occurs a period in which all the $Q_A$ to $Q_D$ outputs of the shift register 98 become "H" simultaneously.

The decision circuit 26 comprises the AND gate 99 receiving the $Q_A$ to $Q_D$ outputs of the shift register 98, the NOR circuit 100 also receiving the $Q_A$ to $Q_D$ outputs, and the R·S-FF 101 of which set timing is given by a rising edge of an output from the AND gate 99 and reset timing is given by a rising edge of an output from the NOR circuit 100. The AND gate 99 produces a set pulse i of "H" which rises upon all the $Q_A$ to $Q_D$ outputs of the shift register 98 becoming "H", and falls upon at least one of the $Q_A$ to $Q_D$ outputs becoming "L". A rising edge of the set pulse i sets the R·S-FF 101. The NOR circuit 100 produces a reset pulse j of "L" which falls upon at least one of the $Q_A$ to $Q_D$ outputs of the shift register 98 becoming "H", and rises upon all the $Q_A$ to $Q_D$ outputs becoming "L". A rising edge of the reset pulse j resets the R·S-FF 101. Therefore, an output of the R·S-FF 101, i.e., an output k of the decision circuit 26, becomes "H" for a period spanning from when all the $Q_A$ to $Q_D$ outputs of the shift register 98 turn to "H" until all the outputs turn to "L".

With the above operations of the respective parts, when the pulses g which match in timing with the output pulse e of the one-shot circuit 89 are successively obtained from the comparator 96, the output k of the decision circuit 26 becomes "H", meaning that the sensing light emitted from the LED 93 is reflected by the object and received by the photodiode 94, i.e., that the object is present. In other words, when the output k of the decision circuit 26 becomes "H", the transistor 102 is turned on to produce a signal of "L" at the output terminal 103, thereby indicating the presence of the object.

With this embodiment, as mentioned above, the sensing light is generated at random depending on white noise, and the timing at which the sensing light starts is also random. By each photosensitive switch being operated to generate the sensing light in that way, the probability of mutual interference between the photosensitive switches becomes quite small. This point will be explained below in detail.

Figures 10, 11:
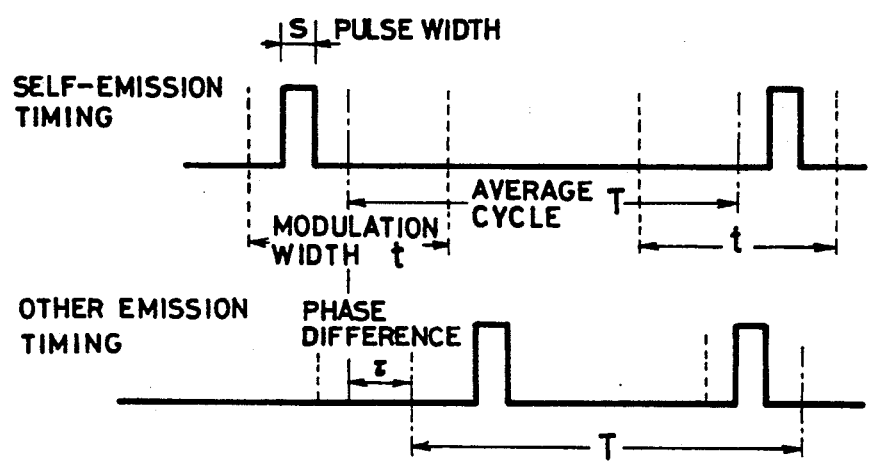
FIG. 10 is a chart showing the timing relationships of sensing lights between two photoelectric switches shown in FIG. 8.
FIG. 11 shows equations for malfunction probability due to mutual interference in the embodiment shown in FIG. 8, taking FIG. 10 as an example.

Let now consider two photosensitive switches and see the probability of mutual interference between one photosensitive switch and the other photosensitive switch from the latter to the former. In FIG. 10, the light emission timing of one photosensitive switch is called self-emission timing, and the light emission timing of the other photosensitive switch is called other emission timing. Assuming that the output pulses a of the frequency dividers 82 (FIG. 8) in both the photosensitive switches have the same cycle, average cycles of the self- and other emission timings in FIG. 10 are equal to the cycle T (FIG. 9) of the pulse a. Further, pulse widths s (i.e., pulse widths of the output pulses e of the one-shot circuits 89) of both the emission timings are equal to each other, and so are modulation widths t of the respective pulses e. Additionally, it is assumed that since the output pulses a of the frequency dividers 82 in those photosensitive switches have random phases, there exists a phase difference $\tau$ between the average cycles T of the self- and other emission timings.

Under the above conditions, the following equations hold for each of the photosensitive switches:

*duty ratio* $D = s/T$,

*PPM (pulse position modulation) degree* $M = t/T$

Therefore, the probability P that the light emission timings of the two photosensitive switches totally overlap with each other is given by:

$$P \approx s/t(1 - \tau/t) \quad [0 \leq \tau \leq t]$$
$$= 0 \quad [t \leq \tau \leq T/2]$$

(where $D << 1$ and $M \leq 0.5$)

Herein, since $\tau$ is random, an expected value p of the probability P is almost equal to $s/2t = D/2M$. However, mutual interference occurs even if the light emission timings of the two photosensitive switches partially overlap with each other. Thus, an expected value p of the probability P in this case is almost equal to $2s/2t = D/M$.

While the above explanation applies to the individual light emission timings, this embodiment is arranged to determine the presence or absence of an object by counting the successive N reception pulses (N=4 in FIG. 8), which match in timing with the output pulse e of the one-shot circuit 89, through the integrator 25 and the decision circuit 26 in FIG. 8. With this arrangement, assuming now that the photodiode 94 starts receiving the light in FIG. 8, a false decision will never be made unless interference lights are successively received in number N. The probability of this false decision (malfunction rate during light reception) $P_A$ is expressed by the equation (1) in FIG. 11 for the above expected value p. Further, in FIG. 8, after the output i of the AND gate 99 becoming "L", the output j of the NOR circuit 100 rises upon receiving the (N−1) pulses a from the frequency divider 82, whereupon the output k of the R·S-FF 101 becomes "L". If it happens during such a period that the photodiode 94 receives an interference light and the output h of the D-FF 97 becomes "H", the output j of the NOR circuit 100 remains kept at "L", leading to a malfunction that the output k of the R·S-FF 101 remains kept at "H". The probability of such a malfunction (malfunction rate during light interruption) $P_B$ is expressed by the equation (2) in FIG. 11 and reduced by properly setting the allowable number of interferences m.

Figures 12, 13:
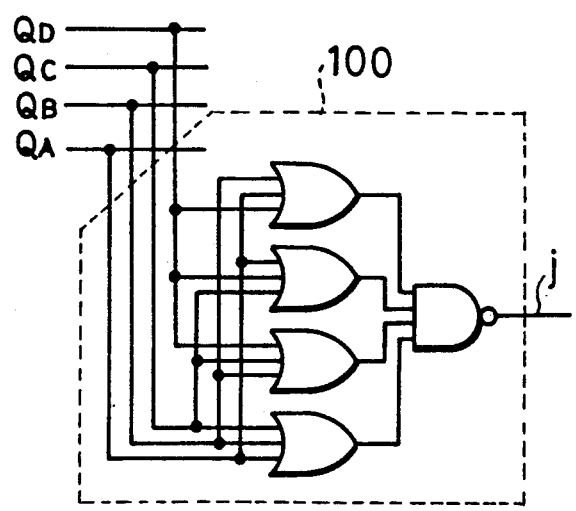
FIG. 12 is a table showing examples of concrete numerical values of the equations shown in FIG. 11.
FIG. 13 is a partial block diagram showing another embodiment of a photoelectric switch to be replaced by a part of the embodiment shown in FIG. 8.

FIG. 12 shows the malfunction rate during light reception $P_A$ for N and the malfunction rate during light interruption $P_B$ for the allowable number of interferences m in the case of D=0.005 and M=0.5 (therefore, the expected value p=0.01). As will be seen from FIG. 12, mutual interference can be lowered down to a negligible level by increasing N.

FIG. 13 is a partial block diagram showing one embodiment of means for setting the allowable number of interferences m as stated above, and shows a portion to be replaced by the NOR circuit 100 in the embodiment shown in FIG. 8. The embodiment of FIG. 13 corresponds to the case of N=4 and m=1. More specifically, when three of the total four $Q_A$, $Q_B$, $Q_C$, $Q_D$ outputs of the shift register 98 become "L" during light interruption, an output j' rises to "H" so that the R·S-FF 101 is reset to make the output k "L". Thereby, the output k of the R·S-FF 101 becomes "H" for a period spanning from when all the $Q_A$ to $Q_D$ outputs of the shift register 98 turn to "H" until three of those four outputs turn to "L". In other words, a malfunction will never occur during light reception unless successive N interference lights are received and, even if any one of the four outputs (N=4) is interfered during light interruption, the output k is turned to "L" so that a malfunction can be prevented. As will be easily inferred from the embodiment of FIG. 13, the arrangement for setting M and m to a larger number as exemplified in FIG. 12 can be realized with simple combinations.

Figure 14:
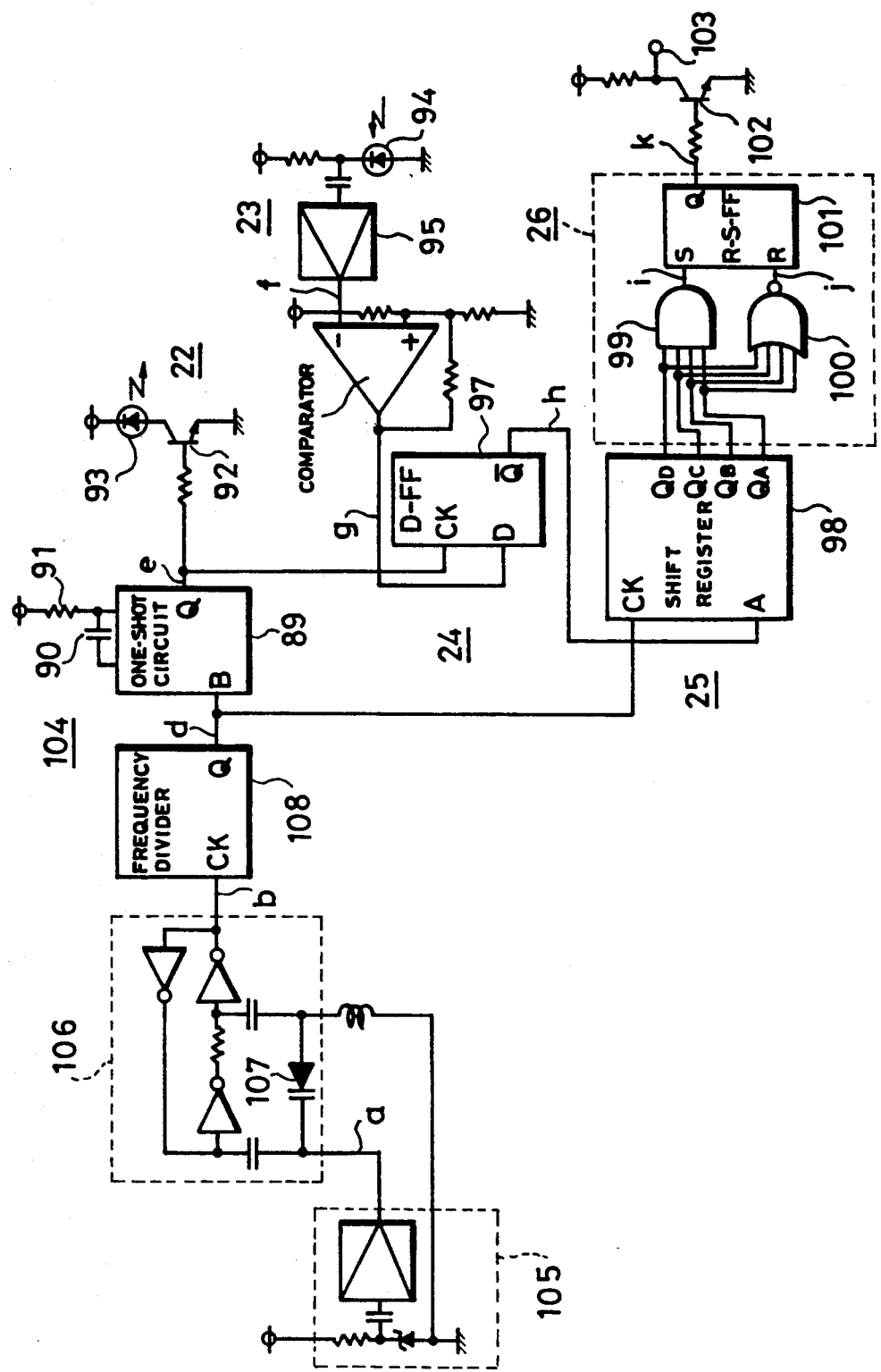
FIG. 14 is a block diagram showing another embodiment of the photoelectric switch according to the second technical means.
Figure 15:
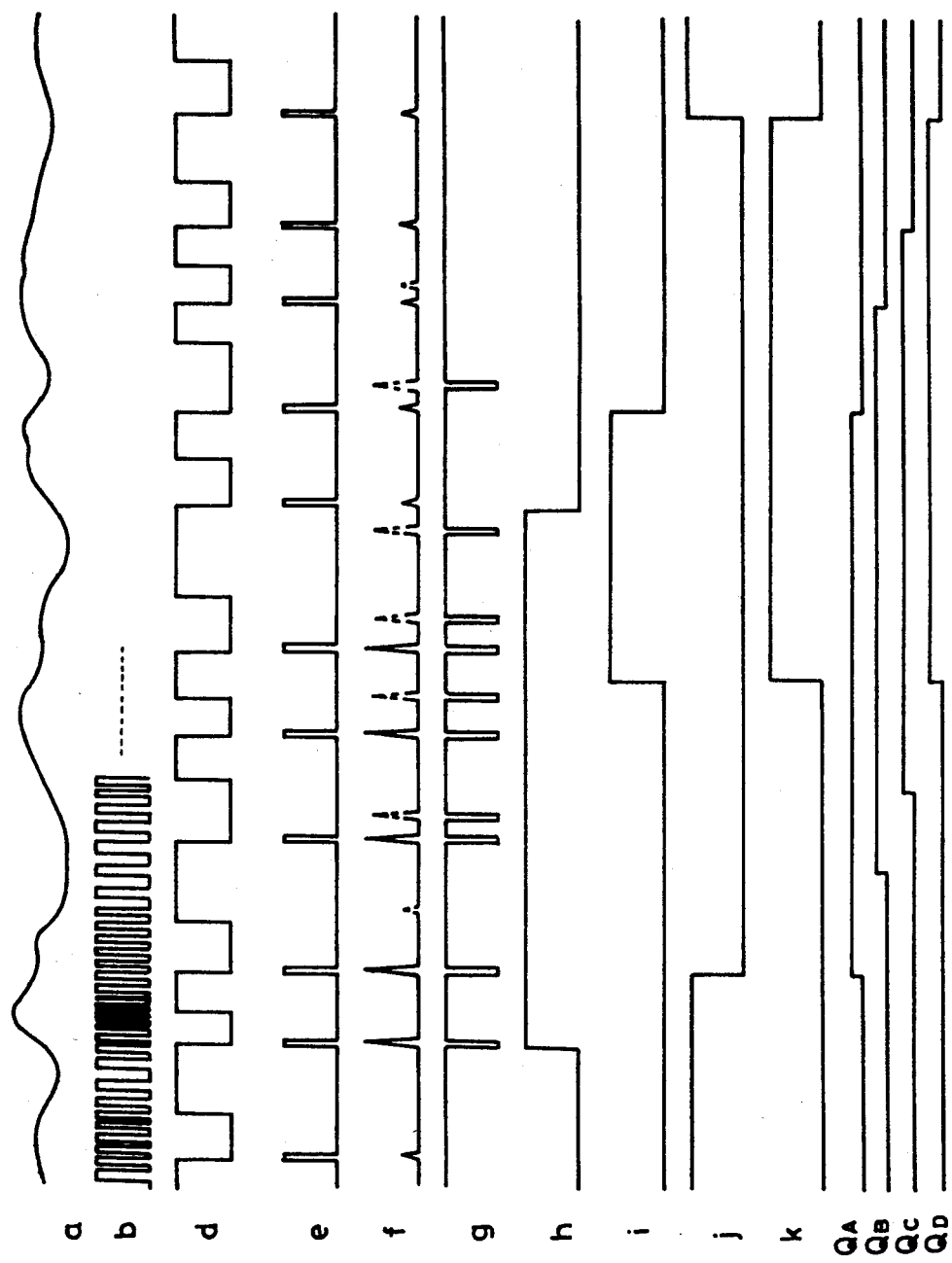
FIG. 15 is a chart showing the timing relationships between signals at various parts in FIG. 14.

FIG. 14 is a block diagram showing one embodiment of a photoelectric switch according to a third technical means of the present invention. The photoelectric switch of this embodiment comprises a white noise generator 105, a clock generator 106, a capacity variable diode 107, and a frequency divider 108. FIG. 15 is a chart showing the timing relationships between signals at various parts. Note that the components corresponding to those in FIG. 8 are denoted by the same reference numerals and the duplicate description will not be repeated.

In FIGS. 14 and 15, the white noise generator 105 has the same arrangement as the white noise generator 84 and generates white noise a. This white noise a is supplied to the clock generator 106. The clock generator 106 is a pulse oscillator of voltage controlled type that includes a capacity variable diode 107 having a capacity variable with the white noise a and creates a clock pulse b having a cycle variable depending on a level of the white noise a. This clock pulse b is frequency-divided by the frequency divider 108, e.g., by 16, to create a PWM-modulated pulse d having a pulse width changed at random like the output pulse d of the comparator 88 in FIG. 8. The resultant pulse d is supplied to the one-shot circuit 89, followed by the similar operation to that in the embodiment of FIG. 8.

As a clock input CK to the shift register 98, use is made of the output pulse d of the frequency divider 108, upon a falling edge of which the output signal k of the D-FF 97 is taken in by the shift register 98. However, since the falling edge of the pulse d corresponds to the output pulse e of the one-shot circuit 89, the shift register 98 of this embodiment operates in a like manner to the shift register 98 in FIG. 8.

With this embodiment, too, the sensing light is generated at the random timing depending on white noise, with the same advantage as that in the embodiment of FIG. 8.

The fourth and fifth technical means of the present invention will be described below with reference to FIGS. 16 to 20 and FIGS. 21 and 22, respectively.

Figure 16:
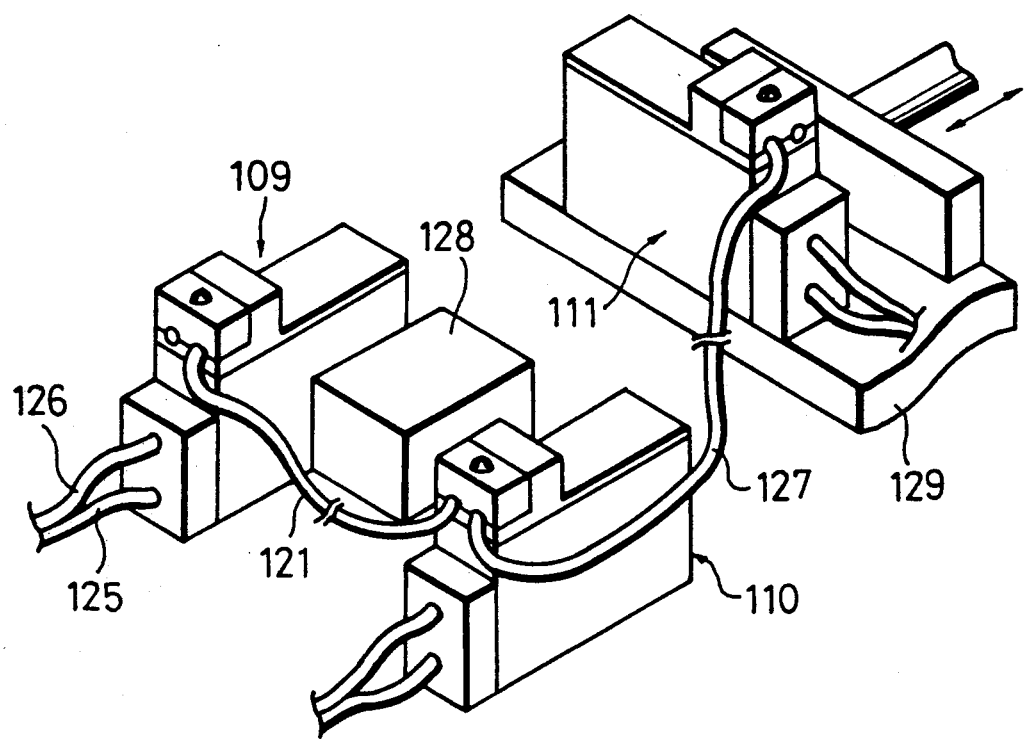
FIG. 16 is a perspective view showing a first embodiment of a photoelectric detector according to third technical means of the present invention.
Figure 17:
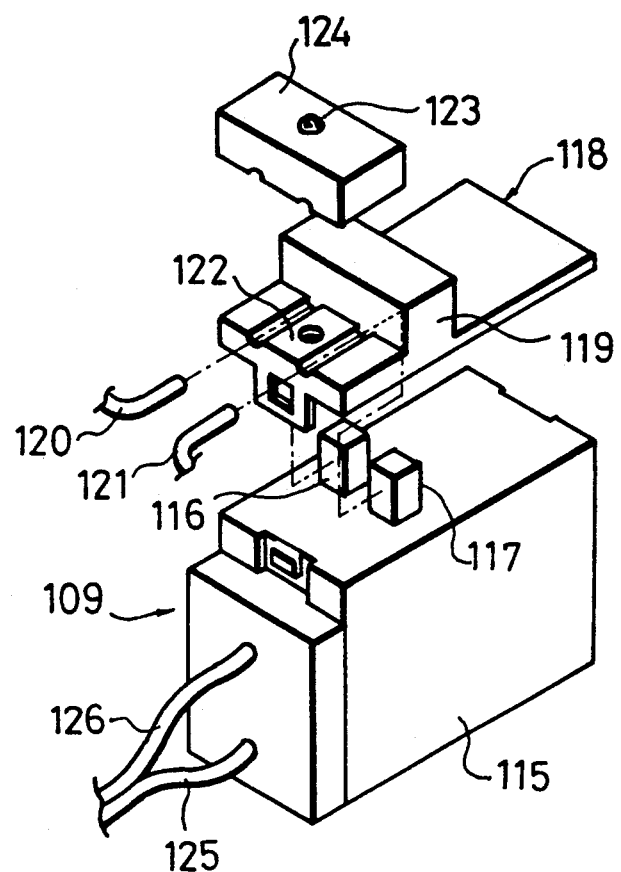
FIG. 17 is a perspective view showing a photoelectric switch of the photoelectric detector of FIG. 16.
Figure 18:
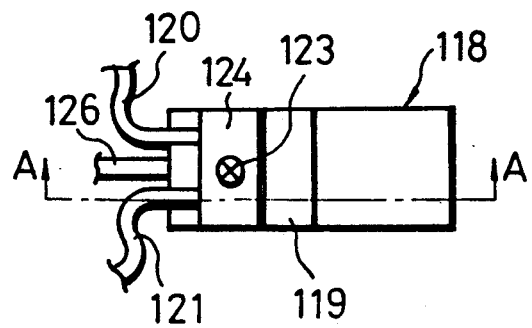
FIG. 18 is a plan view showing the photoelectric switch of FIG. 17.
Figure 19:
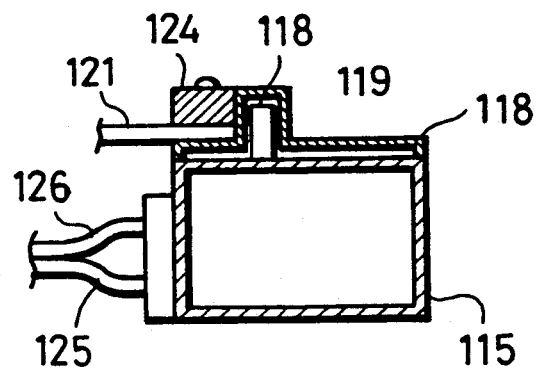
FIG. 19 is a sectional view taken along line A—A in FIG. 18.
Figure 20:
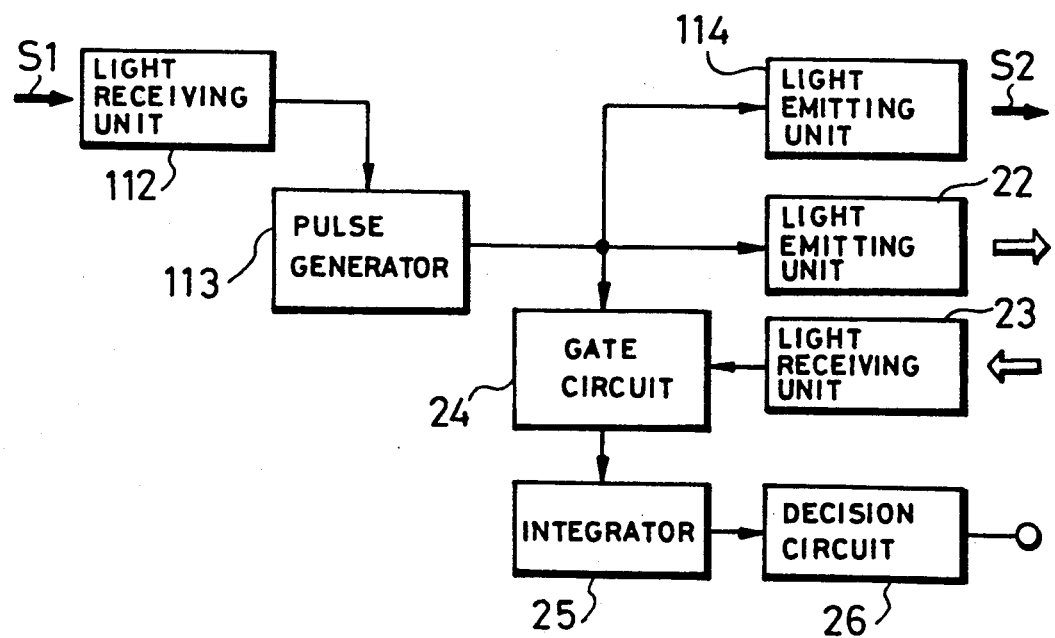
FIG. 20 is a block diagram of the photoelectric switch of FIG. 17.

To begin with, FIG. 16 is a perspective view showing one embodiment of a photoelectric detector according to the fourth technical means of the present invention, FIG. 17 is a perspective view showing a photoelectric switch equipped in the photoelectric detector of FIG. 16, FIG. 18 is a plan view of the photoelectric switch of FIG. 17, FIG. 19 is a sectional view taken along line A—A in FIG. 18, and FIG. 20 is a block diagram of the photoelectric switch of FIG. 17. Note that the components in FIG. 20 identical to those in prior figures are denoted by the same reference numerals.

The photoelectric detector shown in FIG. 16 comprises three photoelectric switches arrayed in order; i.e., a photoelectric switch 109, a photoelectric switch 110 at next stage downstream of the photoelectric switch 109, and a photoelectric switch 111 at further next stage. By way of example, as shown in FIG. 20, the photoelectric switch 109 includes, as basic components, the light emitting unit 22, the light receiving unit 23, the gate circuit 24, the integrator 25, and the decision circuit 26, similarly to prior figures. In addition, it also includes a transmission light receiving unit 112 for receiving a cyclic light pulse signal S1, a pulse generator 113 as signal generating means for generating, based on the light pulse signal S1, a synch timing signal in synchronism with the light pulse signal S1 or a delay timing signal delayed by a predetermined period of time from the light pulse signal S1 and then outputting the synch timing signal or the delay timing signal to the light emitting unit 22, and a transmission light emitting unit 114 for emitting a cyclic light pulse signal S2 in synchronism with the synch timing signal or the delay timing signal to the photoelectric switch 110 at next stage.

As shown in FIG. 17, the transmission light receiving unit 112 comprises a transmission light receiving element 116 projecting upwardly of a case 115, and the transmission light emitting unit 114 comprises a transmission light emitting element 117 projecting upwardly of the case 115. A light-transparent cap 118 is detachably attached to a top of the case 115, the cap 118 being provided with a projection 119 to house the light receiving element 116 and the light emitting element 117 therein and with a holder 122 for holding transmission optical fibers 120, 121. These optical fibers 120, 121 are fixed to the holder 122 by a fixture 124 fastened in place via a screw 123. On the other hand, the light emitting unit 22 comprises a detection light emitting element (not shown) housed in the case 115, a detection optical fiber 125 connected to the light emitting element, and a detection head (not shown) provided at a fore end of the optical fiber 125. The light receiving unit 23 comprises a detection light receiving element (not shown) housed in the case 110, another detection optical fiber 126 connected to the light receiving element, and the above detection head provided at a fore end of the optical fiber 126. The other photoelectric switches 110, 111 also each have the same construction. The photoelectric switch 109 and the photoelectric switch 110 are interconnected via the optical fiber 121, whereas the photoelectric switch 110 and the photoelectric switch 111 are interconnected via the optical fiber 127. It is to be here noted that the emission light from the detection light emitting element is called a sensing light and the light pulse signal emitted from the transmission light emitting element 117 is called a transmission light.

In this embodiment, when the transmission light, i.e., the cyclic light pulse signal S1, is transmitted to the photoelectric switch 109 via the optical fiber 120, this photoelectric switch 109 receives the light pulse signal S1 in the transmission light receiving element 116, following which the pulse generator 113 generates, based on the light pulse signal S1, a synch timing signal in synchronism with the light pulse signal S1 or a delay timing signal delayed by a predetermined period of time from the light pulse signal S1 and then outputting it to the detection light emitting unit 22. In response to the synch timing signal or the delay timing signal, the detection light emitting unit 22 intermittently emits the sensing light via the optical fiber 125 and the detection head. Subsequently, the light reflected from an object to be detected at this time is received by the detection light receiving unit 23 via the detection head and the optical fiber 126 and processed by the gate circuit 24 and the integrator 25 through the predetermined procedure. Thereafter, the decision circuit 26 determines the presence or absence of an object depending on whether the light pulse matching in timing with the sensing light is received or not. Also, in synchronism with the synch timing signal or the delay timing signal, the transmission light emitting unit 114 emits the light pulse signal S2 from the transmission light emitting element 117. Then, the light pulse signal S2 arrives the photoelectric switch 110 at next stage via the optical fiber 127, whereupon the photoelectric switch 110 at next stage also determines the presence or absence of an object in response to the light pulse signal S2 as with the above process and simultaneously outputs the light pulse signal to the photoelectric switch 111 at further next stage.

With the embodiment thus arranged, a plurality of the photoelectric switches 109, 110, 111 concentratedly installed in one place can be operated successively. Further, since the photoelectric switches are interconnected via the optical fiber 121 in this embodiment, it is possible, for example, that even when an obstacle 128 exists between the photoelectric switches 109 and 110, these photoelectric switches 109, 110 can be arranged to be spaced from each other and the light pulse signal can be transmitted via the optical fiber 121, or that even when the photoelectric switch 111 is mounted on a movable member 129, the light pulse signal can be transmitted via the optical fiber 127. It should be understood that while this embodiment illustrates the photoelectric detector comprising the three photoelectric switches 109, 110, 111, the present invention is not limited thereto. In the case where photoelectric detectors each comprising two or not less than four photoelectric switches are concentratedly installed in one place, these photoelectric switches can be operated successively.

Figure 21:
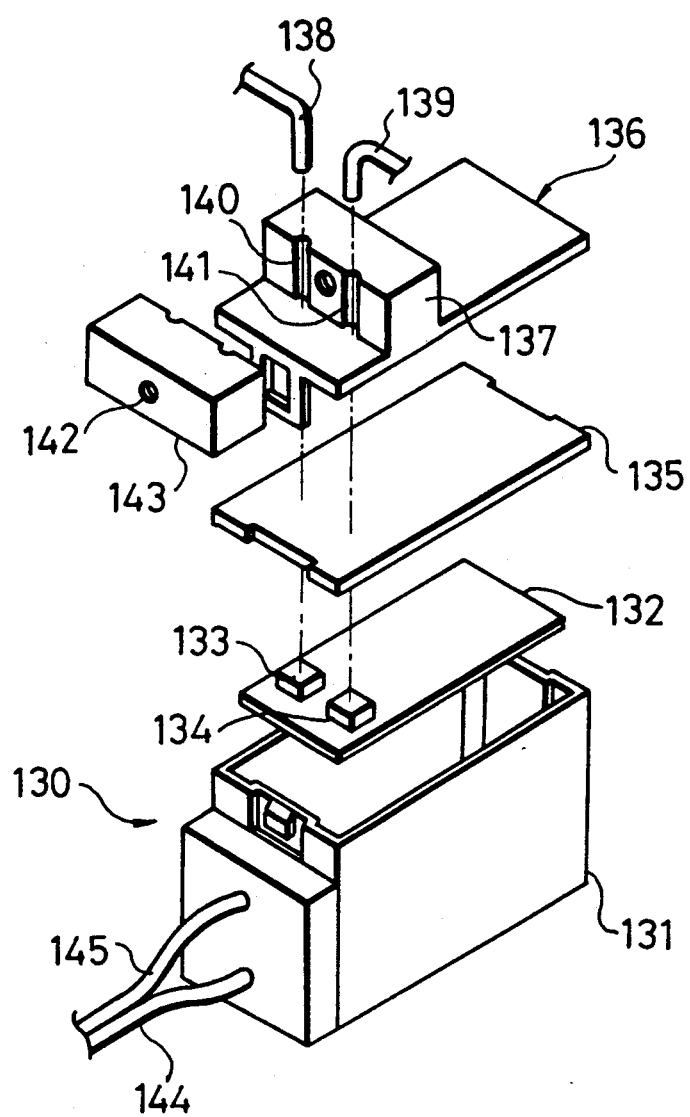
FIG. 21 is an exploded perspective view showing a photoelectric switch employed in a second embodiment according to third technical means of the present invention.
Figure 22:
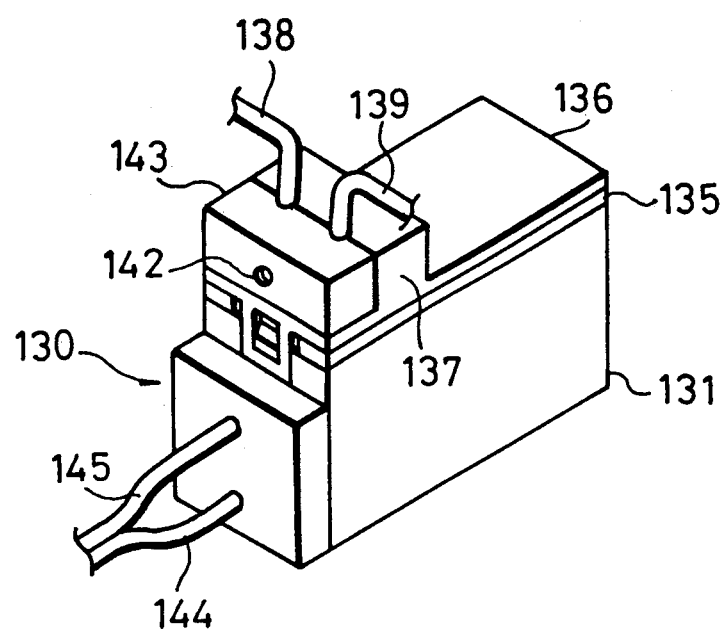
FIG. 22 is a perspective view of the photoelectric switch of FIG. 21 after assembly.

Next, FIG. 21 is an exploded perspective view showing one embodiment of a photoelectric switch equipped in a photoelectric detector according to fifth technical means of the present invention, and FIG. 22 is a perspective view of the photoelectric switch of FIG. 21 after assembly.

In the photoelectric detector shown in FIG. 21, there are arrayed a photoelectric switch 130 and another photoelectric switch (not shown) at next stage downstream of the photoelectric switch 130. By way of example, the photoelectric switch 130 includes, as basic components, the light emitting unit 22, the light receiving unit 23, the gate circuit 24, the integrator 25, the decision circuit 26, the transmission light receiving unit 112, the pulse generator 113 as signal generating means, and the transmission light emitting unit 114 as shown in FIG. 20. As shown in FIG. 21, the transmission light receiving unit 112 employed in this embodiment comprises a transmission light receiving element 133 which is mounted on a circuit board 132 housed in a case 131 and has the light receiving axis directed upward and the transmission light emitting unit 114 comprises a transmission light emitting element 34 which is also mounted on the circuit board 132 and has the light emitting axis directed upward. A light-transparent cap 136 is detachably attached to a top of the case 131 via a light-transparent upper plate 135. The cap 136 has a projection 137 formed with vertical semicylindrical grooves 140, 141 into which transmission optical fibers 138, 139 are engaged, respectively. A fixture 143 is fastened to the projection 137 via a screw 142 and the optical fibers 138, 139 are fixedly attached to the projection 137 by the fixture 143 in such a state that the optical fibers 138, 139 are opposite to the light receiving element 133 and the light emitting element 134, respectively. On the other hand, the light emitting unit 22 comprises a detection light emitting element (not shown) housed in the case 131, a detection optical fiber 144 connected to the light emitting element, and a detection head (not shown) provided at a fore end of the optical fiber 144. The light receiving unit 23 comprises a detection light receiving element (not shown) housed in the case 131, another detection optical fiber 145 connected to the light receiving element, and the above detection head provided at a fore end of the optical fiber 145. The other photoelectric switch also has the same construction.

In this embodiment, too, when the cyclic light pulse signal S1 is transmitted to the photoelectric switch 130 via the optical fiber 138, this photoelectric switch 130 receives the light pulse signal S1 in the transmission light receiving element 133 via the cap 136 and the upper plate 135, followed by determining the presence or absence of an object through the similar procedure to that in the above embodiment. In synchronism with the synch timing signal or the delay timing signal, the transmission light emitting element 134 emits the light pulse signal S2 via the upper plate 135 and the cap 136, thereby sending it to the transmission light receiving element of the electric switch 110 at next stage via the optical fiber 139. Then, the photoelectric switch 110 at next stage also determines the presence or absence of an object in response to the light pulse signal S2 as with the above process.

With the embodiment thus arranged, too, there can be obtained the advantage similar to that in the above embodiment.

The sixth and seventh technical means of the present invention will be described below with reference to FIGS. 23 to 61 to FIGS. 62 and 79, respectively.

Figure 23:
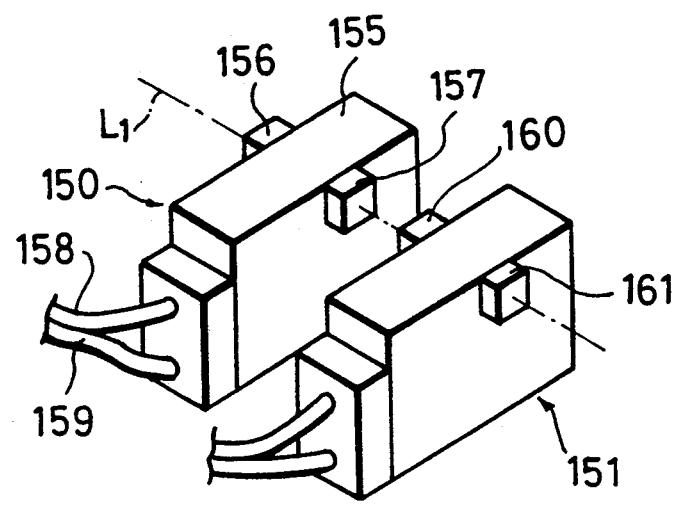
FIG. 23 is a perspective view showing a first embodiment of fourth technical means of the present invention.
Figure 24:
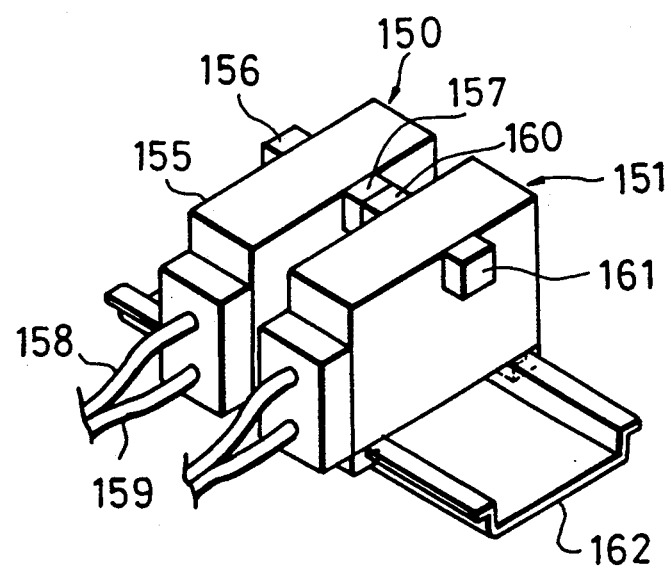
FIG. 24 is a perspective view showing a state that photoelectric switches of a photoelectric detector of FIG. 23 are arrayed on a rail.
Figure 25:
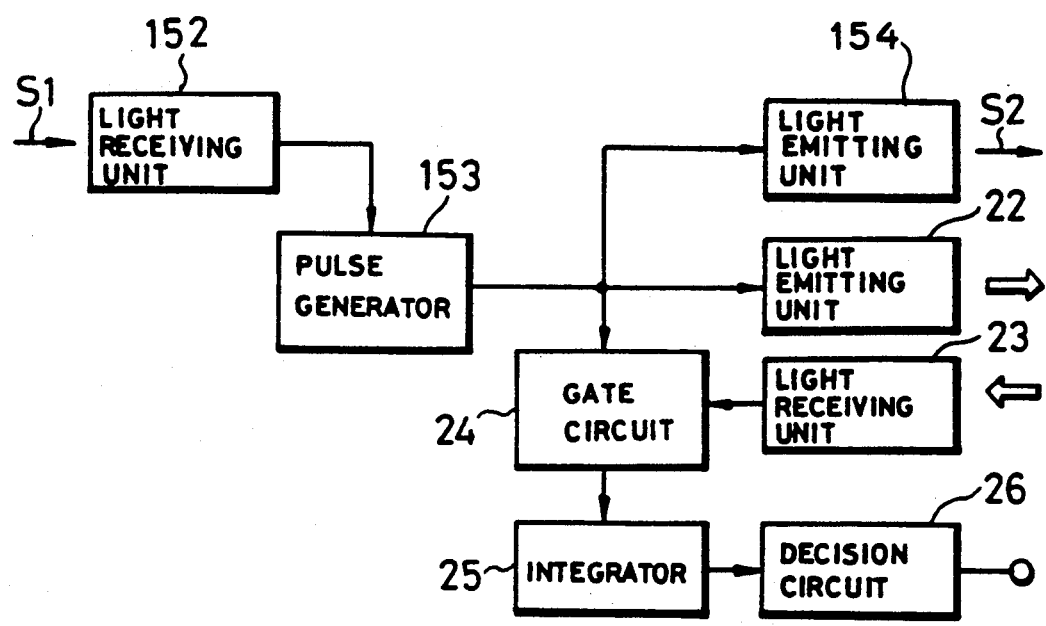
FIG. 25 is a block diagram showing the photoelectric switch of the photoelectric detector of FIG. 23.

FIG. 23 is a perspective view showing a first embodiment of the sixth technical means of the present invention, FIG. 24 is a perspective view showing a state that photoelectric switches of a photoelectric detector of FIG. 23 are arrayed on a rail, and FIG. 25 is a block diagram showing the photoelectric switch of the photoelectric detector of FIG. 23. Note that the components identical to those in the prior figures are denoted by the same reference numerals.

The photoelectric detector shown in FIG. 23 comprises a serial array of a photoelectric switch 150 and a photoelectric switch 151 at next stage downstream of the photoelectric switch 150. By way of example, as shown in FIG. 25, the photoelectric switch 150 includes, as basic components, the light emitting unit 22, the light receiving unit 23, the gate circuit 24, the integrator 25, and the decision circuit 26, similarly to the prior figures explained before. In addition, it also includes a transmission light receiving unit 152 for receiving a cyclic light pulse signal S1, a pulse generator 153 as signal generating means for generating, based on the light pulse signal S1, a synch timing signal in synchronism with the light pulse signal S1 or a delay timing signal delayed by a predetermined period of time from the light pulse signal S1 and then outputting the synch timing signal or the delay timing signal to the light emitting unit 22, and a transmission light emitting unit 154 for emitting a cyclic light pulse signal S2 in synchronism with the synch timing signal or the delay timing signal to the photoelectric switch 151 at next stage.

In FIG. 23, the transmission light receiving unit 152 comprises a transmission light receiving element 156 projecting from one side face of a case 155, and the transmission light emitting unit 153 comprises a transmission light emitting element 157 projecting from the other side face of the case 155. These light receiving element 156 and light emitting element 157 are arranged so as to align on one straight line L1 parallel to the direction in which the photoelectric switches 150, 151 are arrayed, direct in opposite directions away from each other, and set the light receiving axis of the light receiving element 156 and the light emitting axis of the light emitting element 157 to be coincident with the straight line L1. On the other hand, the light emitting unit 22 comprises a detection light emitting element (not shown) housed in the case 155, an optical fiber 158 connected to the light emitting element, and a detection head (not shown) provided at a fore end of the optical fiber 158. The light receiving unit 23 comprises a detection light receiving element (not shown) housed in the case 155, another optical fiber 159 connected to the light receiving element, and the above detection head provided at a fore end of the optical fiber 159. Likewise, the other photoelectric switch 151 at next stage comprises a transmission light receiving element 160, a transmission light emitting element 161, etc. As shown in FIG. 24, those photoelectric switches 150, 151 are mounted on a rail 162 in such a state that the transmission light emitting element 157 of the photoelectric switch 150 is opposite to the transmission light receiving element 160 of the photoelectric switch 151. It is to be here noted that the emission light from the detection light emitting element is called a sensing light and the light pulse signal emitted from the transmission light emitting element 157 is called a transmission light.

In this first embodiment, when the transmission light, i.e., the cyclic light pulse signal S1, is transmitted to the photoelectric switch 150 via the optical axis along the straight line L1, this photoelectric switch 150 receives the light pulse signal S1 in the transmission light receiving element 156, following which the pulse generator 153 generates, based on the light pulse signal S1, a synch timing signal in synchronism with the light pulse signal S1 or a delay timing signal delayed by a predetermined period of time from the light pulse signal S1 and then outputting it to the detection light emitting unit 22. In response to the synch timing signal or the delay timing signal, the detection light emitting unit 22 intermittently emits the sensing light via the optical fiber 158 and the detection head. Subsequently, the light reflected from an object to be detected at this time is received by the detection light receiving unit 23 via the detection head and the optical fiber 159 and processed by the gate circuit 24 and the integrator 25 through the predetermined procedure. Thereafter, the decision circuit 26 determines the presence or absence of an object depending on whether the light pulse matching in timing with the sensing light is received or not. Also, in synchronism with the synch timing signal or the delay timing signal, the transmission light emitting unit 154 emits the light pulse signal S2 from the transmission light emitting element 157. Then, the light pulse signal S2 arrives the photoelectric switch 151 at next stage via the optical axis along the straight line L1, where the light pulse signal S2 is received by the transmission light receiving element 160. After that, the photoelectric switch 151 at next stage also determines the presence or absence of an object in response to the light pulse signal S2 as with the above process.

With the first embodiment thus arranged, a plurality of the photoelectric switches 150, 151 concentratedly installed in one place can be operated successively. It should be understood that while this embodiment illustrates the photoelectric detector comprising the two photoelectric switches 150, 151, the present invention is not limited thereto. In the case of a photoelectric detector comprising three or more photoelectric switches concentratedly installed in one place, these photoelectric switches can also be operated successively.

Figure 26:
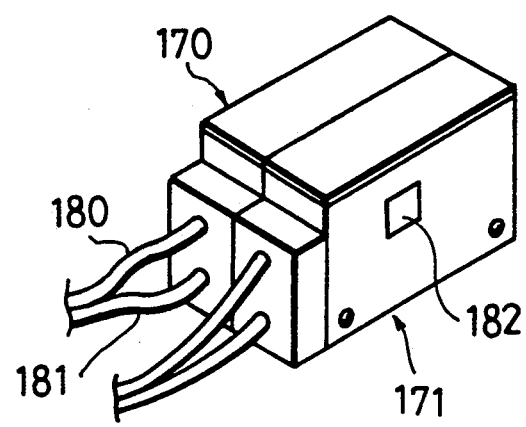
FIG. 26 is a perspective view showing a second embodiment of the fourth technical means.
Figure 27:
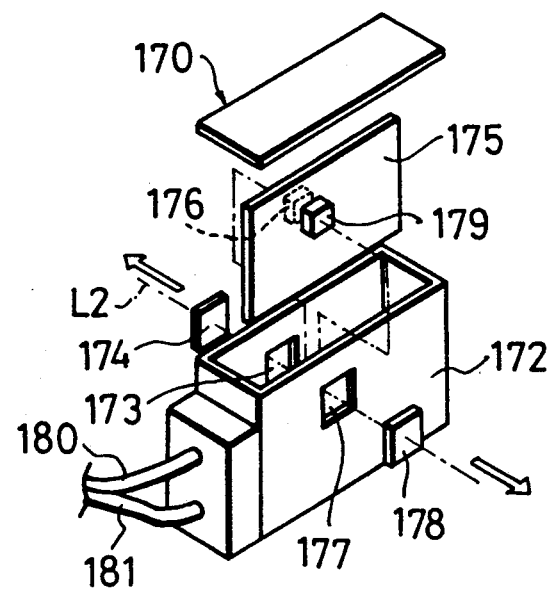
FIG. 27 is an exploded perspective view showing a photoelectric switch of a photoelectric detector of FIG. 26.

FIG. 26 is a perspective view showing a second embodiment of the photoelectric detector according to the sixth technical means, and FIG. 27 is an exploded perspective view showing a photoelectric switch of the photoelectric detector of FIG. 26.

The photoelectric detector shown in FIG. 26 comprises an array of a photoelectric switch 170 and a photoelectric switch 171 at next stage screwed to the photoelectric switch 170 in a closely-contacted relation. By way of example, the photoelectric switch 170 includes, as basic components, the light emitting unit 22, the light receiving unit 23, the gate circuit 24, the integrator 25, the decision circuit 26, the transmission light receiving unit 152, the pulse generator 153 as signal generating means, and the transmission light emitting unit 154, similarly to the above-mentioned first embodiment shown in FIG. 25. The transmission light receiving unit 152 employed in this embodiment comprises, as shown in FIG. 27, an opening 173 bored in one side face of a case 172, a light receiving window 174 fitted into the opening 173, and a transmission light receiving element 176 which is mounted on a circuit board 175 housed in the case 172 and positioned to face the light receiving window 174. Likewise, the transmission light emitting unit 153 comprises an opening 177 bored in the other side face of the case 172, a light emitting window 178 fitted into the opening 177, and a transmission light emitting element 179 which is mounted on the circuit board 175 and positioned to face the light emitting window 178. The opening 173, the light receiving element 176, the light emitting element 179, and the opening 177 are arranged to align on one straight line L2 parallel to the direction in which the photoelectric switches 170, 171, etc. are arrayed. The light receiving element 176 and the light emitting element 179 are directed in opposite directions away from each other, and the light receiving axis of the light receiving element 176 and the light emitting axis of the light emitting element 179 are set to coincide with the straight line L2. On the other hand, the light emitting unit 22 comprises a detection light emitting element (not shown) housed in the case 172, an optical fiber 180 connected to the light emitting element, and a detection head (not shown) provided at a fore end of the optical fiber 180. The light receiving unit 23 comprises a detection light receiving element (not shown) housed in the case 172, another optical fiber 181 connected to the light receiving element, and the above detection head (not shown) provided at a fore end of the optical fiber 181. The other photoelectric switch 171 is likewise constructed such that a light receiving window, a light receiving element, a light emitting element (these being not shown), a light emitting window 182 and so forth are arranged to align on the straight line L2.

In this second embodiment, too, when the cyclic light pulse signal S1 is transmitted to the photoelectric switch 170 via the optical axis along the straight line L2, this photoelectric switch 170 receives the light pulse signal S1 in the transmission light receiving element 176 via the light receiving window 173, following which the presence or absence of an object is determined through the same procedure as that in the above first embodiment. Then, in synchronism with the synch timing signal or the delay timing signal, the transmission light emitting element 179 emits the light pulse signal S2 and transmits it to the transmission light receiving element of the photoelectric switch 171 at next stage via the optical axis along the straight line L2. After that, the photoelectric switch 171 at next stage also determines the presence or absence of an object in response to the light pulse signal S2 through the process like above.

With the second embodiment thus arranged, too, there can be obtained the advantage similar to that in the above first embodiment. In addition, since the photoelectric switches 170, 171 are closely contacted with each other in this embodiment, an array space for those photoelectric switches 170, 171 can be reduced. Also, since not only the photoelectric switches 170, 171 are closely contacted with each other, but also the openings 173, 177 are located inwardly of the outer peripheral edges of the case 172, the light pulse signal emitted from the transmission light emitting element 179, etc. can be prevented from leaking to the exterior. This embodiment further enables an improvement in resistance against water and dust because the light receiving window 174 and the light emitting window 178 are respectively fitted into the openings 173, 177 of the case 172 so as to sealingly enclose the case 172.

Figure 28:
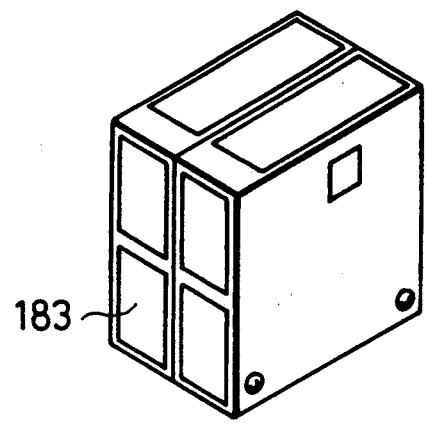
FIG. 28 is a perspective view showing a photoelectric detector equipped with lens type photoelectric switches each corresponding to the photoelectric switch of FIG. 27.
Figure 29:
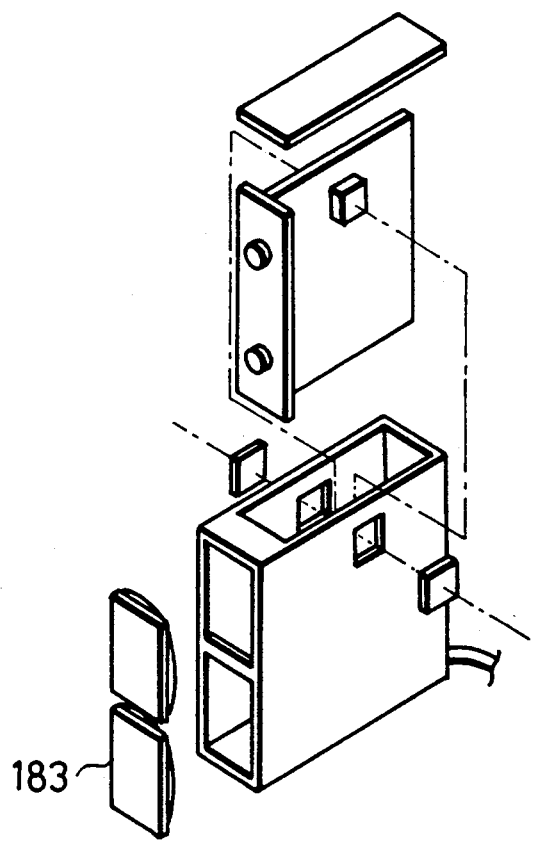
FIG. 29 is an exploded perspective view of the optical fiber type photoelectric switch of FIG. 28.
Figure 30:
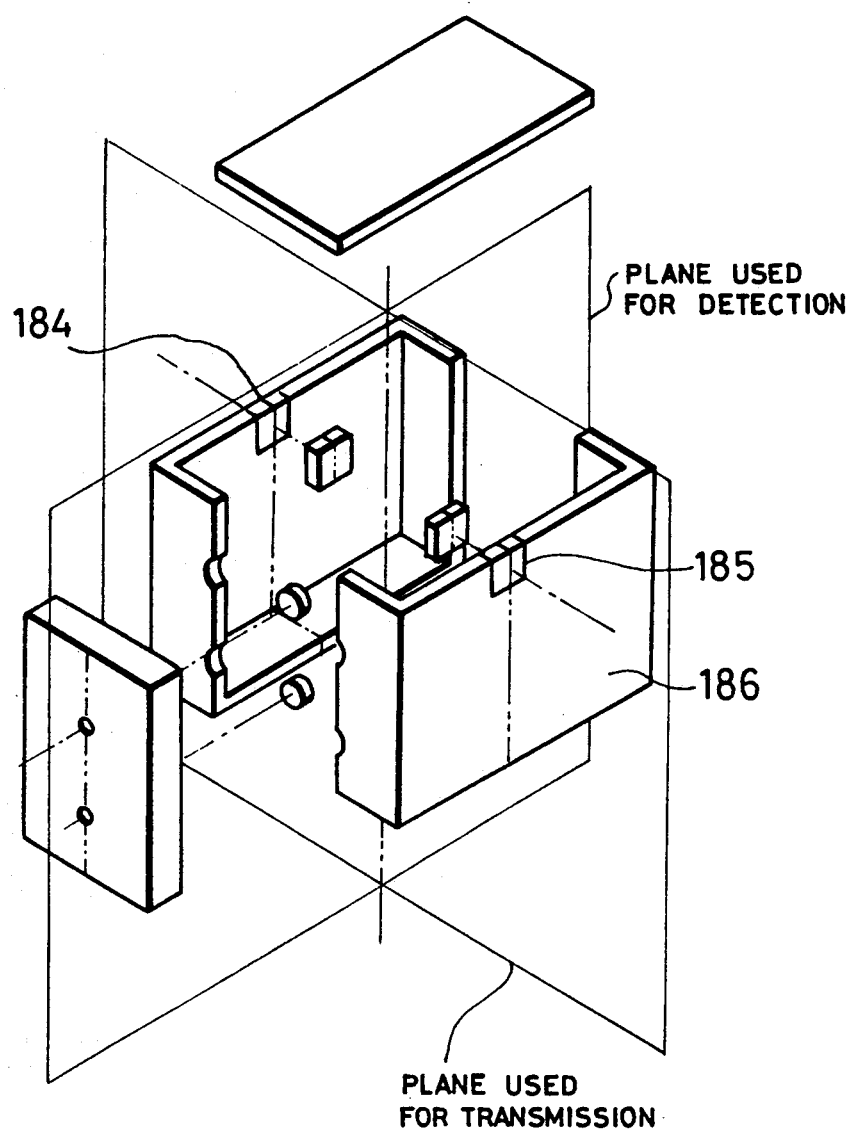
FIG. 30 is an exploded perspective view of a photoelectric switch, showing an application example of the second embodiment.
Figure 31:
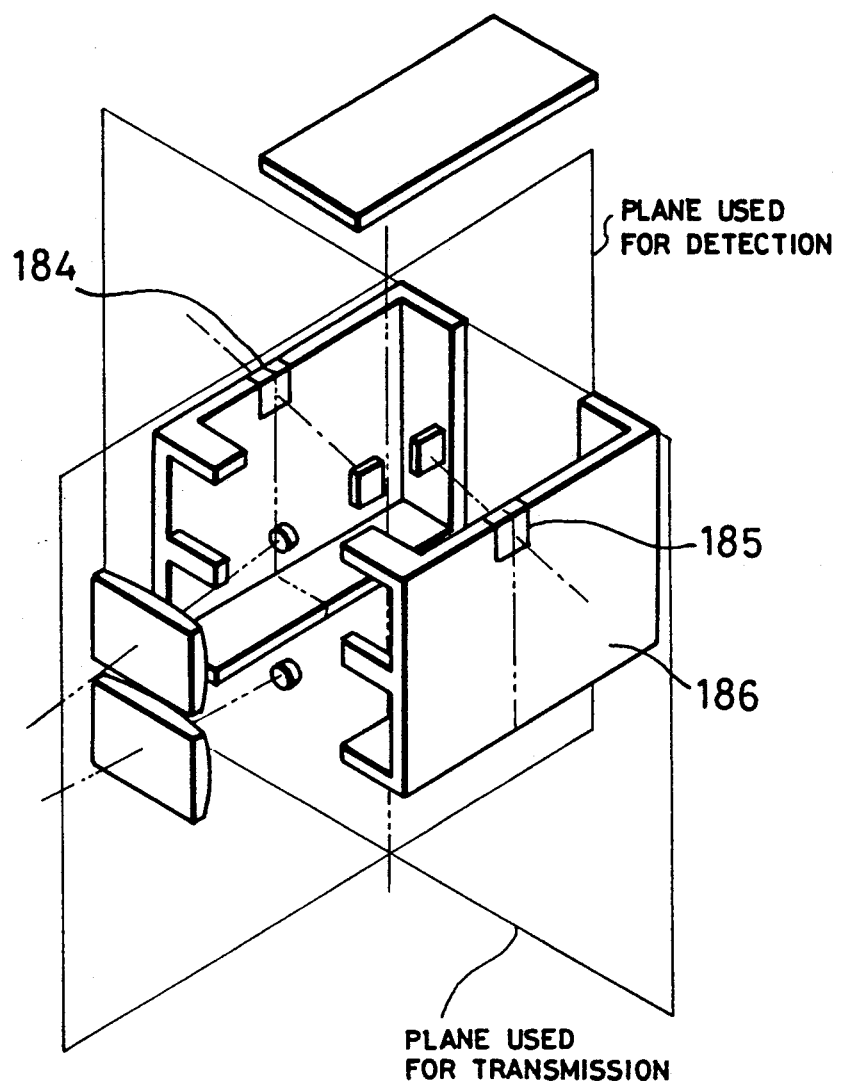
FIG. 31 is an exploded perspective view showing a lens type photoelectric switch corresponding to the photoelectric switch of FIG. 30.

It should be understood that while this second embodiment is illustrated as concentratedly installing the optical fiber type photoelectric switches having the optical fibers 180, 181, the present invention is not limited thereto and, also in the case where a plurality of lens type photoelectric switches having lenses 183 are concentratedly installed as shown in FIGS. 28 and 29, these photoelectric switches can be operated successively in a like manner. Further, while the light receiving window 174 and the light emitting window 178 are respectively fitted into the openings 173, 177 of the case 172 in this embodiment, the light receiving window 174 and the light emitting window 178 may be omitted, as it is necessary, so that the pulse light signal is transmitted via only the openings 173, 177. Additionally, while the openings 173, 177 are located inwardly of the outer peripheral edges of the case 172 in this embodiment, a light receiving window 184 and a light emitting window 185 may be provided in contact with the outer peripheral edges of the case 186 as shown in FIGS. 30 and 31, if it is necessary. Finally, while this embodiment illustrates the photoelectric detector comprising the two photoelectric switches 170, 171, the present invention is not limited thereto and, in the case of a photoelectric detector comprising three or more photoelectric switches concentratedly installed in one place, these photoelectric switches can also be operated successively.

Figure 32:
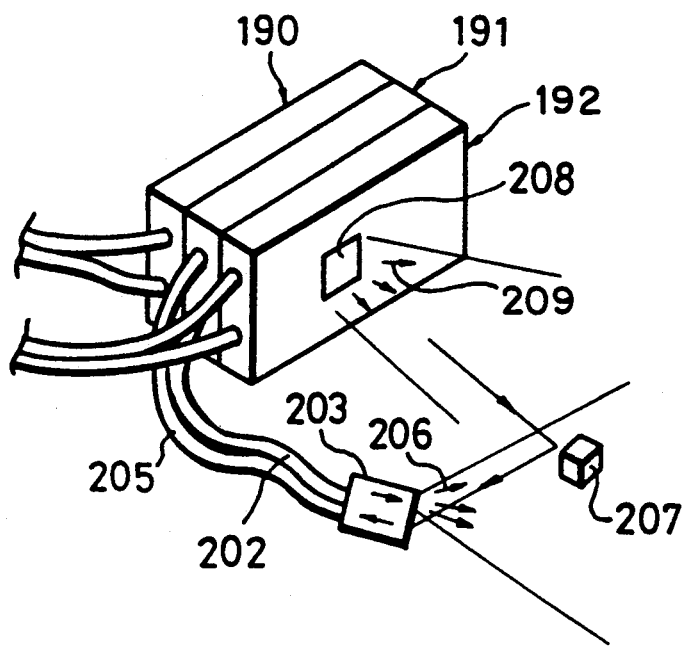
FIG. 32 is a perspective view showing a third embodiment of the fourth technical means.
Figure 33:
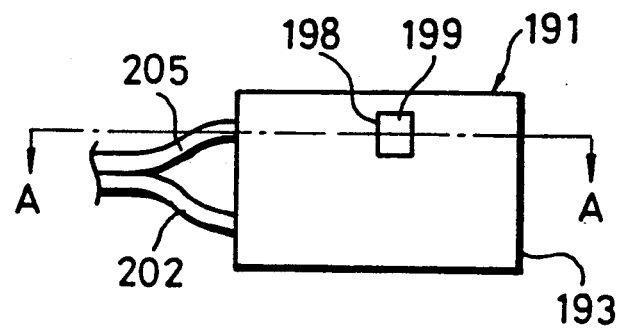
FIG. 33 is a side view showing a photoelectric switch equipped in a photoelectric detector of FIG. 32.
Figure 34:
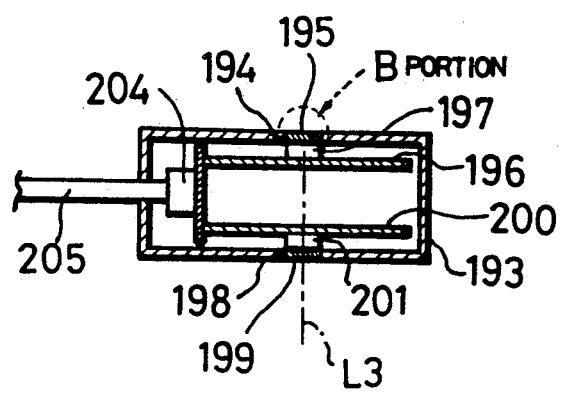
FIG. 34 is a sectional view of the photoelectric switch taken along line A—A in FIG. 33.
Figure 35:
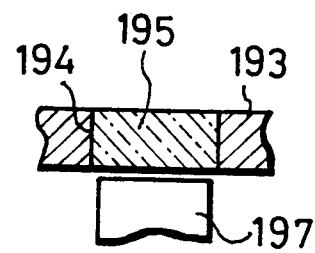
FIG. 35 is an enlarged sectional view showing a B portion in FIG. 34.
Figure 36:
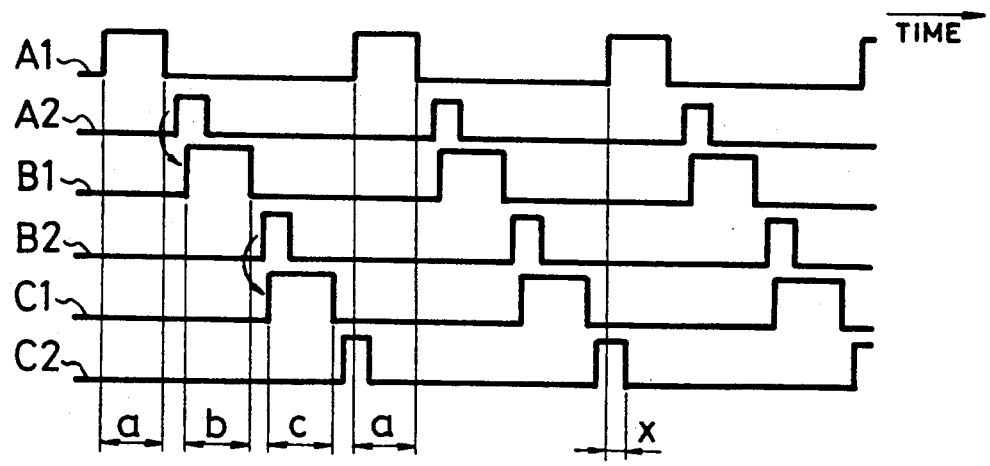
FIG. 36 is a chart showing the timing relationships between signals in the photoelectric detector of FIG. 32.

FIG. 32 is a perspective view showing a third embodiment of the photoelectric detector according to the sixth technical means, FIG. 33 is a side view showing a photoelectric switch equipped in the photoelectric detector of FIG. 32, FIG. 34 is a sectional view of the photoelectric switch taken along line A—A in FIG. 33, FIG. 35 is an enlarged sectional view showing a B portion in FIG. 34, and FIG. 36 is a chart showing the timing relationships between signals in the photoelectric detector of FIG. 32.

The photoelectric detector shown in FIG. 32 comprises a photoelectric switch 190, a photoelectric switch 191 at next stage and a photoelectric switch 192 at further next stage which are arrayed close-contactly to each other in series. By way of example, the photoelectric switch 191 includes, as basic components, the light emitting unit 22, the light receiving unit 23, the gate circuit 24, the integrator 25, the decision circuit 26, the transmission light receiving unit 152, the pulse generator 153 as signal generating means, and the transmission light emitting unit 154, similarly to the above-mentioned first embodiment shown in FIG. 25. Like the above second embodiment shown in FIG. 27, the transmission light receiving unit 152 employed in this embodiment comprises, as shown in FIG. 34, an opening 194 bored in one side face of a case 193, a light receiving window 195 fitted into the opening 194, and a transmission light receiving element 197 which is mounted on a circuit board 196 housed in the case 193 and positioned to face the light receiving window 195. Likewise, the transmission light emitting unit 153 comprises an opening 198 bored in the other side face of the case 193, a light emitting window 199 fitted into the opening 198, and a transmission light emitting element 201 which is mounted on another circuit board 200 and positioned to face the light emitting window 199. The opening 194, the light receiving element 197, the light emitting element 201, and the opening 198 are arranged to align on one straight line L3 parallel to the direction in which the photoelectric switches 190-192 are arrayed. The light receiving element 197 and the light emitting element 201 are directed in opposite directions away from each other, and the light receiving axis of the light receiving element 197 and the light emitting axis of the light emitting element 201 are set to coincide with the straight line L3. On the other hand, the light emitting unit 22 comprises a detection light emitting element (not shown) housed in the case 193, an optical fiber 202 connected to the light emitting element, and a detection head 203 provided at a fore end of the optical fiber 202. The light receiving unit 23 comprises a detection light receiving element 204 housed in the case 193, another optical fiber 205 connected to the light receiving element 204, and the above detection head 203 provided at a fore end of the optical fiber 205. The transmission light emitting element 201 emits the transmission light with the wavelength different from the sensing light emitted out of the detection light emitting element. Note that the other photoelectric switches 190, 192 are of the same construction.

In this third embodiment, too, when a cyclic light pulse signal is transmitted to the photoelectric switch 190 via the optical axis along the straight line L3, this photoelectric switch 190 determines the presence or absence of an object in response to the light pulse signal through the same procedure as that in the above first embodiment and simultaneously emits the light pulse signal S1 for transmitting it to the photoelectric switch 191 at next stage via the optical axis along the straight line L3. Then, the photoelectric switch 191 at next stage receives the light pulse signal S1 in the transmission light receiving element 197 via the light receiving window 195, following which the pulse generator 153 generates, based on the light pulse signal S1, a synch timing signal in synchronism with the light pulse signal S1 or a delay timing signal delayed by a predetermined period of time from the light pulse signal S1 and then outputting it to the detection light emitting unit 22. In response to the synch timing signal or the delay timing signal, the detection light emitting unit 22 intermittently emits a sensing light 206 via the optical fiber 202 and the detection head 203. Subsequently, the light reflected from an object 207 to be detected at this time is received by the detection light receiving element 204 via the detection head 203 and the optical fiber 205 and processed by the gate circuit 24 and the integrator 25 through the predetermined procedure. Thereafter, the decision circuit 26 determines the presence or absence of an object depending on whether the light pulse matching in timing with the sensing light is received or not. Also, in synchronism with the synch timing signal or the delay timing signal, the transmission light emitting element 201 emits the light pulse signal S2 for transmitting it to the transmission light receiving element of the photoelectric switch 192 at further next stage via the optical axis along the straight line L3. Then, the photoelectric switch 192 at further next stage also determines the presence or absence of an object in response to the light pulse signal S2 through the process like above. At the same time, another transmission light (i.e., a light pulse signal) 209 is emitted via the light emitting window 208 of the photoelectric switch 192.

FIG. 36 is a chart showing the relationships between light emission timings of the photoelectric switches 190 to 192. In FIG. 36, A1 and A2 are characteristic lines indicating light emission timings of the detection light emitting element and the transmission light emitting element of the photoelectric switch 190, B1 and B2 are characteristic lines indicating light emission timings of the detection light emitting element and the transmission light emitting element 201 of the photoelectric switch 191 at next stage, and C1 and C2 are characteristic lines indicating light emission timings of the detection light emitting element and the transmission light emitting element of the photoelectric switch 192 at further next stage, respectively.

Emission time zones of the photoelectric switches 190 to 192 are set as shown in FIG. 36. More specifically, first, the photoelectric switch 190 emits the sensing light from the detection light emitting element in the emission time zone of arrow a as indicated by the characteristic line A1, following which it emits the transmission light from the transmission light emitting element after a predetermined period of time as indicated by the characteristic line A2. Then, in response to the transmission light from the photoelectric switch 190, the photoelectric switch 191 at next stage emits the sensing light from the detection light emitting element after a predetermined period of time in the emission time zone of arrow b as indicated by the characteristic line B1, following which it emits the transmission light from the transmission light emitting element as indicated by the characteristic line B2. Subsequently, in response to the transmission light from the photoelectric switch 191, the photoelectric switch 193 at further next stage emits the sensing light from the detection light emitting element after a predetermined period of time in the emission time zone of arrow c as indicated by the characteristic line C1, following which it emits the transmission light from the transmission light emitting element as indicated by the characteristic line C2. Thus, the emission time zones of the photoelectric switches 190 to 192 are set not to overlap with each other and, therefore, a decision indicating the presence of an object will not be made even if the sensing light is received by the detection light receiving element other than the self-emission time zone. Further, since the photoelectric switches 190 to 192 are arrayed close-contactly to each other in series, the transmission lights emitted from the respective transmission light emitting elements of the photoelectric switches 190, 191 will not leak to the exterior. However, when the light emitting window 208 of the photoelectric switch 192 at further next stage is exposed to the exterior, the transmission light 209 is emitted via the light transmitting window 208. This leads to a fear that in a time zone x where the transmission light 209 and the sensing light 207 overlap with each other, as shown in FIG. 36, the transmission light 209 may be reflected by the object 207 to reach the light receiving element 204 after straying into the detection head 203.

Figure 37:
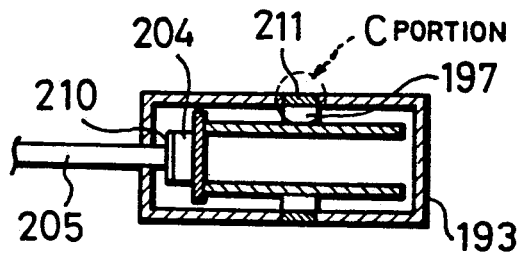
FIG. 37 is a sectional view showing a photoelectric switch provided with a filter member, as an application example of the third embodiment.
Figure 38:
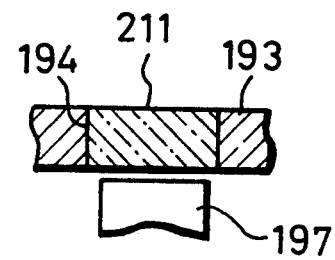
FIG. 38 is an enlarged sectional view showing a C portion in FIG. 37.
Figure 39:
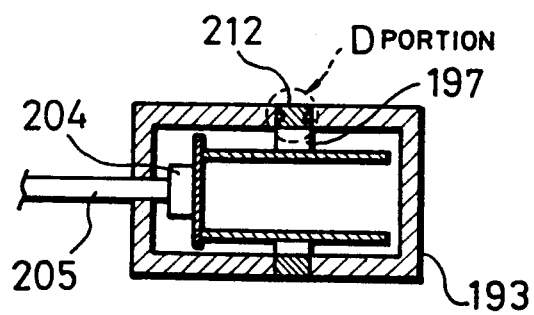
FIG. 39 is a sectional view showing a photoelectric switch provided with a double formed filter, as an application example of the third embodiment.
Figure 40:
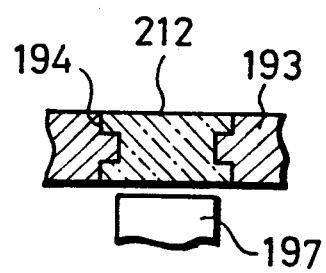
FIG. 40 is an enlarged sectional view showing a D portion in FIG. 39.
Figure 41:
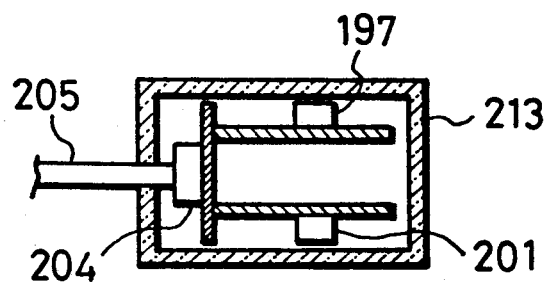
FIG. 41 is a sectional view showing a photoelectric switch with a case itself formed of a filter member, as an application example of the third embodiment.
Figure 42:
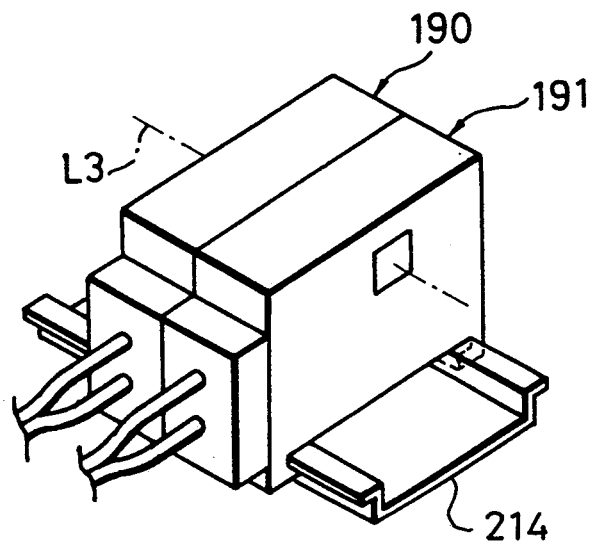
FIG. 42 is a perspective view showing a state that the photoelectric switches are arrayed on a rail.
Figure 43:
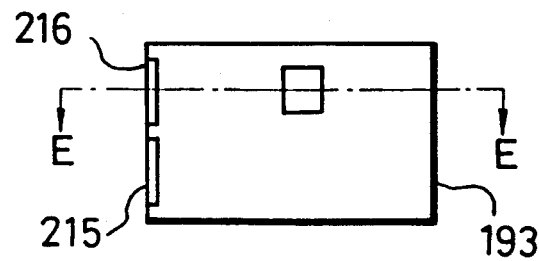
FIG. 43 is a side view of a lens type photoelectric switch corresponding to the photoelectric switch of FIG. 32.
Figure 44:
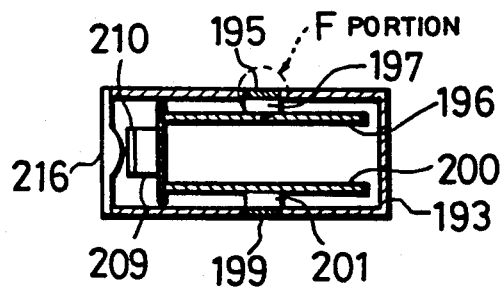
FIG. 44 is a sectional view of the photoelectric switch taken along line E—E in FIG. 43.
Figure 45:
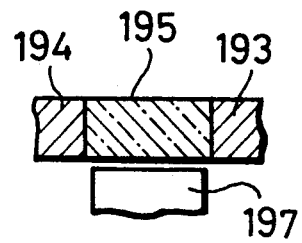
FIG. 45 is an enlarged sectional view showing an F portion in FIG. 44.
Figure 46:
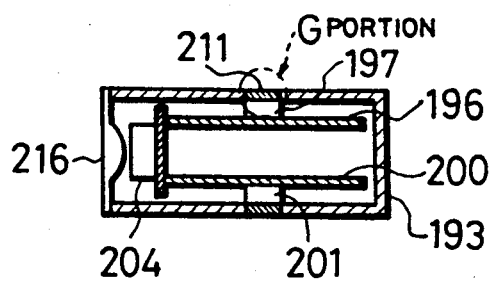
FIG. 46 is a sectional view showing a photoelectric switch provided with a filter.
Figure 47:
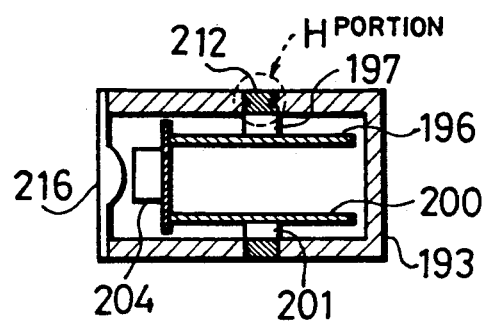
FIG. 47 is a sectional view showing a photoelectric switch provided with a double formed filter, as an application example of the third embodiment.
Figure 48:
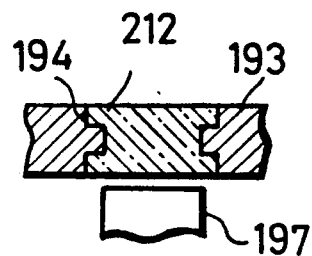
FIG. 48 is an enlarged sectional view showing an H portion in FIG. 47.

With the third embodiment thus arranged, too, there can be obtained the advantage similar to that in the above first embodiment. In addition, since the wavelength of the transmission light emitted out of the transmission light emitting element 201 is different from that of the sensing light emitted out of the detection light emitting element, the transmission light and the sensing light can be discriminated with the naked eye, making it possible to easily prevent the transmission light and the sensing light from overlapping with each other. Also, since the photoelectric switches 190 to 192 are arranged close-contactly to each other in series, an array space for those photoelectric switches 190 to 192 can be reduced. This embodiment further enables an improvement in resistance against water and dust because the light receiving window 195 and the light emitting window 199 are respectively fitted into the openings 194, 198 of the case 193 so as to seal the case 193.

Where a filter member 210 capable of attenuating a wavelength range of the transmission light is interposed between the detection light receiving element 204 and the optical fiber 205 as shown in FIG. 37, the filter member 210 serves to selectively pass the sensing light therethrough, whereby the transmission light can be prevented from interfering with the sensing light. Likewise, where a light receiving window 211 formed of a filter member capable of attenuating a wavelength range of the sensing light is fitted into the opening 194 as shown in FIG. 38, the light receiving window 211 serves to selectively pass the transmission light therethrough, whereby the sensing light can be prevented from interfering with the transmission light. By fitting a light receiving window 212, which is formed of a filter member capable of attenuating a wavelength range of the sensing light and is doubleformed, into the opening 194 as shown in FIGS. 39 and 40, it is possible to not only prevent the sensing light from interfering with the transmission light, but also seal the case 193 for improving resistance against water and dust. Further, by providing a case 213 formed of a filter member capable of attenuating a wavelength range of the sensing light as shown in FIG. 41, it is possible to prevent interference of the sensing light, improve a sealing ability, and reduce the number of parts. It should be understood that while this third embodiment illustrates the case comprising the three photoelectric switches 190 to 192 arrayed in series, the present invention is not limited thereto. Other than three photoelectric switches, for example, only two photoelectric switches 190, 191, may be arrayed in series by being mounted on a rail 214 as shown in FIG. 42. Additionally, while this third embodiment is illustrated as having the optical fibers 202, 205, the present invention is not limited thereto and the similar advantage can also be obtained in the cases where a plurality of lens type photoelectric switches having lenses 215, 216 as shown in FIGS. 43 to 48 are concentratedly installed in one place.

Figure 49:
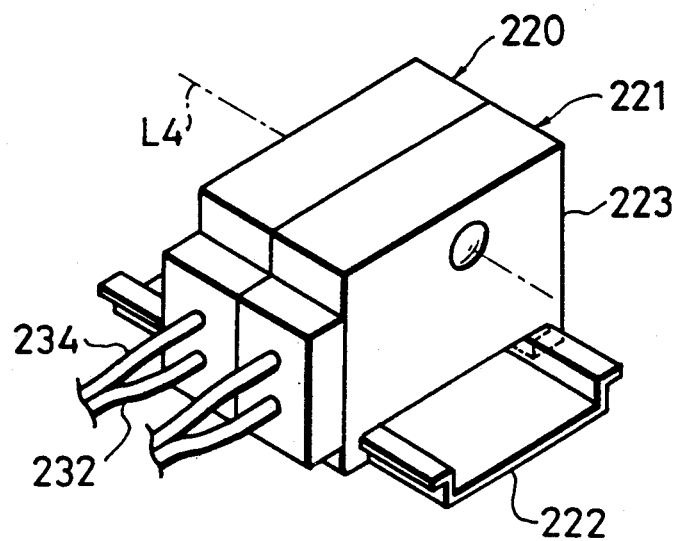
FIG. 49 is a perspective view showing a fourth embodiment of the fourth technical means.
Figure 50:
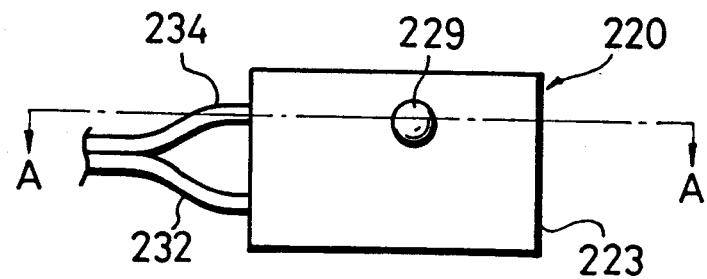
FIG. 50 is a side view showing a photoelectric switch equipped in a photoelectric detector of FIG. 49.
Figure 51:
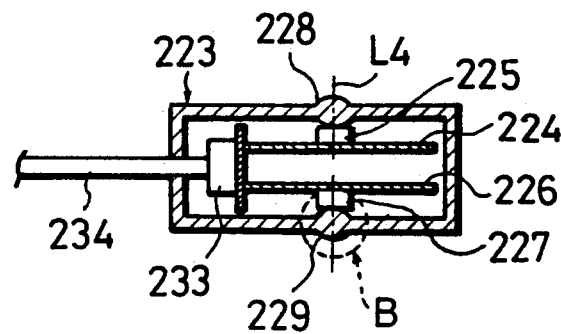
FIG. 51 is a sectional view of the photoelectric switch taken along line A—A in FIG. 50.
Figure 52:
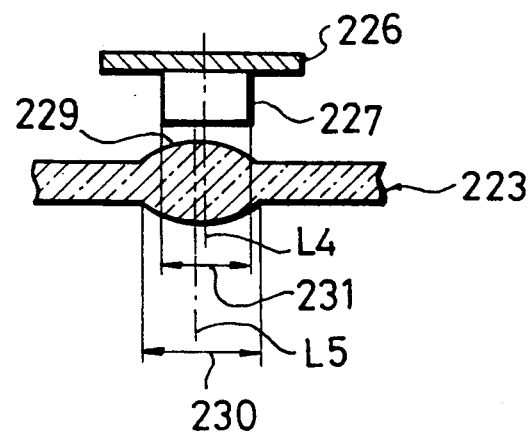
FIG. 52 is an enlarged sectional view showing a B portion in FIG. 51.

FIG. 49 is a perspective view showing a fourth embodiment of the photoelectric detector according to the sixth technical means, FIG. 50 is a side view showing a photoelectric switch equipped in the photoelectric detector of FIG. 49, FIG. 51 is a sectional view of the photoelectric switch taken along line A—A in FIG. 50, and FIG. 52 is an enlarged sectional view showing a B portion in FIG. 51.

The photoelectric detector of the fourth embodiment shown in FIG. 49 comprises a photoelectric switch 220 and a photoelectric switch 221 at next stage which are arrayed close-contactly to each other on a rail 222. By way of example, the photoelectric switch 220 includes, as basic components, the light emitting unit 22, the light receiving unit 23, the gate circuit 24, the integrator 25, the decision circuit 26, the transmission light receiving unit 152, the pulse generator 153 as signal generating means, and the transmission light emitting unit 154, similarly to the above-mentioned first embodiment shown in FIG. 25. The transmission light receiving unit 152 employed in this embodiment comprises, as shown in FIG. 51, a case 223 formed of light-transparent resin and a transmission light receiving element 225 which is mounted on a circuit board 224 housed in the case 223 and receives the light passing through the case 223. Likewise, the transmission light emitting unit 153 comprises the case 223 and a transmission light emitting element 227 which is mounted on another circuit board 226 and transmits the transmission light to the exterior through the case 223. The light receiving element 225 and the light emitting element 227 are arranged so as to align on one straight line L4 parallel to the direction in which the photoelectric switches 220, 221 are arrayed, directed in opposite directions away from each other, and set so that the light receiving axis of the light receiving element 225 and the light emitting axis of the light emitting element 227 are coincident with the straight line L4. The case 223 is integrally molded with lens portions 228, 229 arranged to align on the straight line L4 and each projecting outwardly and inwardly. The lens portion 229 of the transmission light emitting unit 154, by way of example, is set such that, as shown in FIG. 52, the light emitting axis of the light emitting element 227 positioned on the straight line L4 passes through a projected area of the lens portion 229 indicated by arrow 230, and a principal axis L5 of the lens portion 229 passes through a light emission area indicated by arrow 231, with the light emitting axis (straight line L4) of the light emitting element 227 being substantially parallel to the lens principal axis L5. The other lens portion 228 is also arranged in a like manner. On the other hand, the light emitting unit 22 comprises a detection light emitting element (not shown) housed in the case 223, an optical fiber 232 connected to the light emitting element, and a detection head (not shown) provided at a fore end of the optical fiber 232. The light receiving unit 23 comprises a detection light receiving element 233 housed in the case 223, another optical fiber 234 connected to the light receiving element 233, and the above detection head provided at a fore end of the optical fiber 234. Note that the other photoelectric switch 221 is of the same construction.

In this fourth embodiment, too, when the cyclic light pulse signal S1 is transmitted to the photoelectric switch 220 via the optical axis along the straight line L4, this photoelectric switch 220 receives the light pulse signal S1 in the transmission light receiving element 225 through the lens portion 228, following which the pulse generator 153 generates, based on the light pulse signal S1, a synch timing signal in synchronism with the light pulse signal S1 or a delay timing signal delayed by a predetermined period of time from the light pulse signal S1 and then outputting it to the detection light emitting unit 22. In response to the synch timing signal or the delay timing signal, the detection light emitting unit 22 intermittently emits the sensing light via the optical fiber 232 and the detection head. Subsequently, the light reflected from an object to be detected at this time is received by the detection light receiving element 223 via the detection head and the optical fiber 234 and processed by the gate circuit 24 and the integrator 25 through the predetermined procedure. Thereafter, the decision circuit 26 determines the presence or absence of an object depending on whether the light pulse matching in timing with the sensing light is received or not. Also, in synchronism with the synch timing signal or the delay timing signal, the transmission light emitting element 227 emits the light pulse signal S2 for transmitting it to the transmission light receiving element of the photoelectric switch 221 at next stage through the lens portion 229.

With the fourth embodiment thus arranged, too, there can be obtained the advantage similar to that in the above first embodiment. In addition, since the light is received through the lens portion 228 and emitted through the lens portion 229 in this embodiment, light transmission efficiency of the light pulse signal can be increased.

Figure 53:
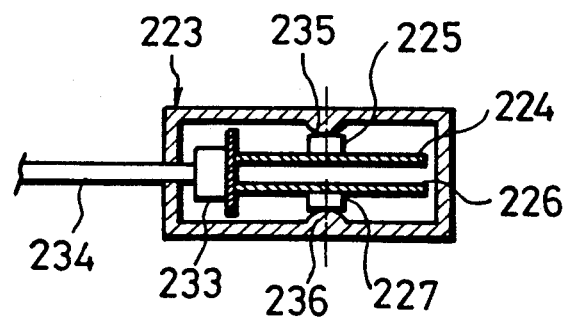
FIG. 53 is a sectional view showing a photoelectric switch provided with a hemispherical lens body projecting only inwardly, as an application example of the fourth embodiment.
Figure 54:
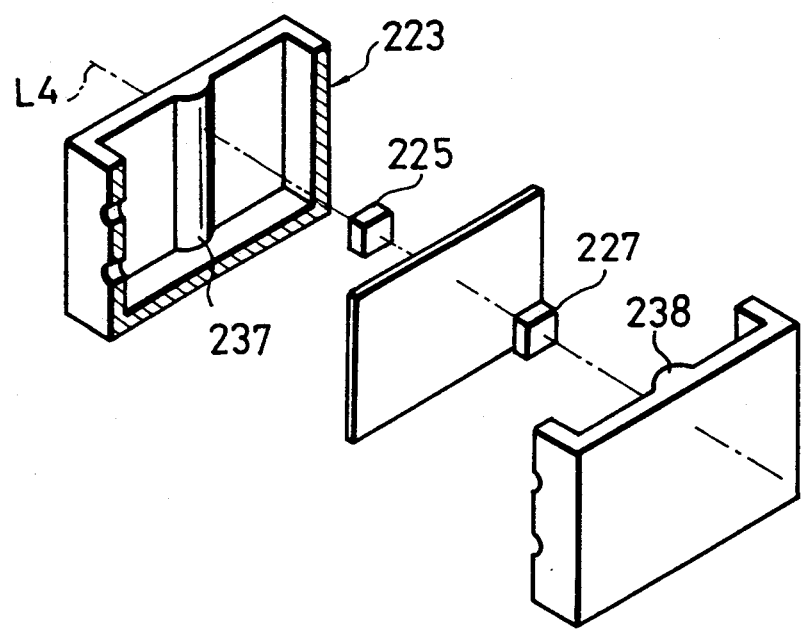
FIG. 54 is an exploded perspective view showing a photoelectric switch provided with a semicylindrical lens body, as an application example of the fourth embodiment.

Additionally, where hemispherical lens portions 235, 236 projecting inwardly from the case 223 are formed integrally with the case 223 as shown in FIG. 53, the photoelectric switches 220, 221 can be arrayed close-contactly to each other because of those lens portions 235, 236 not projecting outwardly. This makes it possible to reduce an array space for those photoelectric switches 220, 221 and prevent the lens portions from being stained or damaged. Moreover, where semicylindrical lens portions 237, 238 projecting inwardly and extending vertically are formed integrally with the case 223 as shown in FIG. 54, the case 223 can be more easily molded.

Figure 55:
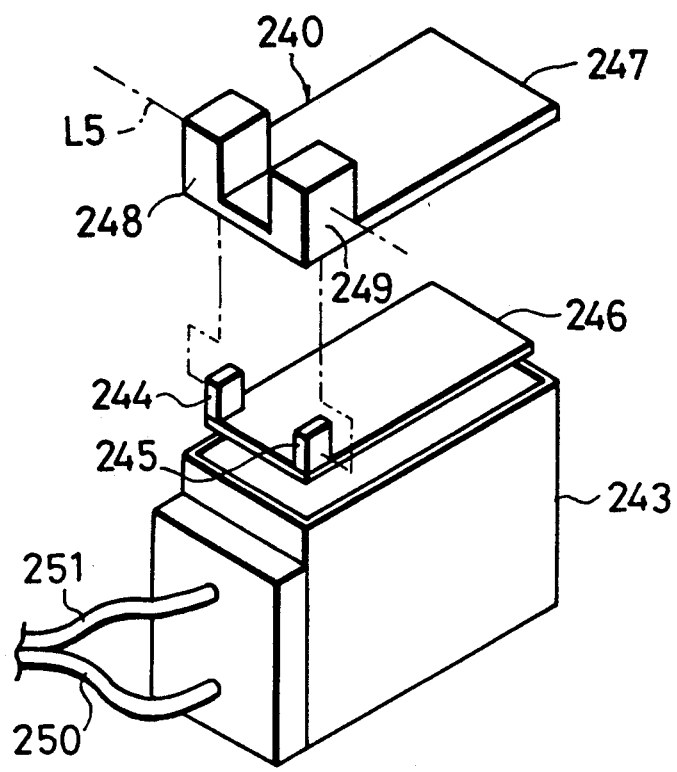
FIG. 55 is a perspective view showing a photosensitive switch employed in a fifth embodiment of the fourth technical means.
Figure 56:
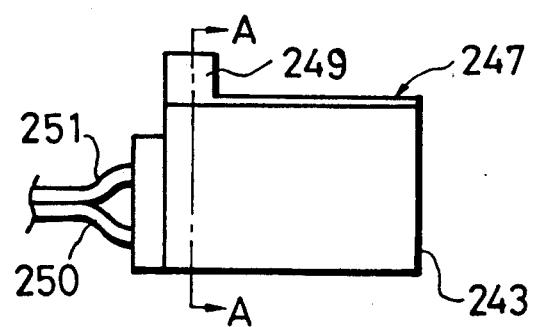
FIG. 56 is a side view of the photoelectric switch of FIG. 55.
Figure 57:
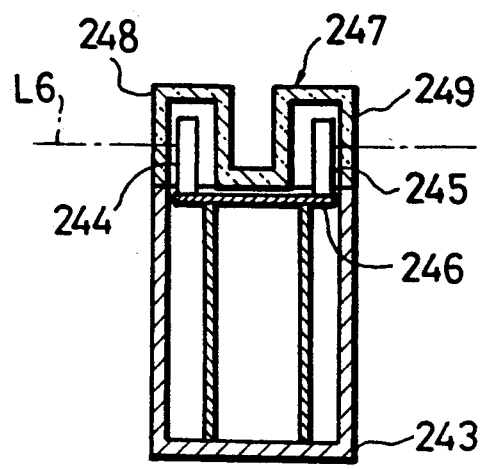
FIG. 57 is a sectional view taken along line A—A in FIG. 56.
Figure 58:
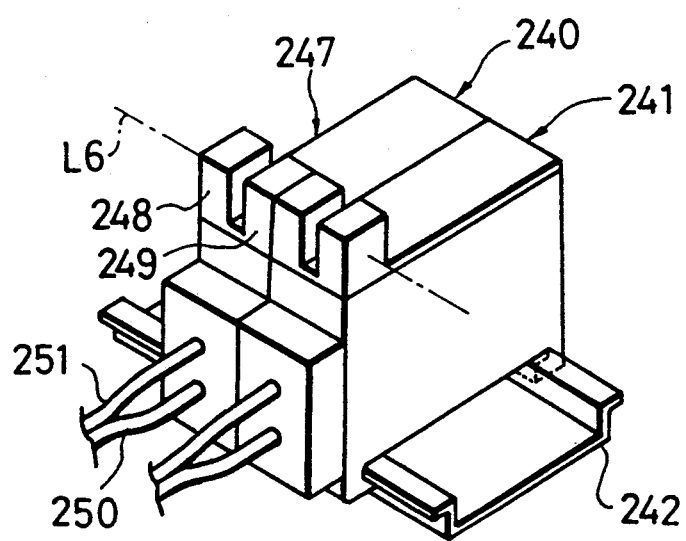
FIG. 58 is a perspective view showing a state that the photoelectric switches of FIG. 55 are arrayed on a rail.

FIG. 55 is a perspective view showing a photoelectric switch employed in a fifth embodiment of the photoelectric detector according to the sixth technical means, FIG. 56 is a side view of the photoelectric switch of FIG. 55, FIG. 57 is a sectional view taken along line A—A in FIG. 56, and FIG. 58 is a perspective view showing a state that the photoelectric switches of FIG. 55 are arrayed on a rail.

The photoelectric detector of this fifth embodiment comprises, as shown in FIG. 58, a photoelectric switch 240 and a photoelectric switch 241 at next stage which are arrayed close-contactly to each other on a rail 242. By way of example, the photoelectric switch 240 includes, as basic components, the light emitting unit 22, the light receiving unit 23, the gate circuit 24, the integrator 25, the decision circuit 26, the transmission light receiving unit 152, the pulse generator 153 as signal generating means, and the transmission light emitting unit 154, similarly to the above-mentioned first embodiment shown in FIG. 25. The transmission light receiving unit 152 employed in this embodiment comprises, as shown in FIG. 55, a transmission light receiving element 244 of laterally directed type projecting upwardly of the case 243 and receiving the cyclic light pulse signal S1. Likewise, the transmission light emitting unit 153 comprises a transmission light transmitting element 245 of laterally directed type projecting upwardly of the case 243 and transmitting the light pulse signal S2. The light receiving element 244 and the light emitting element 245 are each mounted on a circuit board 246 housed in the case 243, and arranged to align on one straight line L6 parallel to the direction in which the photoelectric switches 240, 241 are arrayed, and to face in opposite directions away from each other. The light receiving axis of the light receiving element 244 and the light emitting axis of the light emitting element 245 are set to coincide with the straight line L6. A light-transparent upper plate 247 is provided at a top of the case 243 and has projections 248, 249 in which the light receiving element 244 and the light emitting element 245 are respectively housed. On the other hand, the light emitting unit 22 comprises a detection light emitting element (not shown) housed in the case 243, an optical fiber 250 connected to the light emitting element, and a detection head (not shown) provided at a fore end of the optical fiber 250. The light receiving unit 23 comprises a detection light receiving element (not shown) housed in the case 243, another optical fiber 251 connected to the light receiving element, and the above detection head provided at a fore end of the optical fiber 251. Note that the other photoelectric switch 241 is of the same construction.

In this fifth embodiment, too, when the cyclic light pulse signal S1 is transmitted from the left in FIG. 57 via the optical axis along the straight line L6, the photoelectric switch 240 receives the light pulse signal S1 in the transmission light receiving element 244 through the projection 248 on the upper plate 247, then determines the presence or absence of an object through the same procedure as that in the above first embodiment. Then, in synchronism with the synch timing signal or the delay timing signal, the transmission light emitting element 245 emits the light pulse signal S2 for transmitting it to the right in FIG. 57 along the straight line L6 through the projection 249 on the upper plate 247, i.e., sending it to the photoelectric switch 241 at next stage. Subsequently, the photoelectric switch 241 at next stage also determines the presence or absence of an object in response to the light pulse signal S2 through the process like above.

With the fifth embodiment thus arranged, too, there can be obtained the advantage similar to that in the above first embodiment. In addition, since the light pulse signal is transmitted through the upper plate 247 in this embodiment without the need of transmitting it through the side faces of the case 243, neither openings nor windows for passing light therethrough are required to be provided in the side faces of the case 243. This enables the case 243 to be easily manufactured at the lowered production cost and with improved sealing ability, because the case 243 must satisfy more versatile characteristics than the upper plate 247.

Figure 59:
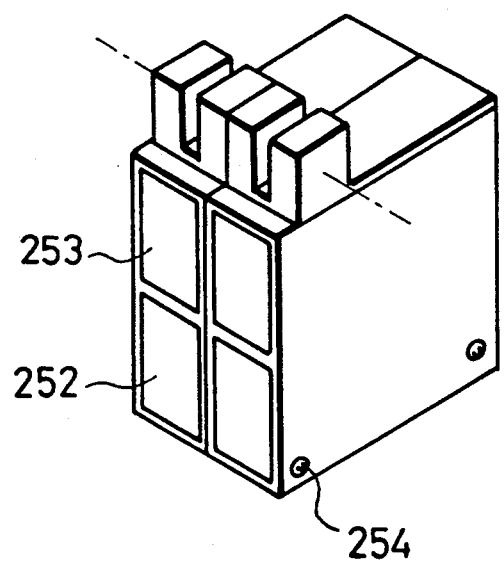
FIG. 59 is a perspective view showing a photoelectric detector equipped with lens type photoelectric switches corresponding to the optical fiber type photoelectric switches of FIG. 58.
Figure 60:
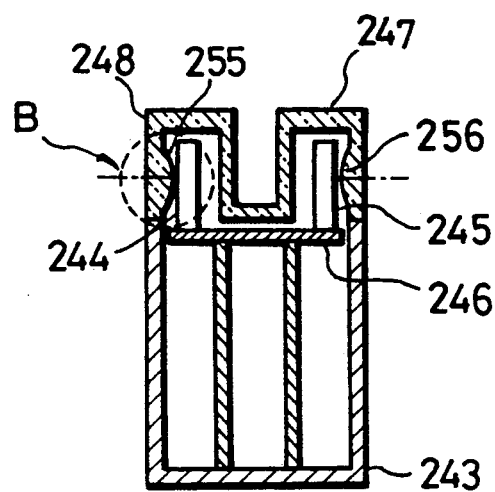
FIG. 60 is a sectional view showing a photoelectric switch provided with lens-like projections on an upper plate, as an application example of the fifth embodiment.
Figure 61:
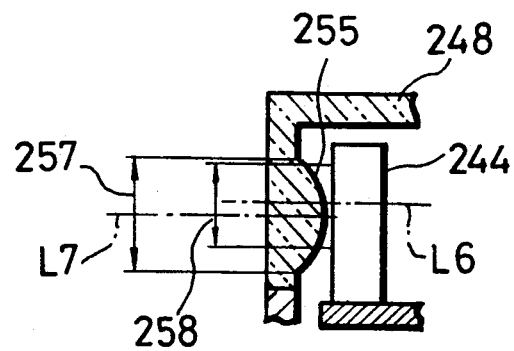
FIG. 61 is an enlarged sectional view showing a B portion in FIG. 60.

It should be understood that while this fifth embodiment illustrates the photoelectric detector comprising the two photoelectric switches 240, 241, the present invention is not limited thereto and, in the case where photoelectric detectors each comprising three or more photoelectric switches are concentratedly installed in one place, those photoelectric switches can be operated successively. In addition, while this embodiment illustrates the case of concentratedly installing the optical fiber type photoelectric switches having the optical fibers 250, 251, the present invention is not limited thereto and, also in the case where a plurality of lens type photoelectric switches having lenses 252, 253 as shown in FIG. 59 are concentratedly installed in one place, those photoelectric switches can be operated successively in a like manner. Moreover, the photoelectric switches 240, 241 may be coupled to each other by screws 254 rather than being mounted on the rail 242. Where the upper plate 247 is integrally molded with lens-like projections 255, 256 respectively projecting inwardly of the projections 248, 249 as shown in FIG. 60, it is possible to increase light transmission efficiency of the light pulse signal. The lens-like projection 255 is set such that, as shown in FIG. 61, the straight line L6 passes through a lens portion indicated by arrow 257 and the lens principal axis L7 passes through a light emission area indicated by arrow 258, with the straight line L6 (i.e., the light receiving axis of the light receiving element 244) and the lens principal axis L7 being substantially parallel to each other. The other lens-like projection 256 is also arranged in a like manner.

Figure 62:
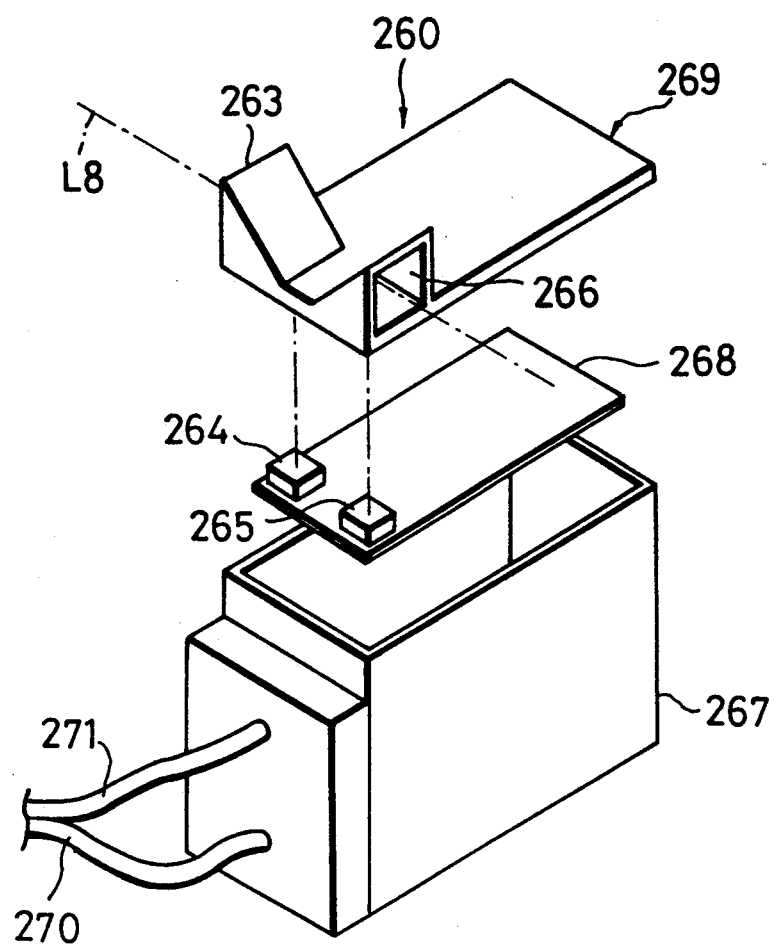
FIG. 62 is a perspective view showing a photosensitive switch employed in a sixth embodiment of the fourth technical means.
Figure 63:
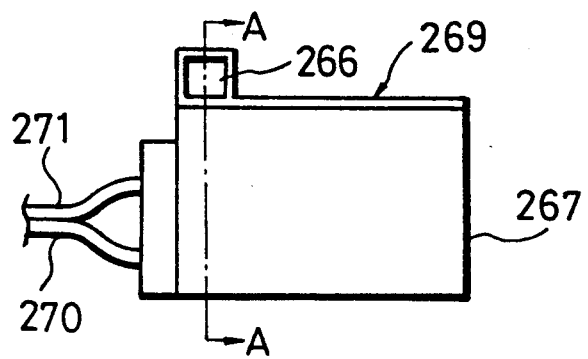
FIG. 63 is a side view of the photoelectric switch of FIG. 62.
Figure 64:
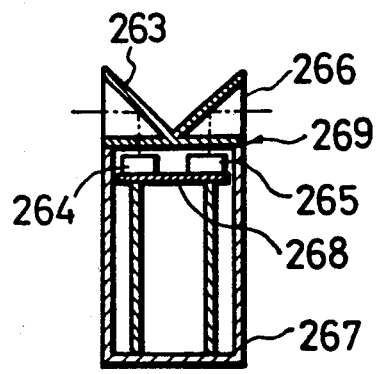
FIG. 64 is a sectional view taken along line A—A in FIG. 63.
Figure 65:
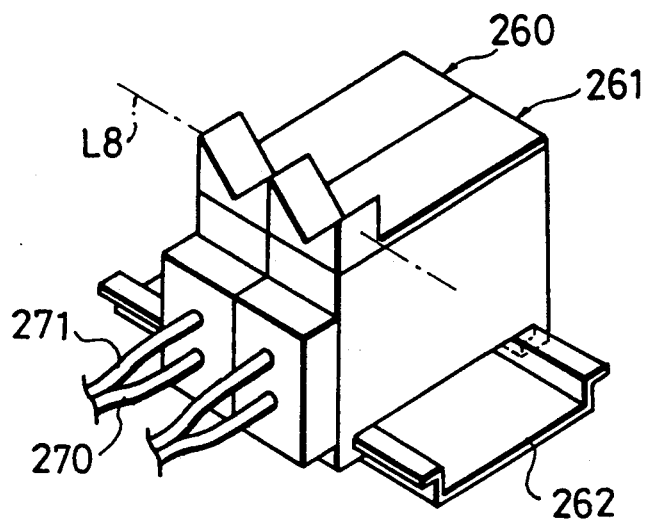
FIG. 65 is a perspective view showing a state that the photoelectric switches of FIG. 62 are arrayed on a rail.

Next, FIG. 62 is a perspective view showing a first embodiment of seventh technical means of the present invention, FIG. 63 is a side view of a photoelectric switch of FIG. 62, FIG. 64 is a sectional view taken along line A—A in FIG. 63, and FIG. 65 is a perspective view showing a state that the photoelectric switches of FIG. 62 are arrayed on a rail.

The photoelectric detector of this embodiment comprises, as shown in FIG. 65, a photoelectric switch 260 and a photoelectric switch 261 at next stage which are arrayed close-contactly to each other on a rail 262. By way of example, the photoelectric switch 260 includes, as basic components, the light emitting unit 22, the light receiving unit 23, the gate circuit 24, the integrator 25, the decision circuit 26, the transmission light receiving unit 152, the pulse generator 153 as signal generating means, and the transmission light emitting unit 154, similarly to the first embodiment of the above-mentioned sixth technical means shown in FIG. 25. The transmission light receiving unit 152 employed in this embodiment comprises, as shown in FIG. 62, a reception light refractor 263 for refracting an optical path of the cyclic light pulse signal S1, and a transmission light receiving element 264 disposed just below the light refractor 263 for receiving the cyclic light pulse signal S1 refracted by the light refractor 263. Likewise, the transmission light emitting unit 153 comprises a transmission light transmitting element 265 for transmitting the light pulse signal S2 and a transmission light refractor 266 disposed just above the light emitting element 265 for refracting an optical path of the light pulse signal S2, emitted from the transmission light emitting element 265, to lead the light pulse signal S2 to the photoelectric switch 261 at next stage. The light receiving element 264 and the light emitting element 265 are each mounted on a circuit board 268 housed in a case 267, and the light receiving axis of the light receiving element 264 is set to be vertically, i.e., in a direction orthogonal to one straight line L8 parallel to the direction in which the photoelectric switches 260, 261 are arrayed. Similarly, the light emitting axis of the light emitting element 265 is also set to be vertically. The reception light refractor 263 and the transmission light refractor 266 are each mounted on a light-transparent upper plate 269 in turn attached to a top of the case 267. The light refractor 263 comprises a mirror plate which is arranged to lie on the straight line L8 and inclined by an angle of 45 degrees clockwise in FIG. 65 with respect to the upper plate 268, so that the light pulse signal S1 coming from the left in FIG. 64 along the straight line L8 is refracted downwardly. Likewise, the light refractor 266 comprises a mirror plate which is arranged to lie on the straight line L8 and inclined by an angle of 45 degrees counterclockwise in FIG. 64 with respect to the upper plate 268, so that the light pulse signal S2 coming from below is refracted to the right in FIG. 64. On the other hand, the light emitting unit 22 comprises a detection light emitting element (not shown) housed in the case 267, an optical fiber 270 connected to the light emitting element, and a detection head (not shown) provided at a fore end of the optical fiber 270. The light receiving unit 23 comprises a detection light receiving element (not shown) housed in the case 267, another optical fiber 271 connected to the light receiving element, and the above detection head provided at a fore end of the optical fiber 271. Note that the other photoelectric switch 261 is of the same construction.

In this embodiment, too, when the cyclic light pulse signal S1 is transmitted to the photoelectric switch 260 via the optical axis along the straight line L8, the photoelectric switch 260 receives the light pulse signal S1 in the transmission light receiving element 264 after refracting the optical path of S1 downwardly by the light refractor 263, followed by determining the presence or absence of an object through the same procedure as that in the first embodiment of the above-mentioned sixth technical means. Then, in synchronism with the synch timing signal or the delay timing signal, the transmission light emitting element 265 emits the light pulse signal S2 upwardly so that the light pulse signal S2 is refracted to the right in FIG. 64 by the transmission light refractor 266 and transmitted to the photoelectric switch 261 at next stage. Subsequently, the photoelectric switch 261 at next stage also determines the presence or absence of an object in response to the light pulse signal S2 through the process like above.

With the first embodiment thus arranged, there can be obtained advantages similar to that in the first embodiment of the above-mentioned sixth technical means. In addition, since the light pulse signal is transmitted through the upper plate 269 in this embodiment without the need of transmitting it through the side faces of the case 267, neither openings nor windows for passing light there-through are required to be provided in the side faces of the case 267. This enables the case 267 to be easily manufactured at the lowered production cost and with the improved sealing ability, because the case 267 must satisfy more versatile characteristics than the upper plate 269.

Figure 66:
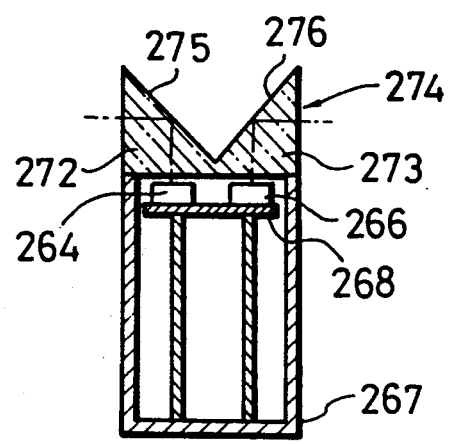
FIG. 66 is a sectional view showing a photoelectric switch provided with a prism body on an upper plate, as an application example of the sixth embodiment.
Figure 67:
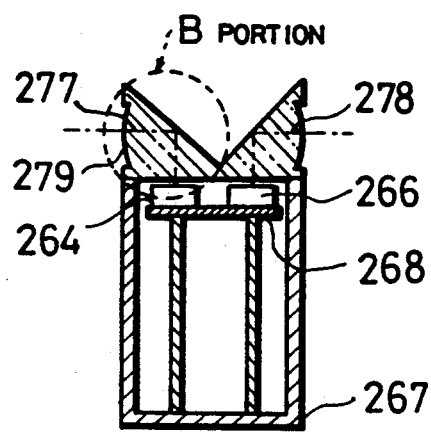
FIG. 67 is a sectional view showing a photoelectric switch provided with a prism body having lens-like projections, as an application example of the sixth embodiment.
Figure 68:
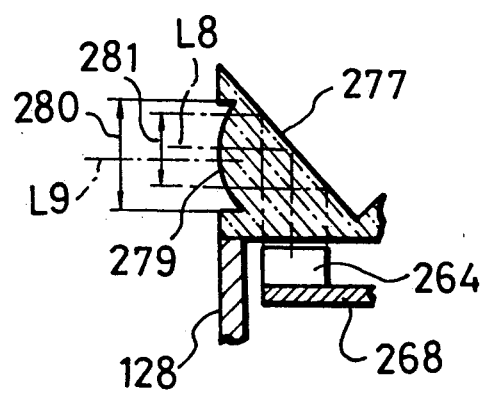
FIG. 68 is an enlarged sectional view showing a B portion in FIG. 67.
Figure 69:
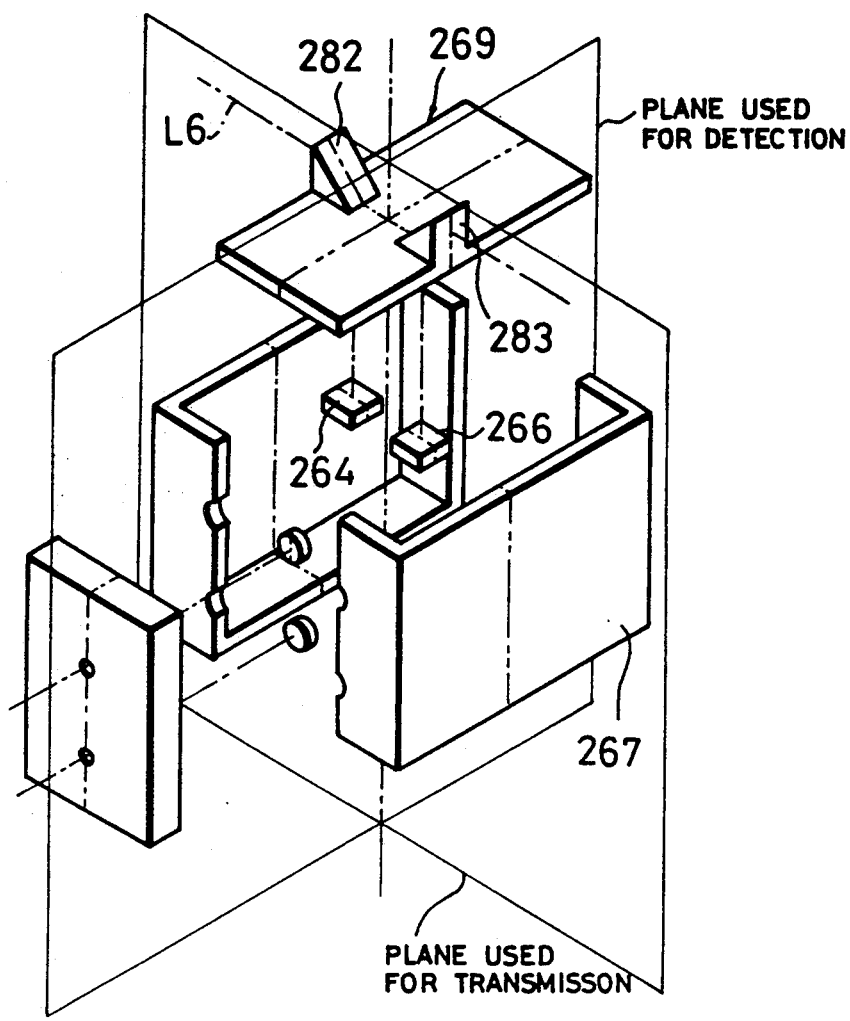
FIG. 69 is a perspective view showing a photoelectric switch provided with light refractors midway long sides of the upper plate, as an application example of the sixth embodiment.
Figure 70:
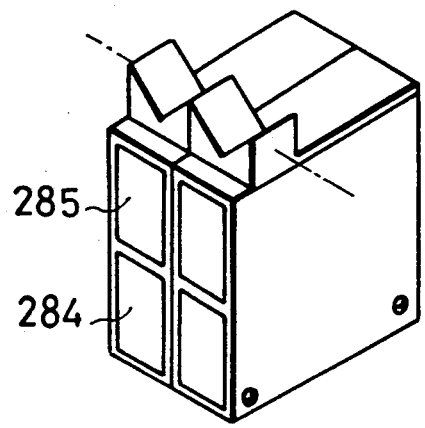
FIG. 70 is a perspective view showing a photoelectric detector equipped with lens type photoelectric switches corresponding to the optical fiber type photoelectric switches of FIG. 65.
Figure 71:
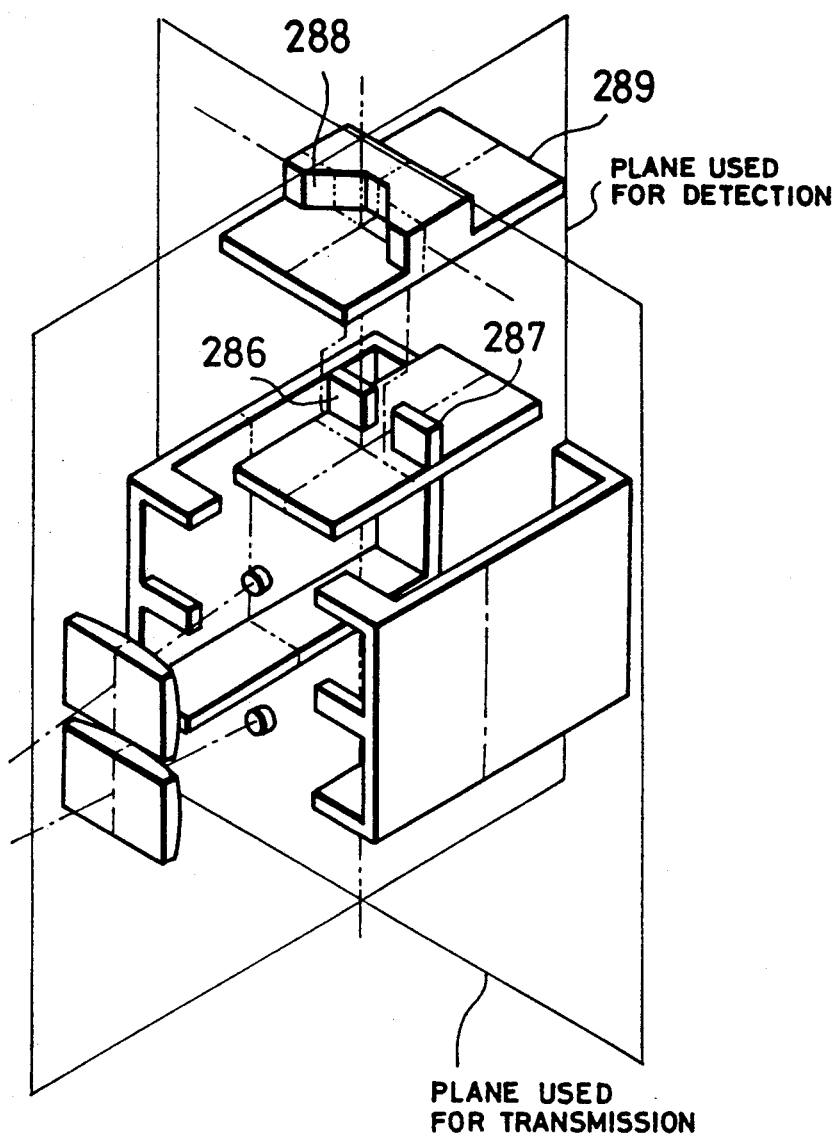
FIG. 71 is a perspective view showing a photoelectric detector equipped with a lens type photoelectric switch corresponding to the optical fiber type photoelectric switch of FIG. 69.

It should be understood that while this embodiment illustrates the photoelectric detector comprising the two photoelectric switches 260, 261, the present invention is not limited thereto and, in the case where photoelectric detector each comprising three or more photoelectric switches are concentratedly installed in one place, those photoelectric switches can be operated successively. In addition, while this embodiment includes the light refractors 263, 266 each comprising a mirror plate, it may be modified into such an arrangement as shown in FIG. 66. Specifically, prism bodies 272, 273 are integrally molded with the upper plate 274 so that a total reflecting surface 275 of one prism body 272 refracts the optical path of the light pulse signal S1 downwardly from the direction of the straight line L8, and a total reflecting surface 276 of the other prism body 273 refracts the optical path of the light pulse signal S2 to the right in FIG. 66 from the vertical direction. With this case, the number of parts can be reduced and thus the production cost can be cut down. As an alternative, where lens-like projections are formed in the prism bodies 277, 278 as shown in FIG. 67, it is possible to increase light transmission efficiency of the light pulse signal. A lens-like projection 279 of the prism body 277 is set such that, as shown in FIG. 68, the straight line L8 passes through a lens portion indicated by arrow 280 and the lens principal axis L9 passes through a light emission area indicated by arrow 281, with the straight line L8 and the lens principal axis L9 being substantially parallel to each other. The other lens-like projection 278 is also arranged in a like manner. Furthermore, as shown in FIG. 69, light refractors 282, 283 may be provided midway respective long sides of the upper plate 269. While this embodiment illustrates the case of concentratedly installing the optical fiber type photoelectric switches having the optical fibers 270, 271, the present invention is not limited thereto and, also in the case where a plurality of lens type photoelectric switches having lenses 284, 285 as shown in FIG. 70 are concentratedly installed in one place, those photoelectric switches can be operated successively in a like manner. Moreover, as shown in FIG. 71, light refractors 288, 289 may be respectively arranged laterally of the light receiving element 286 and the light emitting element 287.

Figure 72:
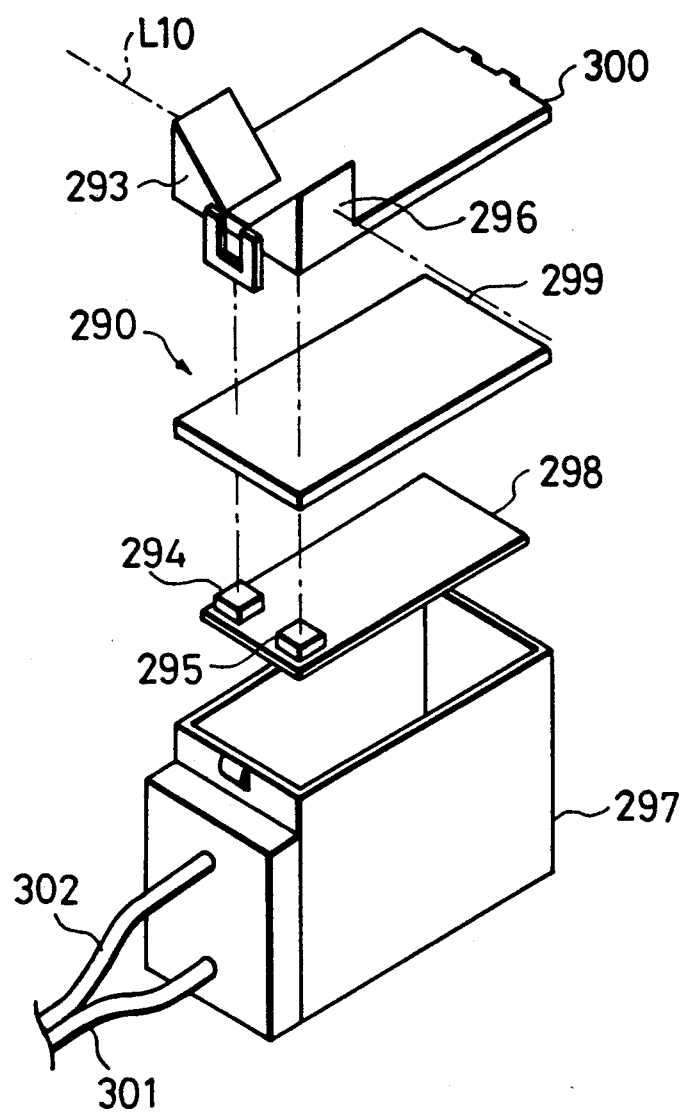
FIG. 72 is a perspective view showing a photosensitive switch employed in a seventh embodiment of the fourth technical means.
Figure 73:
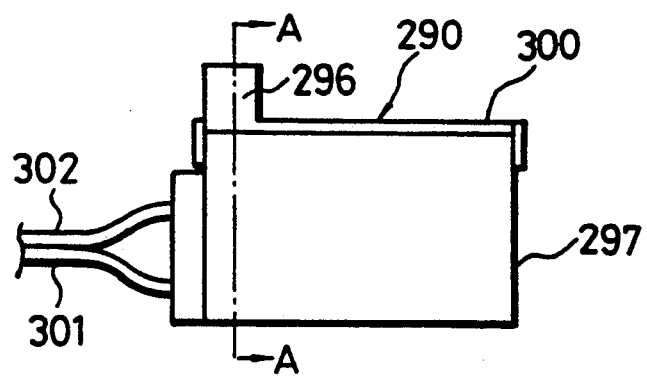
FIG. 73 is a side view of the photoelectric switch of FIG. 72.
Figure 74:
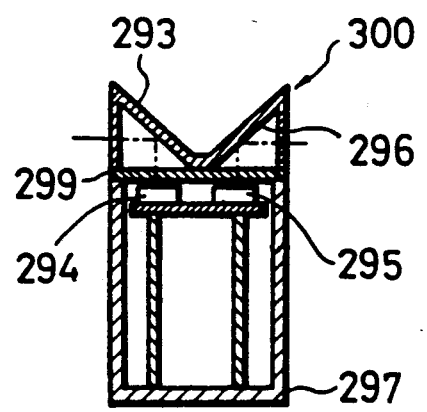
FIG. 74 is a sectional view taken along line A—A in FIG. 73.
Figure 75:
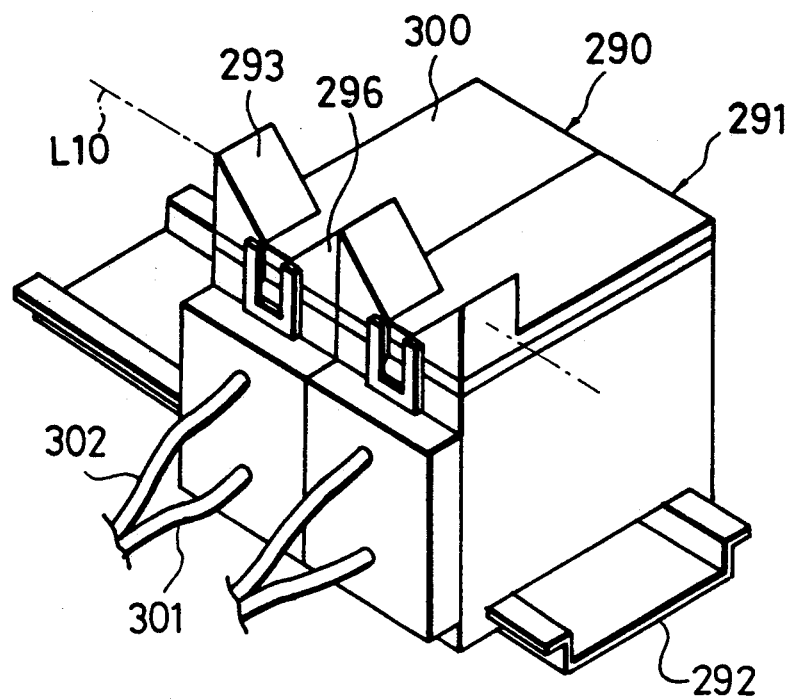
FIG. 75 is a perspective view showing a state that the photoelectric switches of FIG. 72 are arrayed on a rail.

FIG. 72 is a perspective view showing a photoelectric switch employed in a second embodiment of the seventh technical means, FIG. 73 is a side view of a photoelectric switch of FIG. 72, FIG. 74 is a sectional view taken along line A—A in FIG. 73, and FIG. 75 is a perspective view showing a state that the photoelectric switches of FIG. 72 are arrayed on a rail.

The photoelectric detector of this second embodiment comprises, as shown in FIG. 75, a photoelectric switch 290 and a photoelectric switch 291 at next stage which are arrayed close-contactly to each other on a rail 292. By way of example, the photoelectric switch 290 includes, as basic components, the light emitting unit 22, the light receiving unit 23, the gate circuit 24, the integrator 25, the decision circuit 26, the transmission light receiving unit 152, the pulse generator 153 as signal generating means, and the transmission light emitting unit 154, similarly to the first embodiment of the above-mentioned sixth technical means shown in FIG. 25. The transmission light receiving unit 152 employed in this embodiment comprises, as shown in FIG. 72, a reception light refractor 293 for refracting an optical path of the cyclic light pulse signal S1, and a transmission light receiving element 294 disposed just below the light refractor 293 for receiving the light pulse signal S1 refracted by the light refractor 293. Likewise, the transmission light emitting unit 153 comprises a transmission light transmitting element 295 for transmitting the light pulse signal S2 and a transmission light refractor 296 disposed just above the light emitting element 295 for refracting an optical path of the light pulse signal S2, emitted from the transmission light emitting element 295, to lead the light pulse signal S2 to the photoelectric switch 291 at next stage. The light receiving element 294 and the light emitting element 295 are each mounted on a circuit board 298 housed in a case 297, and the light receiving axis of the light receiving element 294 is set to be vertically, i.e., in a direction orthogonal to one straight line L10 parallel to the direction in which the photoelectric switches 290, 291 are arrayed. Similarly, the light emitting axis of the light emitting element 295 is also set to be vertical. A light-transparent cap 300 is fitted to a top of the case 297 via a light-transparent upper plate 299, and the light refractors 293, 296 are molded integrally with the cap 300. The light refractor 293 comprises a mirror plate which is arranged to lie on the straight line L10 and inclined by an angle of 45 degrees clockwise in FIG. 74 with respect to the upper plate 299, so that the light pulse signal S1 coming from the left in FIG. 74 along the straight line L10 is refracted downwardly. Likewise, the light refractor 296 comprises a mirror plate which is arranged to lie on the straight line L10 and inclined by an angle of 45 degrees counterclockwise in FIG. 74 with respect to the upper plate 299, so that the light pulse signal S2 coming from below is refracted to the right in FIG. 74. On the other hand, the light emitting unit 22 comprises a detection light emitting element (not shown) housed in the case 297, an optical fiber 301 connected to the light emitting element, and a detection head (not shown) provided at a fore end of the optical fiber 301. The light receiving unit 23 comprises a detection light receiving element (not shown) housed in the case 297, another optical fiber 302 connected to the light receiving element, and the above detection head provided at a fore end of the optical fiber 302. Note that the other photoelectric switch 291 is of the same construction.

In this second embodiment, too, when the cyclic light pulse signal S1 is transmitted to the photoelectric switch 290 via the optical axis along the straight line L10, the photoelectric switch 290 receives the light pulse signal S1 in the transmission light receiving element 294 after refracting the optical path of S1 downwardly by the light refractor 293, followed by determining the presence or absence of an object through the same procedure as that in the first embodiment of the above-mentioned sixth technical means. Then, in synchronism with the synch timing signal or the delay timing signal, the transmission light emitting element 295 emits the light pulse signal S2 upwardly so that the light pulse signal S2 is refracted to the right in FIG. 74 by the transmission light refractor 296 and transmitted to the photoelectric switch 291 at next stage. Subsequently, the photoelectric switch 291 at next stage also determines the presence or absence of an object in response to the light pulse signal S2 through the process like above.

With the embodiment thus arranged, too, there can be obtained the advantage similar to that in the above embodiment. In addition, since the light pulse signal is transmitted through the upper plate 299 in this embodiment without the need of transmitting it through the side faces of the case 297, neither openings nor windows for passing light therethrough are required to be provided in the side faces of the case 297. This enables the case 297 to be easily manufactured at the lowered production cost and with improved sealing ability, because the case 297 must satisfy more versatile characteristics than the upper plate 299.

Figure 76:
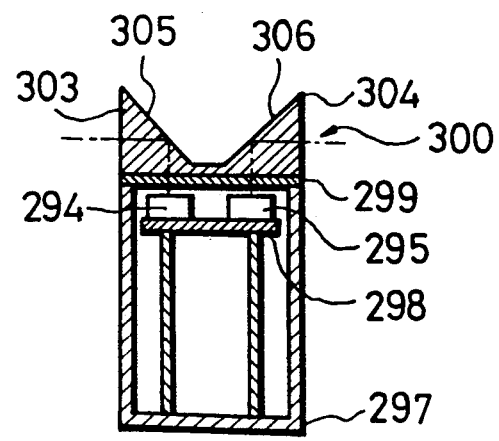
FIG. 76 is a sectional view showing a photoelectric switch provided with a prism body, as an application example of the seventh embodiment.
Figure 77:
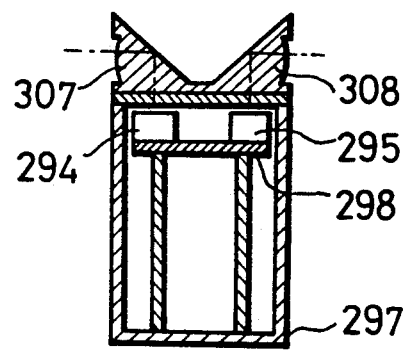
FIG. 77 is a sectional view showing a photoelectric switch provided with a prism body having lens-like projections, as an application example of the seventh embodiment.
Figure 78:
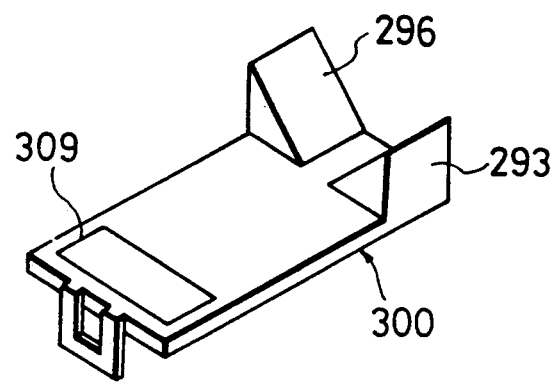
FIG. 78 is a perspective view showing a cap provided with a light shield portion, as an application example of the seventh embodiment.
Figure 79:
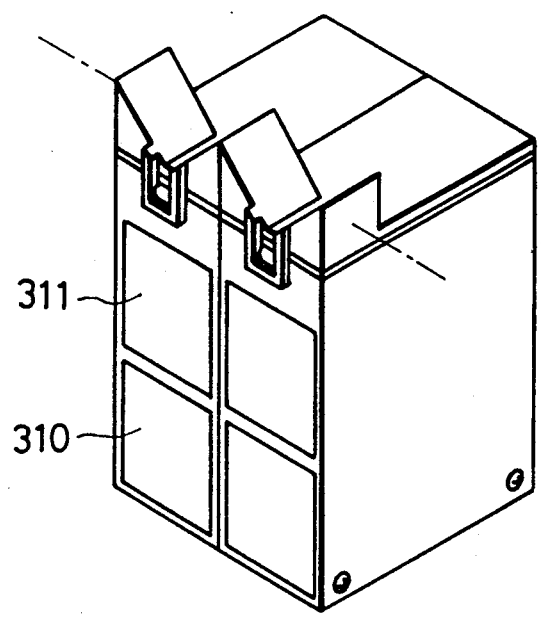
FIG. 79 is a perspective view showing a photoelectric detector equipped with lens type photoelectric switches corresponding to the optical fiber type photoelectric switches of FIG. 75.

It should be understood that while this embodiment illustrates the photoelectric detector comprising the two photoelectric switches 290, 291, the present invention is not limited thereto and, also in the case where photoelectric detectors each comprising three or more photoelectric switches are concentratedly installed in one place, those photoelectric switches can also be operated successively. Additionally, while this embodiment includes the light refractors 293, 296 each comprising a mirror plate, it may be modified into such an arrangement as shown in FIG. 76. Specifically, prism bodies 303, 304 are integrally molded with the cap 300 so that a total reflecting surface 305 of one prism body 303 refracts the optical path of the light pulse signal S1 downward, and a total reflecting surface 306 of the other prism body 304 refracts the optical path of the light pulse signal S2 to the right in FIG. 76. With this case, the number of parts can be reduced and thus the production cost can be cut down. As an alternative, where lens-like projections are formed in the prism bodies 307, 308 as shown in FIG. 77, it is possible to increase light transmission efficiency of the light pulse signal. Furthermore, as shown in FIG. 78, the cap may be provided with a light-shield portion 309. By rotating the cap 300 by an angle of 180 degrees in the horizontal plane and then refitting the cap 300, the light-shield portion 309 is positioned opposite to both the light receiving element 294 and the light emitting element 295 so that the light receiving element 294 and the light emitting element 295 can be prevented from receiving and emitting light, respectively, to thereby prevent leak of the emission light. While this second embodiment illustrates the case of the optical fiber type photoelectric switches having the optical fibers 301, 302, the present invention is not limited thereto and, also in the case where a plurality of lens type photoelectric switches having lenses 310, 311 as shown in FIG. 79 are concentratedly installed in one place, those photoelectric switches can be operated successively in a like manner.

Next, eighth technical means of the present invention will be described with reference to FIGS. 80 to 85.

Figure 80:
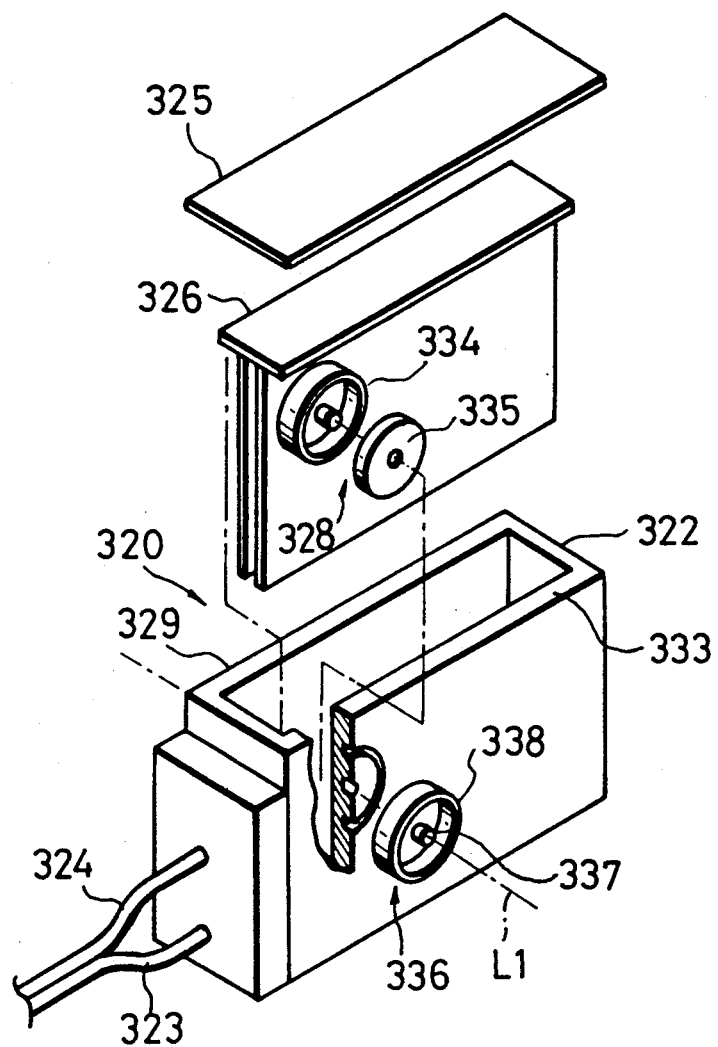
FIG. 80 is an exploded perspective view of a photoelectric switch employed in a first embodiment according to fifth technical means of the present invention.
Figure 81:
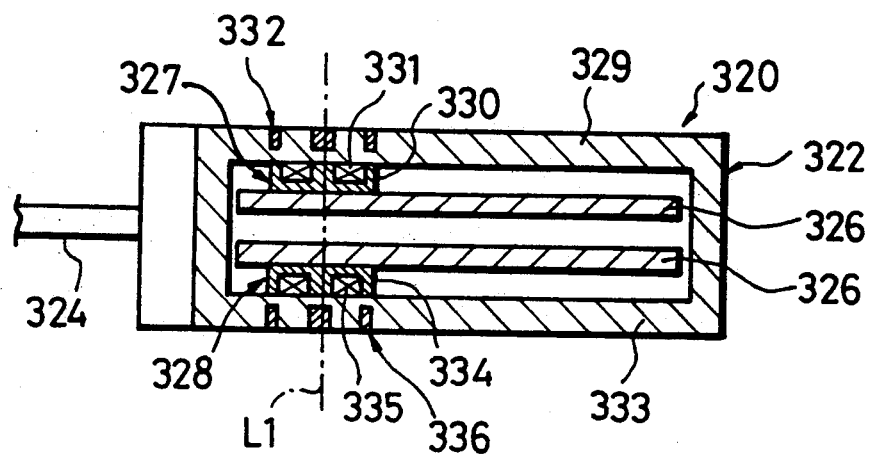
FIG. 81 is a horizontal sectional view of the photoelectric switch of FIG. 80.
Figure 82:
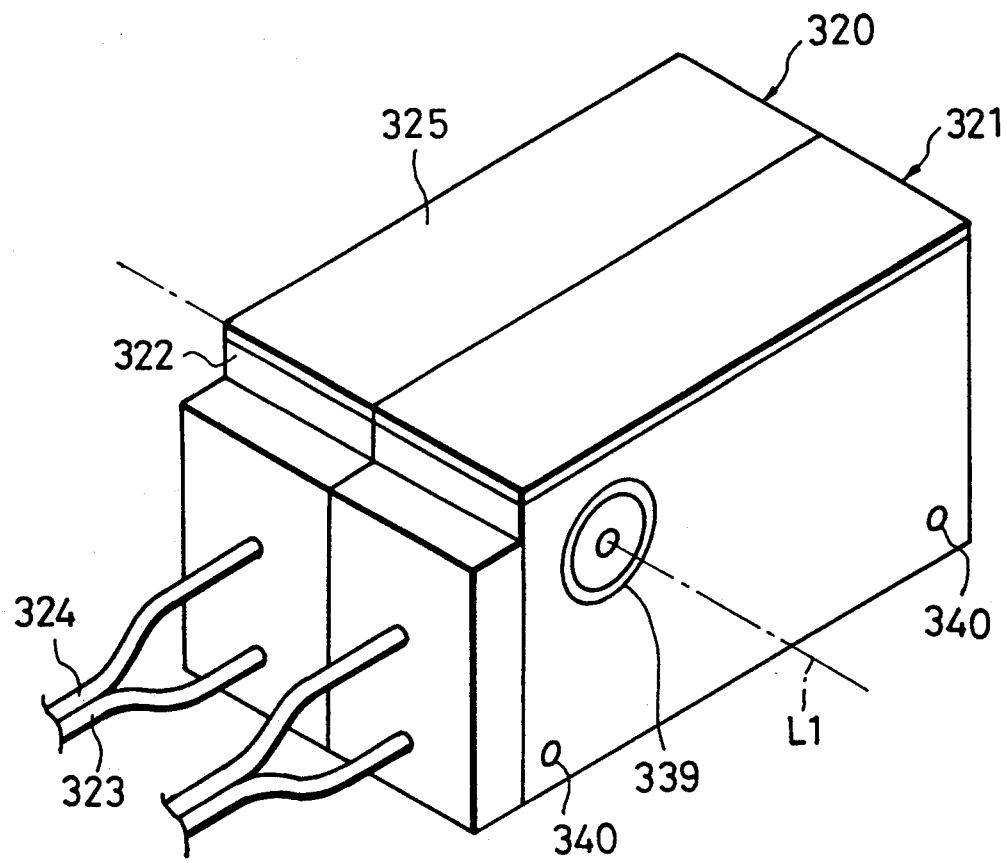
FIG. 82 is a perspective view showing an array state of a photoelectric detector using the photoelectric switches of FIG. 80.

FIG. 80 is an exploded perspective view showing a first embodiment of the eighth technical means of the present invention, FIG. 81 is a horizontal sectional view of a photoelectric switch of FIG. 80, and FIG. 82 is a perspective view showing an array state of a photoelectric detector of FIG. 80.

The photoelectric detector of this embodiment shown in FIG. 82 comprises a photoelectric switch 320 and a photoelectric switch 321 at next stage screwed to the photoelectric switch 320, which are arrayed close-contactly to each other. The photoelectric switch 320 comprises, as shown in FIG. 80, a case 322 which is in the form of a rectangular parallelepiped and has an opening, a pair of optical fibers 323, 324 respectively connected to a light emitting element and a light receiving element (both not shown) housed in the case 322, an upper plate 325 fitted to an upper end of the case 322, a circuit board 326 housed in the case 322 and having signal generating means (not shown) to generate a delay timing signal and output it to the light emitting element, reception means 327 (shown in FIG. 81) disposed on one side of the photoelectric switch 320 for receiving a pulse-like magnetic signal, and excitation means 328 disposed on the other side of the photoelectric switch 320 for externally outputting a pulse-like magnetic signal in synchronism with the delay timing signal.

The reception means 327 comprises a core 330 of magnetic material attached to one side face of the circuit board 326 and positioned inside one side wall 329 of the case 322, a reception coil 331 wound around the core 330, and an auxiliary core 332 molded integrally with the case 322 and having an end face substantially flush with the outer surface of the one side wall 329. Likewise, the excitation means 327 comprises a core 334 of magnetic material attached to the other side face of the circuit board 326 and positioned inside the other side wall 333 of the case 322, a transmission coil 335 wound around the core 334, and an auxiliary core 336 molded integrally with the case 322 and having an end face substantially flush with the outer surface of the other side wall 333. As shown in FIG. 80, the auxiliary core 336 comprises a cylindrical core 337 and a ring-shaped core 338 positioned to surround the cylindrical core 337. The other auxiliary core 332 is of the same construction. Note that the reception means 327, the excitation means 328 and the auxiliary cores 332, 336 are arranged to align on the same axis L1 parallel to the direction in which the photoelectric switches 320, 321 are arrayed.

The photoelectric switch 321 at next stage is of the same construction and, as shown in FIG. 82, has an auxiliary core 339 and other components arranged to align on the axis L1. Those photoelectric switches 320, 321 are coupled to each other by screws 340 in a closely-contact state.

In this first embodiment, when a pulse-like magnetic signal is transmitted to the photoelectric switch 320, the photoelectric switch 320 receives this magnetic signal in the reception means 327, outputs a delay timing signal delayed by a predetermined period of time from the magnetic signal out of the pulse generator, and intermittently emits a sensing light in response to the delay timing signal via the optical fiber 323 and the detection head. Subsequently, the light reflected from an object to be detected at this time is received via the detection head and the optical fiber 324 to determine the presence or absence of an object depending on whether the light pulse matching in timing with the sensing light is received or not. Then, in synchronism with the delay timing signal, the excitation means 328 outputs a magnetic signal which is received by reception means of the photoelectric switch 321 at next stage for determining the presence or absence of an object in response to the magnetic signal.

With this first embodiment thus arranged, a plurality of the photoelectric switches 320, 321 concentratedly installed in one place can be operated successively. In addition, the excitation means 328 of the photoelectric switch 320 has the auxiliary core 336 built in the side wall 333 of the case 322 and, likewise, the reception means of the photoelectric switch 321 at next stage has an auxiliary core built in a side wall of its case, the excitation means 328 of the photoelectric switch 320 and the reception means of the photoelectric switch 321 at next stage being arranged to align on the same axis L1 parallel to the direction in which the photoelectric switches 320, 321 are arrayed, whereby the auxiliary core of the excitation means 328 and the auxiliary core of the reception means are precisely opposite to each other in a very close relation. Therefore, magnetic coupling between the transmission coil 335 of the photoelectric switch 320 and a reception coil of the photoelectric switch 321 is so intensified that most of the magnetic flux generated by the transmission coil 335 is caused to pass through the reception coil. Consequently, the magnetic signal generated by the transmission coil 335 in response to the delay timing signal is efficiently taken in by the reception coil of the photoelectric switch 321 with the result of high transmission efficiency of the delay timing signal.

It should be understood that while this embodiment illustrates the case of the optical fiber type photoelectric switches having the optical fibers 323, 324, the present invention is not limited thereto and, also in the case where a plurality of lens type photoelectric switches are concentratedly installed in one place, those photoelectric switches can be operated successively in a like manner. Further, while this embodiment illustrates the photoelectric detector comprising the two photoelectric switches 320, 321, the present invention is not limited thereto and, also in the case where photoelectric detectors each comprising three or more photoelectric switches are concentratedly installed in one place, those photoelectric switches can be operated successively. In addition, while this embodiment includes the auxiliary cores 332, 336 respectively in the reception means 327 and the excitation means 329, an auxiliary core may be provided in only either one of both the means, if necessary.

Figure 83:
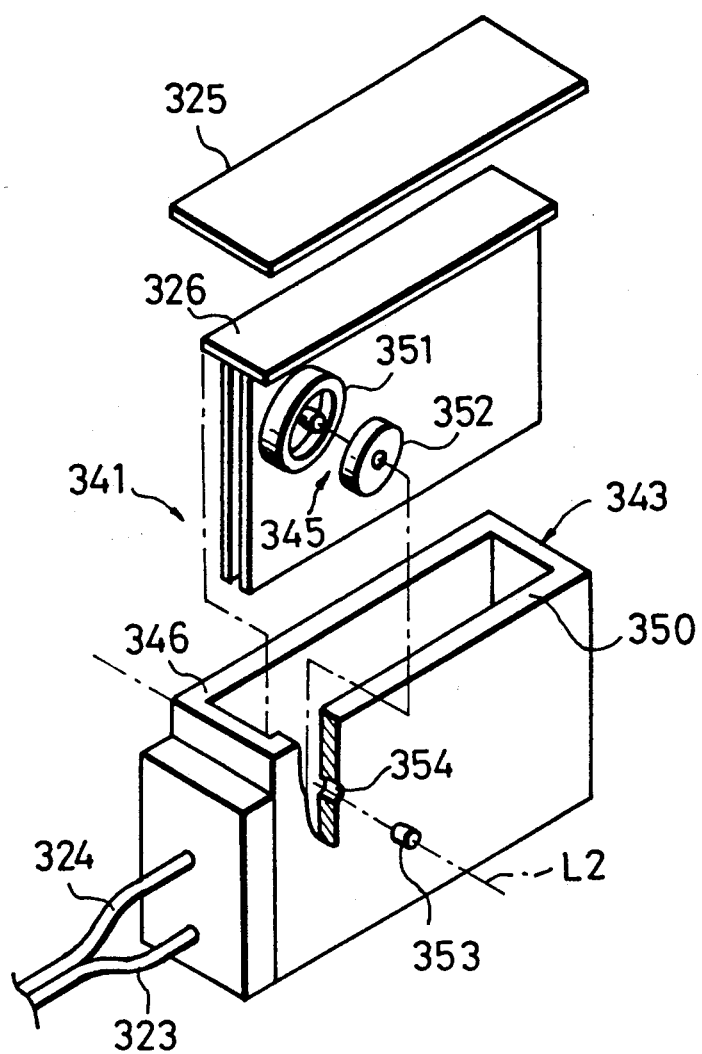
FIG. 83 is an exploded perspective view of a photoelectric switch employed in a second embodiment according to the fifth technical means.
Figure 84:
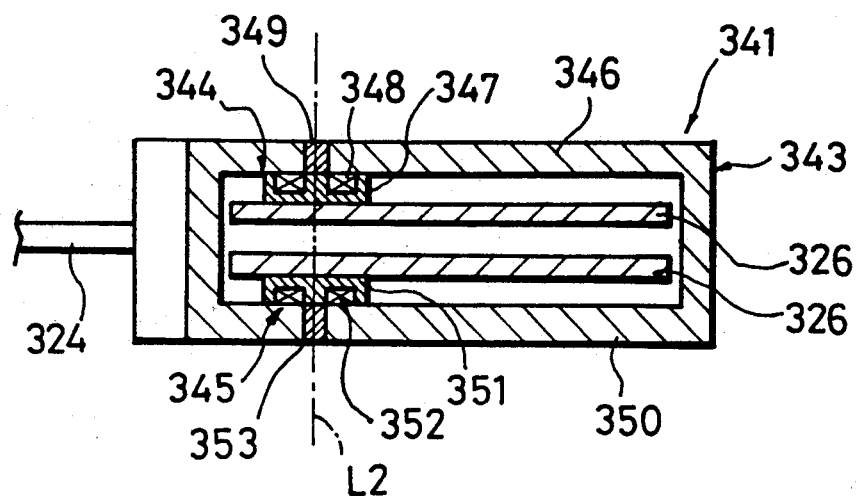
FIG. 84 is a horizontal sectional view of the photoelectric switch of FIG. 83.
Figure 85:
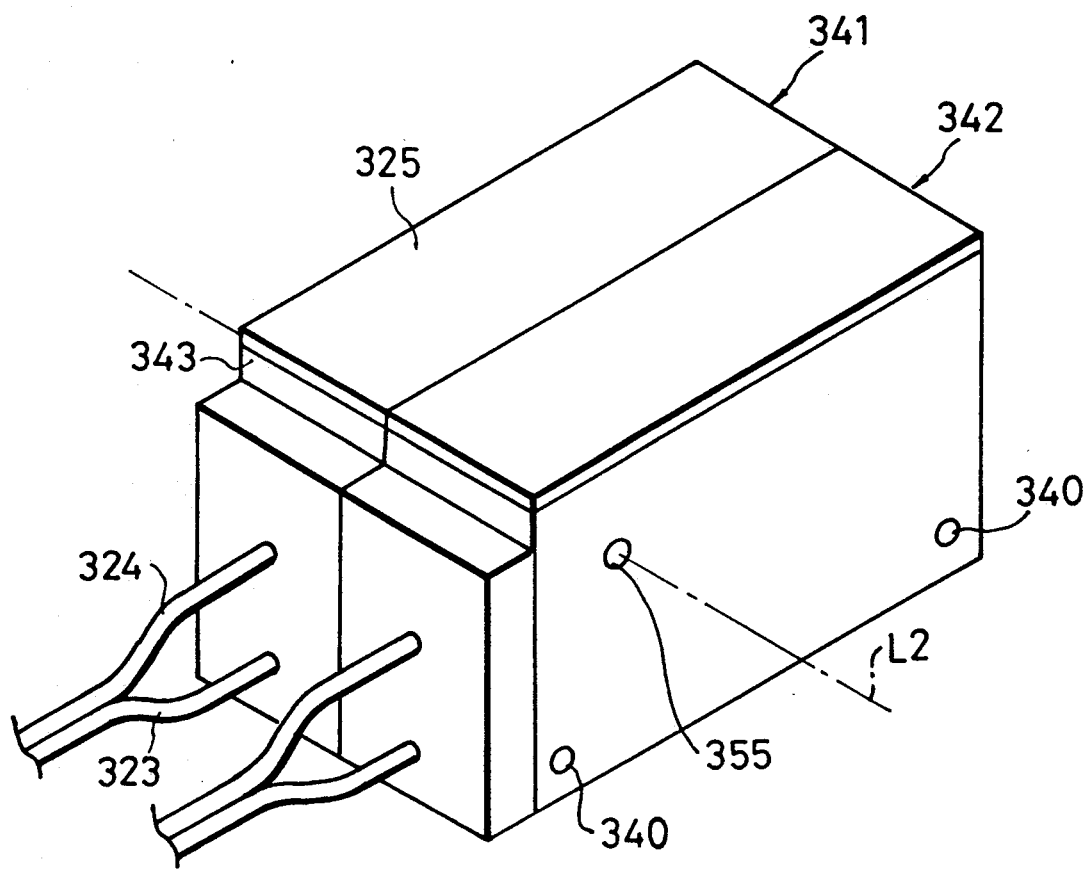
FIG. 85 is a perspective view showing an array state of a photoelectric detector using the photoelectric switches of FIG. 83.

FIG. 83 is an exploded perspective view of a photoelectric switch employed in a second embodiment of the photoelectric detector according to the eighth technical means, FIG. 84 is a horizontal sectional view of the photoelectric switch of FIG. 83, and FIG. 85 is a perspective view showing an array state of the photoelectric detector of FIG. 83. Note that the components in FIGS. 83 to 85 identical to those shown in FIGS. 80 to 82 are denoted by the same reference numerals.

The photoelectric detector of this embodiment shown in FIG. 85 comprises a photoelectric switch 341 and a photoelectric switch 342 at next stage screwed to the photoelectric switch 341, which are arrayed close-contactly to each other, as with the above first embodiment. The photoelectric switch 341 comprises a case 343 which is in the form of a rectangular parallelepiped and has an opening, reception means 344 (shown in FIG. 84) disposed on one side of the photoelectric switch 341 for receiving a pulse-like magnetic signal, and excitation means 345 disposed on the other side of the photoelectric switch 341 for externally outputting a pulse-like magnetic signal.

The reception means 344 comprises a core 347 of magnetic material attached to one side face of the circuit board 326 and positioned inside one side wall 346 of the case 343, a reception coil 348 wound around the core 347, and an auxiliary core 349 provided in the one side wall 346. Likewise, the excitation means 345 comprises a core 351 of magnetic material attached to the other side face of the circuit board 326 and positioned inside the other side wall 350 of the case 343, a transmission coil 352 wound around the core 351, and an auxiliary core 353 provided in the other side wall 350. As shown in FIG. 83, the auxiliary core 353 is press-fitted into a hole 354 penetrating through the side wall 350 and has an end face substantially flush with the outer surface of the side wall 350. The other auxiliary core 349 is of the same construction. Note that the reception means 344, the excitation means 345 and the auxiliary cores 349, 353 are arranged to align on the same axis L2 parallel to the direction in which the photoelectric switches 341, 342 are arrayed.

The photoelectric switch 342 at next stage is of the same construction and, as shown in FIG. 85, has an auxiliary core 355 and other components arranged to align on the axis L2. Those photoelectric switches 341, 342 are coupled to each other by the screws 340 in a closely-contact state.

In this second embodiment, too, when a pulse-like magnetic signal is transmitted to the photoelectric switch 341, the photoelectric switch 341 receives this magnetic signal in the reception means 344, outputs a delay timing signal delayed by a predetermined period of time from the magnetic signal out of the pulse generator, and intermittently emits a sensing light in response to the delay timing signal via the optical fiber 323 and the detection head. Subsequently, the light reflected from an object to be detected at this time is received via the detection head and the optical fiber 324 to determine the presence or absence of an object depending on whether the light pulse matching in timing with the sensing light is received or not. Then, in synchronism with the delay timing signal, the excitation means 345 outputs a magnetic signal which is received by reception means of the photoelectric switch 342 at next stage for determining the presence or absence of an object in response to the magnetic signal.

With this second embodiment thus arranged, there can be obtained the similar advantage to that in the above first embodiment. It should be understood that while this embodiment illustrates the case of the optical fiber type photoelectric switches having the optical fibers 323, 324, the present invention is not limited thereto and, also in the case where a plurality of lens type photoelectric switches are concentratedly installed in one place, those photoelectric switches can be operated successively in a like manner. Further, while this embodiment illustrates the photoelectric detector comprising the two photoelectric switches 341, 342, the present invention is not limited thereto and, also in the case where photoelectric detectors each comprising three or more photoelectric switches are concentratedly installed in one place, those photoelectric switches can be operated successively. In addition, while this embodiment includes the auxiliary cores 349, 353 respectively in the reception means 344 and the excitation means 345, an auxiliary core may be provided in only either one of both the means, if necessary.

Ninth technical means of the present invention will be next described with reference to FIGS. 86 to 94.

Figure 86:
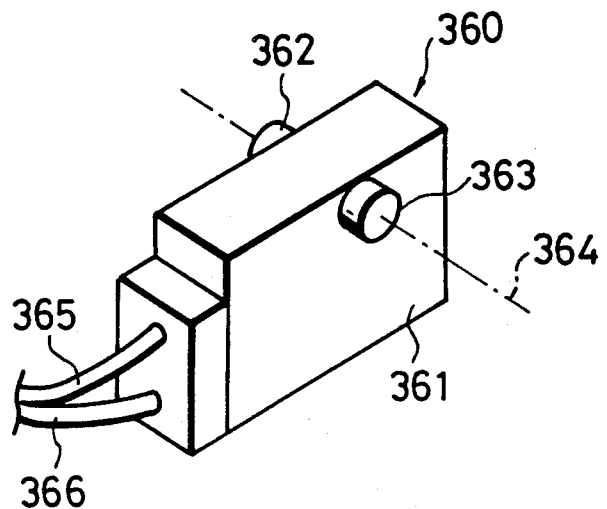
FIG. 86 is an appearance perspective view showing one embodiment of a photoelectric switch according to sixth technical means of the present invention.
Figure 87:
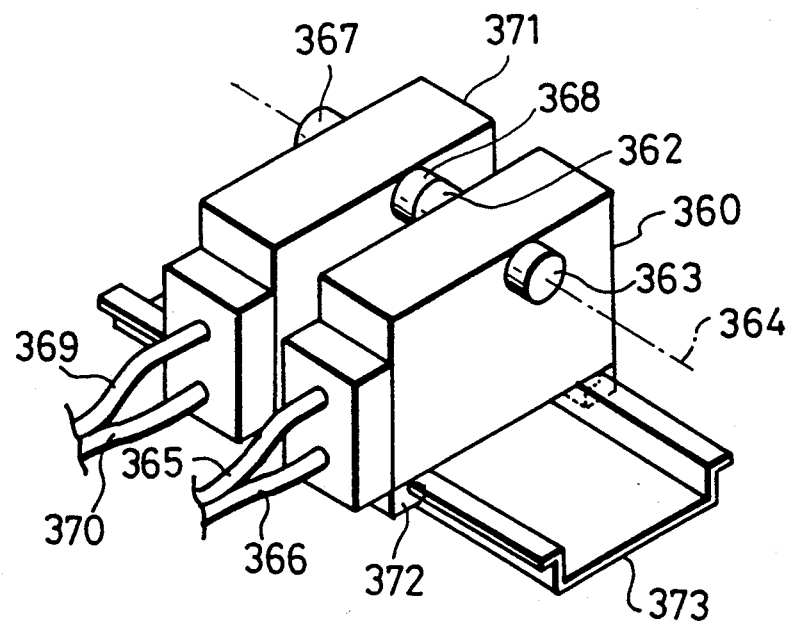
FIG. 87 is a perspective view showing an array state of the photoelectric switches shown in FIG. 86.

FIG. 86 is an appearance perspective view showing a first embodiment of a photoelectric switch according to the ninth technical means of the present invention, and FIG. 87 is a perspective view showing an array state of the photoelectric switches shown in FIG. 86. Note that the circuit arrangement employed in the photoelectric switch of this embodiment is the same as that shown in FIG. 5 relating to the first technical means and thus will not be described herein.

In FIG. 86, a photoelectric switch 360 comprises a case 361 in the form of a rectangular parallelepiped, a reception coil 362 attached to one of two opposite sides of the case 361, and a transmission coil 363 attached to the other side of the case 361. The reception coil 362 and the transmission coil 363 are arranged to align on an axis 364 penetrating through those two sides of the case 361. The photoelectric switch 360 also comprises an emission optical fiber 365 for leading a sensing light from an LED (not shown) in the photoelectric switch 360 to an object to be detected, and a reception optical fiber 366 for leading the reflected light from the object to a phototransistor (not shown) in the photoelectric switch 360.

FIG. 87 shows a state that the photoelectric switch 360 and another photoelectric switch 371, having the same construction as the photoelectric switch 360, i.e., comprising a reception coil 367, a transmission coil 368, an emission optical fiber 369 and a reception optical fiber 370, are fixedly arrayed on a rail 373 into line by the use of fitting members 372.

When the photoelectric switches 360, 371 are arranged in this way, the axis 364 shown in FIG. 86 is common to both the photoelectric switches 360, 371 and also parallel to the direction in which those photoelectric switches 360, 371 are arrayed, as will be seen from the drawing. Therefore, the reception coil 362 of the photoelectric switch 360 and the transmission coil 368 of the photoelectric switch 371 are precisely opposite to each other in a very close relation. Further, when the reception coils 362, 367 and the transmission coils 363, 368 are covered with a non-magnetic case. Both the cases of the transmission coil 368 and the reception coil 362 can be contacted with each other to align in a previsely opposite manner so that those coils 368, 362 are precisely opposite to each other in a very close relation.

Therefore, magnetic coupling between the transmission coil 368 and the reception coil 362 is so intensified that most of the magnetic flux generated by the transmission coil 368 is caused to pass through the reception coil 362. Consequently, the magnetic signal generated by the transmission coil 368 in response to the delay timing signal is efficiently taken in by the reception coil 362 with the result of high transmission efficiency of the delay timing signal.

Note that while this embodiment illustrates two photoelectric switches being fixedly arrayed into line, the above explanation equally applies to the case of using three or more photoelectric switches.

Figure 88:
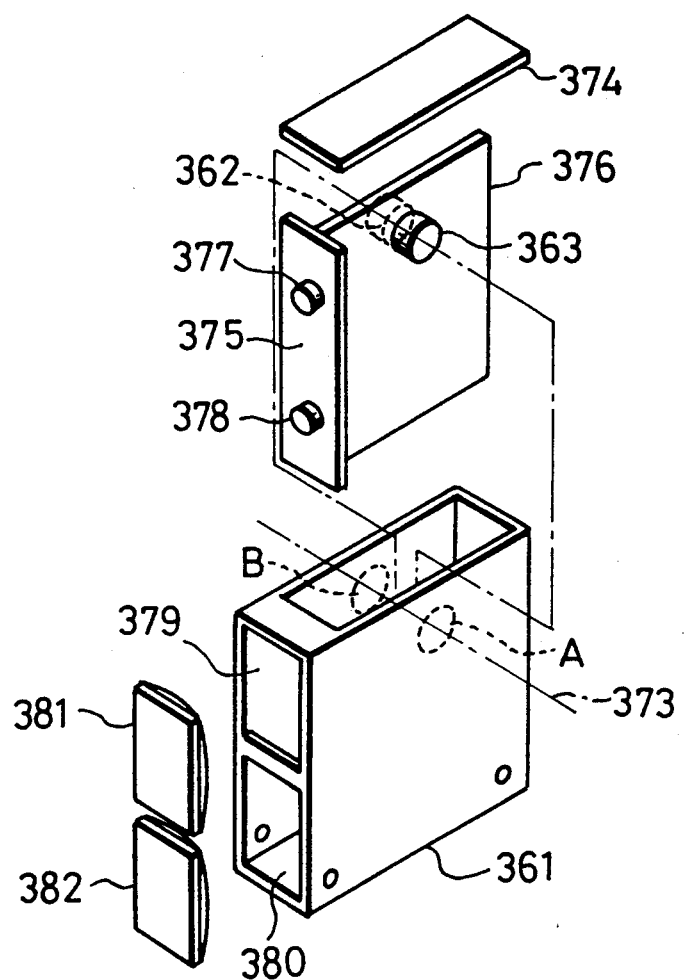
FIG. 88 is an exploded perspective view showing another embodiment of the photoelectric switch according to the sixth technical means of the present invention.

FIG. 88 is an exploded perspective view showing another embodiment of the photoelectric switch according to the ninth technical means. The photoelectric switch of this embodiment includes an upper plate 374, an element mount plate 375, a circuit board 376, an LED 377, a photodiode 378, fitting windows 379, 380, a light emitting lens 381, and a light receiving lens 382. Note that the components corresponding to those in FIG. 86 are denoted by the same reference numerals.

Figure 89:
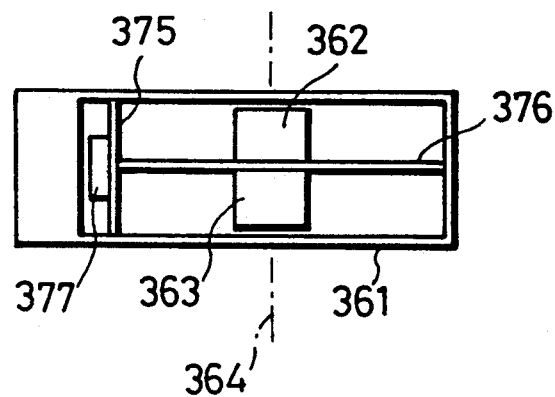
FIG. 89 is a view showing a state that respective members are housed in a case of FIG. 88.

In FIG. 88, the transmission coil 363 is attached to one side of the circuit board 376 and the reception coil 362 is attached to the other side of the circuit board 376. The circuit board 376 is combined together with an element mount plate 375, on which the LED 377 and the photodiode 378 are mounted, the resultant assembly being housed in the case 361 formed of non-magnetic material. Accordingly, as shown in FIG. 89, the transmission coil 363 and the reception coil 362 are arranged in respective spaces defined between the circuit board 376 and the inner surfaces of the case 361. The case 361 is seal by attaching the upper plate 374 to an opening at its top and fitting the light emitting lens 381 and the light receiving lens 382 into the fitting windows 379, 380 in both the sides thereof, respectively. A broken line A stands for the position of the transmission coil 363 and a broken line B stands for the position of the reception coil 362.

The axis 369 explained above in connection with FIGS. 86 and 87 penetrates through both the positions A and B. In this embodiment, therefore, the transmission coil 363 and the reception coil 362 both housed in the case 361 are arranged to align on the same axis 364.

Under the condition when the LED 377 and the photodiode 378 are housed in the case 361, the LED 377 and the photodiode 378 are positioned to face the light transmitting lens 381 and the light receiving lens 382, respectively, so that the sensing light emitted from the LED 377 is irradiated to an object (not shown) to be detected through the light emitting lens 381 and the reflected light from the object is received by the photodiode 378 through the light receiving lens 382.

Figure 90:
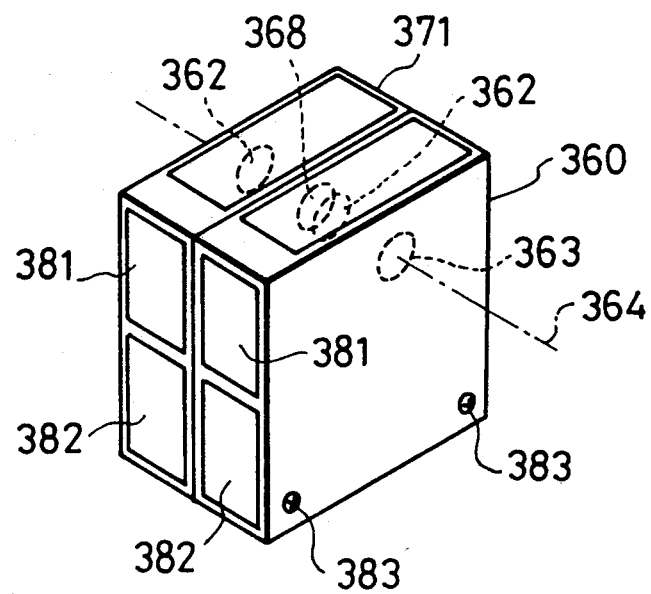
FIG. 90 is a perspective view showing an array state of the photoelectric switches shown in FIGS. 88 and 89.

FIG. 90 shows a state that the photoelectric switches 360, 371 thus constructed are fixedly arrayed into line by the use of screws 382 as fastening members. In this state, the opposite case faces of these photoelectric switches 360, 371 are fixedly contacted with each other. The transmission coils 363, 368 and the reception coils 362, 367 of those two photoelectric switches 360, 371 are arranged to align on the same axis 364 parallel to the direction in which the photoelectric switches 360, 371 are arrayed. Accordingly, the transmission coil 368 and the reception coil 362 are precisely opposite to each other in a very close relation, though with both the cases 361 of the photoelectric switches 360, 371 interposed therebetween, resulting in the similar advantage to that in the embodiment of FIG. 86.

Note that while this embodiment illustrates two photoelectric switches being fixedly arrayed into line, the above explanation equally applies to the case of using three or more photoelectric switches.

Additionally, the optical fibers 365, 366 may be used like the embodiment shown in FIG. 86 and, in the embodiment shown in FIG. 86, the light emitting lens 381 and the light receiving lens 382 may used as shown in FIG. 88.

Figure 91:
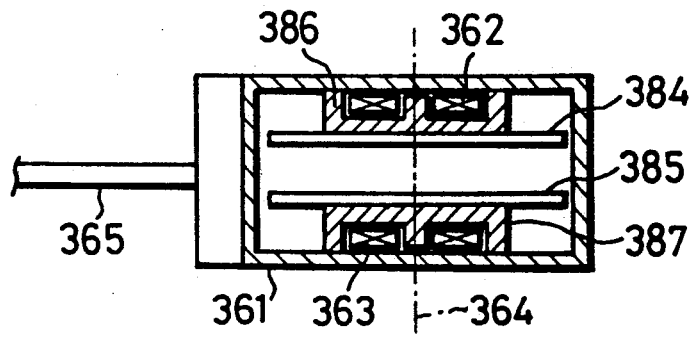
FIG. 91 is a sectional view showing still another embodiment of the photoelectric switch according to the sixth technical means of the present invention.

FIG. 91 is a sectional view showing still another embodiment of the photoelectric switch according to the ninth technical means. The photoelectric switch of this embodiment includes circuit boards 384, 385 and cores 386, 387. Note that the components corresponding to those in the foregoing drawings are denoted by the same reference numerals.

In FIG. 91, the reception coil 362 is wound around the core 386 formed of magnetic material, the core 386 being attached to a circuit board 384. Likewise, the transmission coil 363 is wound around the core 387 formed of magnetic material, the core 387 being attached to a circuit board 385.

Under the condition when these parts are housed in the case 361, the transmission and reception coils 363, 362 and the cores 386, 387 are arranged in respective spaces defined between the circuit boards 384, 385 and the inner surfaces of the case 361. These coils 362, 363 are arranged to align on the same axis 364 as with the above embodiment.

The photoelectric switch of this embodiment can also be fixedly arrayed plural in number into line similarly to FIG. 90. When fixedly arrayed like that, the core 384 and a core of a transmission coil of the adjacent photoelectric switch cooperatively make up a magnetic path of small magnetic resistance. Assuming the thickness of the case 361 to be the same, therefore, magnetic coupling between that transmission coil and the reception coil 362 can be greater than that obtainable with the embodiment shown in FIGS. 88 and 89. This results in further improved transmission efficiency of the synch timing signal.

Figure 92:
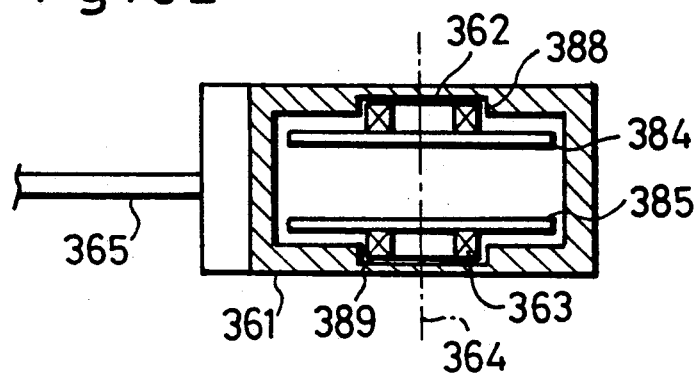
FIG. 92 is a sectional view showing still another embodiment of the photoelectric switch according to the sixth technical means of the present invention.

FIG. 92 shows still another embodiment of the photoelectric switch according to the ninth technical means. In this embodiment, recesses 388, 389 are provided in the inner surfaces of the case 361. The reception coil 362 attached to the circuit board 384 is fitted into the recess 388 and the transmission coil 363 attached to the circuit board 385 is fitted into the recess 389, respectively. With this arrangement, the transmission coil and the reception coil of adjacent photoelectric switches are closer to each other thereby improving transmission efficiency of the synch timing signal.

Figure 93:
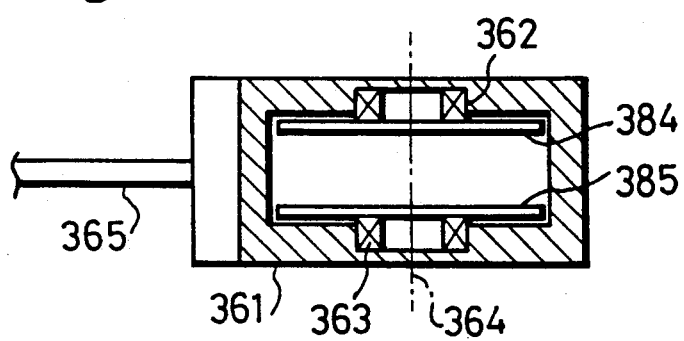
FIG. 93 is a sectional view showing still another embodiment of the photoelectric switch according to the sixth technical means of the present invention.

FIG. 93 shows still another embodiment of the photoelectric switch in which the reception coil 362 and the transmission coil 363 are built in the case 361 by insert molding such that one end faces of those coils 362, 363 are substantially flush with the inner surfaces of the case 361. With this embodiment, the transmission coil and the reception coil are positioned more closely to each other between the adjacent photoelectric switches than the embodiment shown in FIG. 92, thereby further improving transmission efficiency of the synch timing signal.

Figure 94:
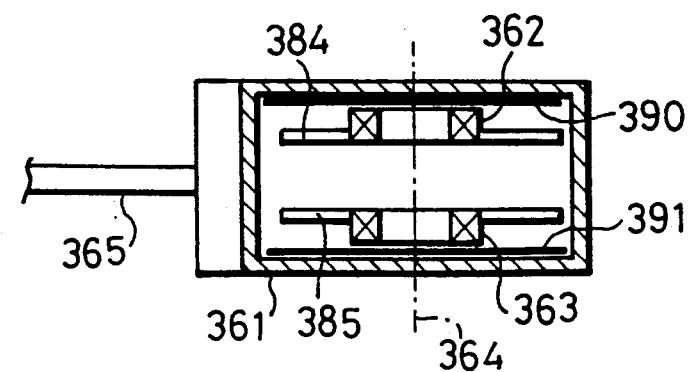
FIG. 94 is a sectional view showing still another embodiment of the photoelectric switch according to the sixth technical means of the present invention.

FIG. 94 shows a still another embodiment of the photoelectric switch in which a non-magnetic shield plate 390 is interposed between the reception coil 362 and the inner surface of the case 361, whereas a non-magnetic shield plate 391 is interposed between the transmission coil 363 and the inner surface of the case 361. With this embodiment, although the spacing between the transmission coil and the reception coil of the adjacent photoelectric switches is somewhat widened in comparison with the above embodiments, electrostatic noise from the exterior can be removed to prevent a malfunction due to such electrostatic noise.

Incidentally, although the photoelectric switches of the embodiments shown in FIGS. 91 to 94 are slightly increased in thickness and hence in size, magnetic interference between the reception coil and the transmission coil can be prevented.

Tenth technical means of the present invention will be next described with reference to FIGS. 95 to 99.

Figure 95:
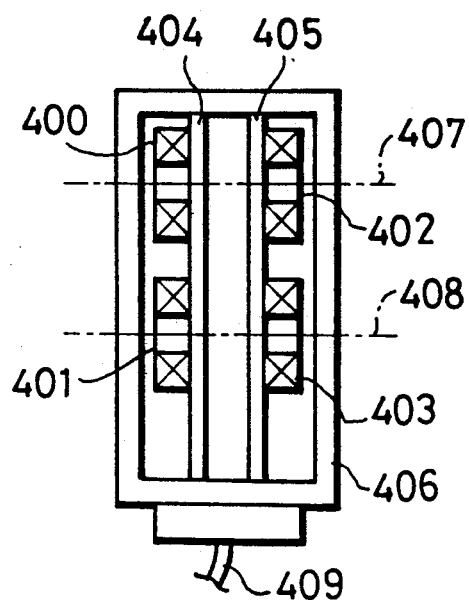
FIG. 95 is a view of the internal construction showing one embodiment according to a seventh technical means of the present invention.
Figure 97:
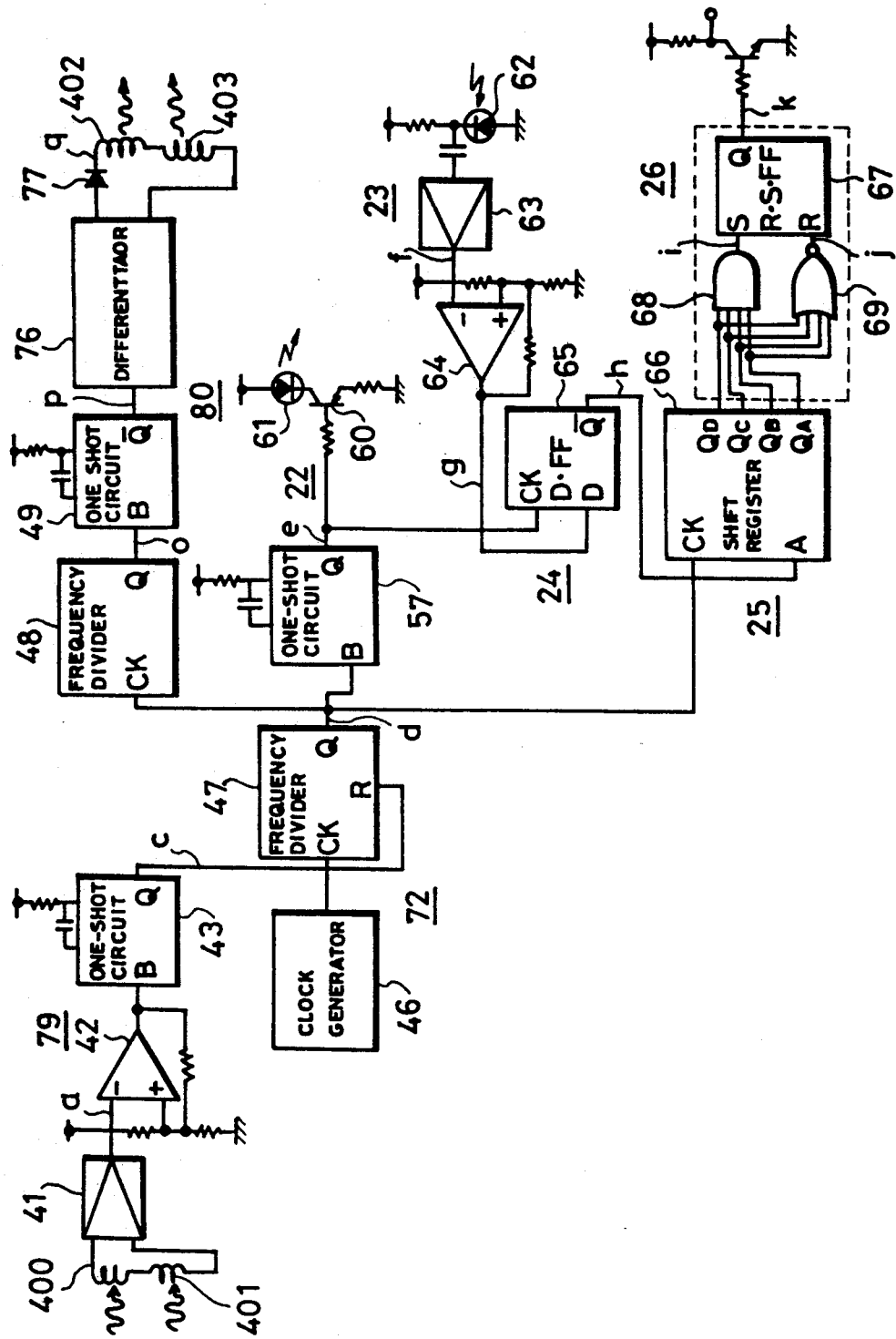
FIG. 97 is a block diagram showing a circuit arrangement of the photoelectric switch according to the embodiment shown in FIG. 95.

While FIG. 95 shows one embodiment of a photoelectric switch according to the tenth technical means of the present invention, the circuit arrangement of this embodiment will be first explained by referring to FIG. 97. Note that FIG. 97 has the same circuit arrangement as that of FIG. 5 set forth in connection with the first technical means except for having coils 400, 401, 402, 403, and the same components will not be described herein by putting the same reference numeral to them.

The circuit arrangement of FIG. 97 is different from that of the photoelectric switch shown in FIG. 5 in that the reception unit 79 includes the two coils 400, 401 serially connected to detect magnetic signals and, likewise, the excitation unit 80 includes the two coils 402, 403 serially connected to generate magnetic signals. The coils 400, 401 are wound in opposite directions and the coils 402, 403 are also wound in opposite directions. Particularly, the coils 400, 401 are wound to have the same number of windings.

In the excitation unit 80, a current due to the differential pulse g outputted from the diode 77 passes through the coils 402, 403, whereupon these coils 402, 403 simultaneously generate magnetic signals of opposite phases to each other. In the reception unit 79, as described later, when the magnetic signals of opposite phases to each other are sent thereto, the coils 400, 401 respectively detect the separate magnetic signals. Since the received magnetic signals have opposite phases to each other and the coils 400, 401 are wound in opposite directions, voltages induced in the coils 400, 401 by the magnetic coils have the same phase and supplied to the amplifier 41 after being added to each other. As a result, the synch timing signal is obtained from the one-shot circuit 43.

Meanwhile, if magnetic noise occurs, this magnetic noise is applied in the same phase to the coils 400, 401. Here, because the coils 400, 401 have the winding directions opposite to each other and the same number of windings, voltages induced in the coils 400, 401 by the magnetic noise have the same magnitude, but the phases opposite to each other. Accordingly, these induced voltages cancel each other and no pulse in outputted from the comparator 542.

As a result, even if the coils 400, 401 receive magnetic noise, it will not happen that the LED 61 generates an undesired sensing light, or the coils 402, 403 generate an undesired magnetic signal.

Incidentally, even if magnetic noise is received, no trouble occurs so long as the comparator 42 outputs no pulse. From this viewpoint, the numbers of windings of the coils 400, 401 are not necessarily required to be equal to each other.

FIG. 95 shows an array example of the coils 400, 401, 402, 403 in this embodiment.

In FIG. 95, the circuit boards 404, 405 constitute other circuit parts than the coils 400, 401, 402, 403, the LED 61 and the photodiode 62 in FIG. 97. The coils 400, 401 are mounted on the non-magnetic circuit board 404 and the coils 402, 403 are mounted on the non-magnetic circuit board 405, respectively, these circuit boards 404, 405 being housed in the case 406. The coils 400, 401 are disposed between the circuit board 404 and the inner surface of the case 406, whereas the coils 402, 403 are disposed between the circuit board 405 and the inner surface of the case 406. On this occasion, those coils 400, 401, 402, 403 are positioned possibly as close as to the inner surface of the case 406. Further, the coils 400, 401 are arranged to align on the same axis 407 and the coils 402, 403 are arranged to align on the same axis 408 parallel to the axis 407.

A fiber 409 sends the sensing light from the LED 61 (FIG. 97) to an object to be detected, and also sends the reflected light from the object to the photodiode 62 (FIG. 97).

Figure 96:
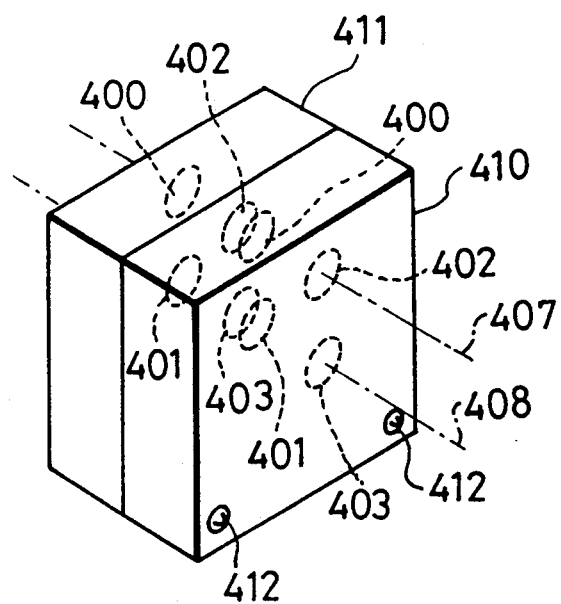
FIG. 96 is a perspective view showing a state that two photoelectric switches according to the embodiment shown in FIG. 95 are fixedly arrayed.

The photoelectric switch of this embodiment can be fixedly arrayed plural in number into line. FIG. 96 shows a state in which two such photoelectric switches are fixedly arrayed.

In FIG. 96, the photoelectric switches 410, 411 constructed as shown in FIG. 95 are fixedly arrayed by the use of screws 412. In this state, the axes 407, 408 are common to both the photoelectric switches 410, 411 and also parallel to the direction in which those photoelectric switches 410, 411 are arrayed. Accordingly, the respective coils 400, 402 of the photoelectric switches 410, 411 are positioned to align on the same axis 407 and, likewise, the coils 401, 403 are positioned to align on the same axis 408. Therefore, the coil 402 of the excitation unit of the photoelectric switch 411 and the coil 400 of the reception unit of the photoelectric switch 410 are precisely opposite to each other in a close relation and, likewise, the coil 403 in series to the coil 402 of the photoelectric switch 411 and the coil 401 in series to the coil 400 of the photoelectric switch 410 are precisely opposite to each other in a close relation.

Figure 98:
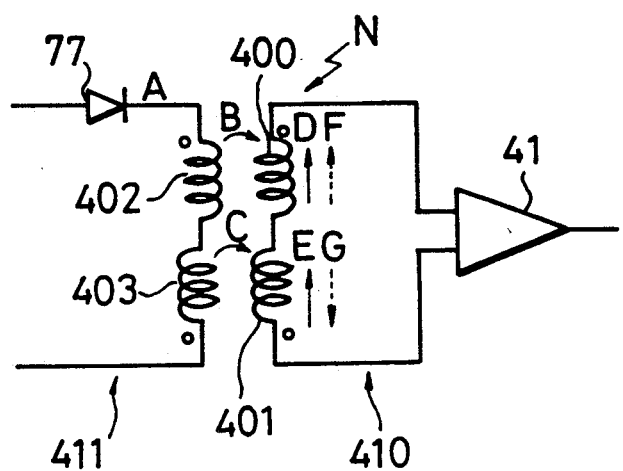
FIG. 98 is a diagram showing an action to effect magnetic signal transmission between the two photoelectric switches in FIG. 96.
Figure 99:
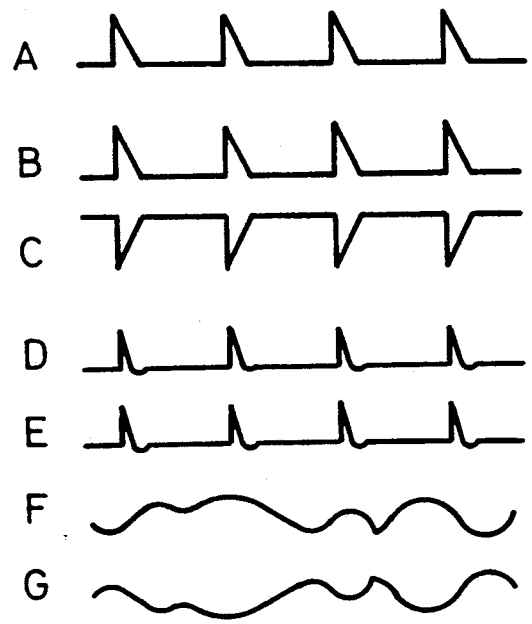
FIG. 99 is a chart of waveforms showing signals at various parts in FIG. 98.
Figure 100:
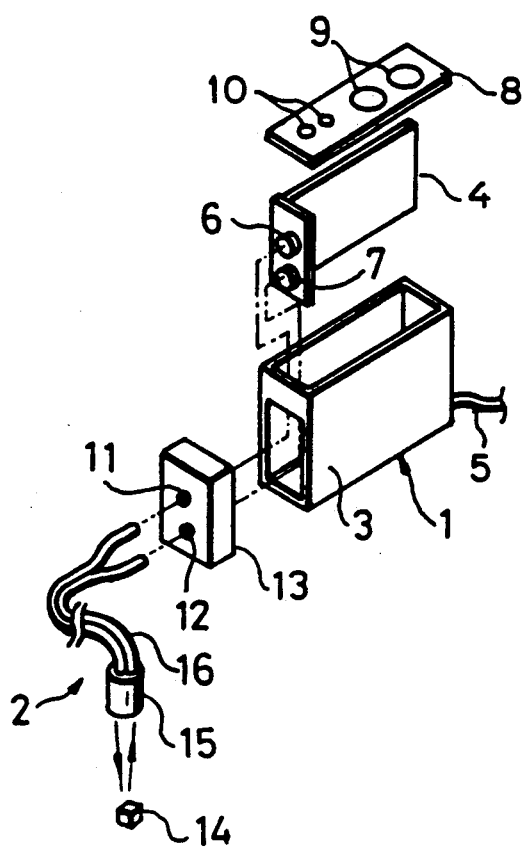
FIG. 100 is an exploded perspective view showing a conventional photoelectric switch of optical fiber type.
Figure 101:
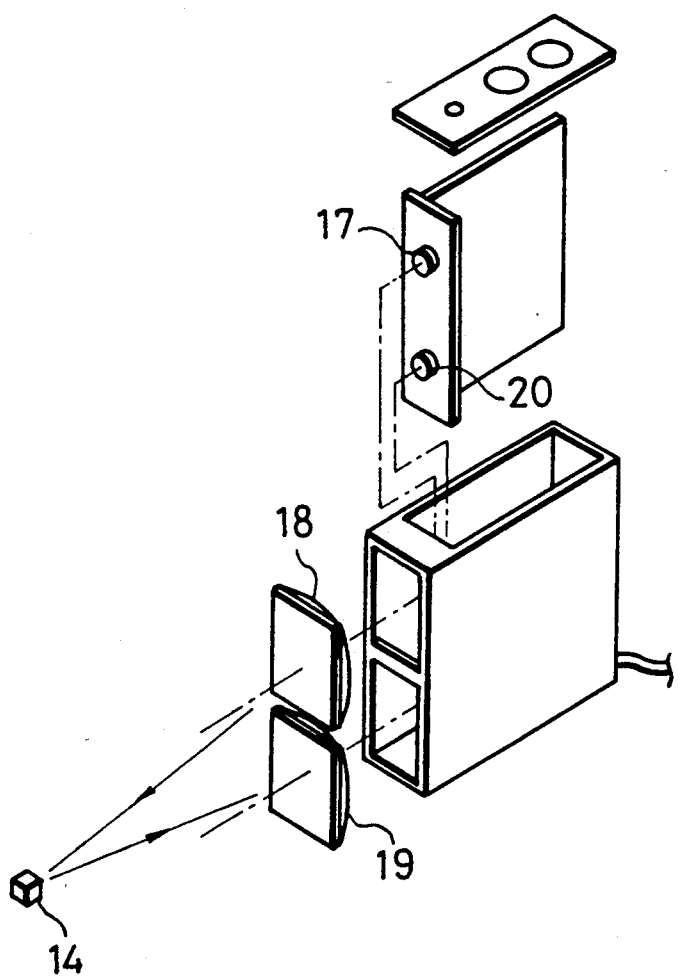
FIG. 101 is an exploded perspective view showing a conventional photoelectric switch of lens type.
Figure 102:
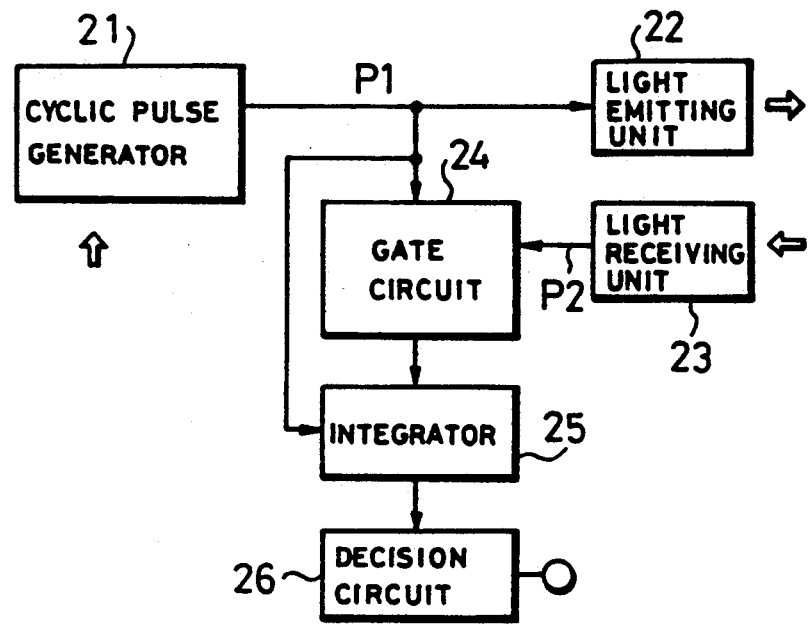
FIG. 102 is a block diagram showing one example of conventional photoelectric switches.
Figure 103:
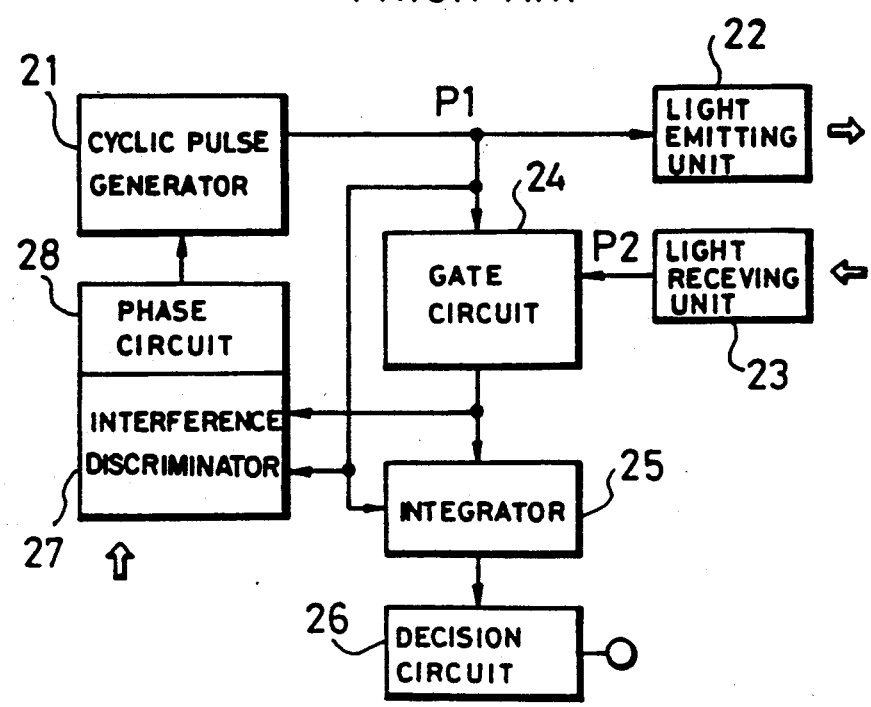
FIG. 103 is a block diagram showing another example of conventional photoelectric switches.
Figure 104:
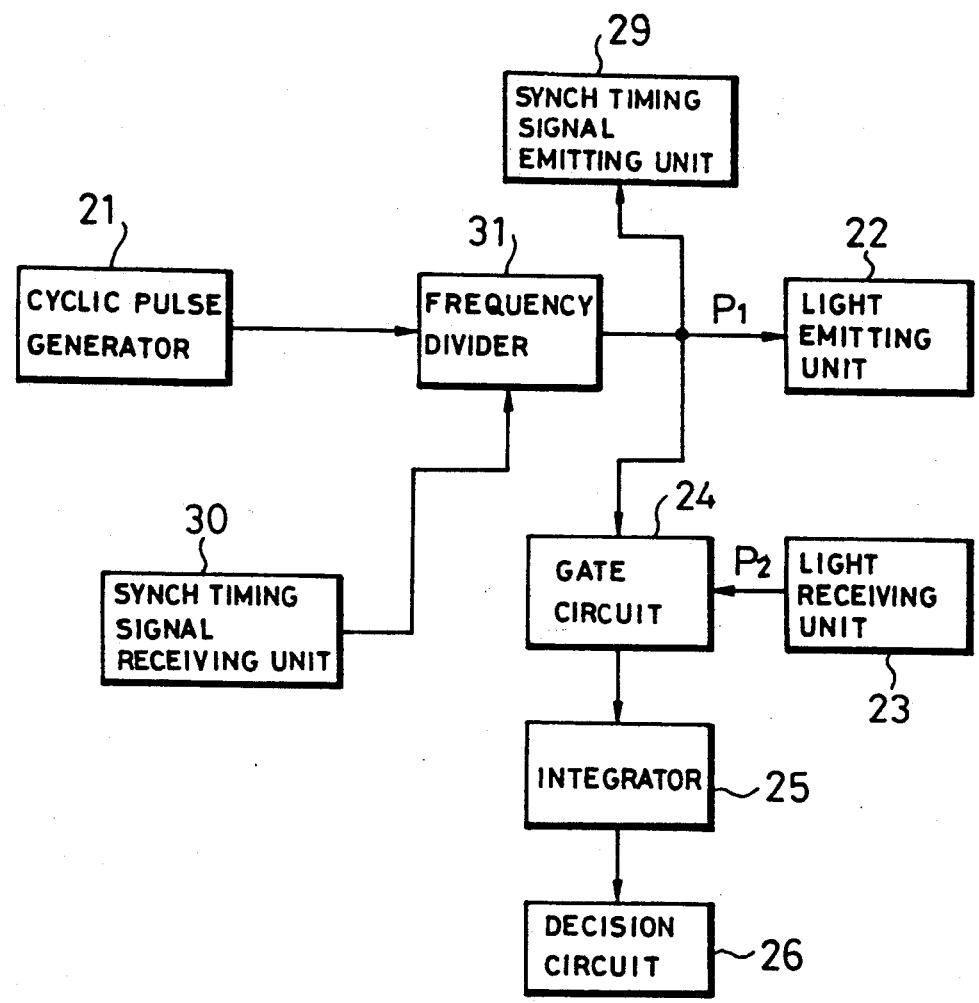
FIG. 104 is a block diagram showing still another example of conventional photoelectric switches.

Operation of the thus-closely-positioned coils 402, 403 and 400, 401 of the photoelectric switches 410, 411 will now be explained. In FIGS. 98 and 99 the latter of which shows the waveforms of signals at various parts in FIG. 98, when a differential pulse signal A passes from the diode 77 through the coils 402, 403, the coil 402 generates a magnetic signal B and, simultaneously, the coil 403 generates a magnetic signal C having phase opposite to that of the magnetic signal B. Because of the coils 402, 403 being respectively close to the coils 400, 401, most of the magnetic flux of the magnetic signal B penetrates through the coil 400 to cause an induced voltage D in the coil 400 corresponding to the magnetic signal B and also cause an induced voltage E in the coil 401 corresponding to the magnetic signal C.

Here, since the magnetic signals B, C are opposite in phase to each other, but the coils 400, 401 are wound in opposite directions, the induced voltage E in the coil 401 has the opposite phase to the magnetic signal C, on an assumption that the induced voltage D in the coil 400 has the same phase as the magnetic signal B. Accordingly, the induced voltages D, E have the same phase and the added voltage thereof is supplied to the amplifier 41.

Now, if magnetic noise N occurs and is applied to the coils 400, 401, the magnetic noises applied to the respective coils have the same phase, meaning that the magnetic noise N causes an induced voltage F in the coil 400 and an induced voltage G in the coil 401 which are opposite in phase to each other. Therefore, these induced voltages F, G cancel to each other so that the noise component due to the magnetic noise inputted to the amplifier 41 becomes zero or sufficiently small.

Moreover, although the magnetic noise N also causes induced voltages in the coils 402, 403, these induced voltages cancel each other because the coils 402, 403 are wound in opposite directions. As a result, no appreciable noise component due to the magnetic noise is transmitted from the side of the coils 402, 403 to the side of the coils 400, 401.

It should be understood that the above-mentioned embodiment can be used solely. In this case, since no magnetic signal is sent from the other photoelectric switch, the one-shot circuit 43 does not generate the synch timing signal c and the LED 61 generates the sensing light at a certain cycle defined by the output pulse of the frequency divider 47. Further, even if undesired magnetic noise are entered externally and detected by the coils 400, 401, the resultant induced voltages cancel to each other as explained above and the one-shot circuit 43 does not generate the synch timing signal. Also in this case, therefore, the LED 61 generates the sensing light at the certain cycle.

With the first technical means, even when a plurality of photoelectric switches are arranged closely or close-contactly to each other, the emission timings of the sensing lights from the respective photoelectric switches can be made not overlap with one another. Therefore, even if a larger number of photoelectric switches than the prior art are concentratedly installed in one place, mutual interference therebetween can be totally prevented.

Further, since the generation timing of the transmission light or the magnetic signal is always delayed in comparison with the emission timing of the sensing light, drive loads of the photoelectric switches are distributed over time, making it possible to eliminate adverse effects such as instability in the operating point due to excessive loads and a decrease in effective detection sensitivity.

In the case of shifting the emission timings of the sensing lights from each other between the respective photoelectric switches by using the magnetic signal, a response delay in the synch timing signal receiving unit can become smaller than the case of shifting the emission timings of the sensing lights from each other between the respective photoelectric switches by using the transmission light, with the result of detecting an object at a higher speed.

With the second and third technical means, since the sensing lights can be generated in a random and completely independent relation between the photoelectric switches, mutual interference between the photoelectric switches can be sufficiently reduced down to a negligible level. Additionally, the pulse generator for generating the sensing light can be realized just by adding an existing circuit of simple construction, such as a white noise generator, with a superior advantage of avoiding an increase in complexity of the circuit construction.

With the fourth and fifth technical means, a plurality of photoelectric switches concentratedly installed in one place can be operated successively through transmission of the light pulse signal. Accordingly, the necessity of mutual interference preventing means with complicated circuit construction can be eliminated, and mutual interference of the light emission timings between the photoelectric switches can be prevented positively.

With sixth and seventh technical means, a plurality of photoelectric switches concentratedly installed in one place can be operated successively through transmission of the light pulse signal. Accordingly, the necessity of mutual interference preventing means with complicated circuit construction can be eliminated, and mutual interference of the light emission timings between the photoelectric switches can be prevented positively.

With the eighth technical means, a plurality of photoelectric switches concentratedly installed in one place can be operated successively through transmission of the light pulse signal. Accordingly, the necessity of mutual interference preventing means with complicated circuit construction can be eliminated, and mutual interference of the light emission timings between the photoelectric switches can be prevented positively. Further, between a plurality of the photoelectric switches concentratedly installed in one place, the auxiliary cores provided on the side walls of the two cases adjacent to each other are positioned in an extremely close and precisely opposite relation, thus resulting in high transmission efficiency of the delay timing signal.

With the ninth technical means, when a plurality of photoelectric switches are fixedly arrayed into line, the excitation means and the reception means can be positioned in a precisely opposite and sufficiently close relation between every two photoelectric switches adjacent to each other, the excitation means and the reception means of the two photoelectric switches are positioned in a precisely opposite relation, so that most of the magnetic signal from the excitation means can be taken by the reception means with the result of sufficiently high transmission efficiency of the synch timing signal.

With the tenth technical means, operation responsive to undesired external magnetic noise can be operated. Therefore, even when a plurality of photoelectric switches are arrayed into line to emit the sensing light in a time-sharing manner, it is possible to prevent an influence due to magnetic noise and carry out correct operation free from mutual interference.

What is claimed is:

1. A photoelectric switch comprising:
   reception means for receiving a cyclic synch timing signal from an external source,
   light emitting means for emitting said sensing light in synchronism with said synch timing signal,
   light receiving means for receiving a portion of said sensing light reflected from an object and for generating a reception signal in response to said received sensing light portion, and
   delay timing signal generating means for generating and transmitting a delay timing signal to an external destination, said delay timing signal being delayed by a predetermined period of time from said received synch timing signal.

2. A photoelectric switch according to claim 1, wherein said reception means includes a photodetector, said synch timing signal is a light pulse and said delay timing signal generating means includes a second light generating means for transmitting said delay timing signal as a light pulse.

3. A photoelectric switch according to claim 1, wherein said reception means includes a first coil, said synch timing signal is a magnetic pulse and said delay timing signal generating means includes a second coil for transmitting said delay timing signal as a magnetic pulse.

4. A photoelectric switch according to claim 1, wherein said synch timing signal has a cycle longer than the cycle of said sensing light and received intermittently with respect to said sensing light.

5. A photoelectric detector comprising a plurality of photoelectric switches which are disposed relative to each other in a series and in which the presence of one or more objects is determined by each of said plurality of photoelectric switches by emitting a sensing light and detecting a portion of the sensing light reflected from the one or more objects, each photoelectric switch comprising:
   reception means for receiving a cyclic synch timing signal,
   light emitting means for emitting said sensing light in synchronism with said synch timing signal,
   light receiving means for receiving a portion of said sensing light reflected from an object and for generating a reception signal in response to said received sensing light portion, and
   delay timing signal generating means for generating and transmitting a delay timing signal delayed by a predetermined period of time from said received synch timing signal,
wherein said synch timing signal received by a first reception means of a first photoelectric switch is sent from a first delay timing signal generating means of a second photoelectric switch which precedes said first photoelectric switch in said series, and a second delay timing signal sent from a second delay timing signal generating means of said first switch is received by a second reception means of a third photoelectric switch which follows said first switch in said series.

6. A photoelectric switch in which the presence of an object is determined by emitting a sensing light and detecting a portion of the sensing light reflected from the object, the photoelectric switch comprising:
   pulse generating means for generating a pulse at a predetermined cycle,
   white noise generating means for generating white noise,
   pulse position modulating means for comparing said pulse and said white noise, and for generating a position-modulated pulse having a random cycle based on the white noise generated by said white noise generating means, and
   light emitting means for emitting said sensing light in response to the position-modulated pulse.

7. A photoelectric switch in which the presence of an object is determined by emitting a sensing light and detecting a portion of the sensing light reflected from the object, the photoelectric switch comprising:
   white noise generating means for generating white noise,
   pulse generating means for successively outputting first pulses having pulse widths determined in response to a level of said white noise,
   pulse position modulating means for receiving the first pulses output from said pulse generating means and for generating second pulses having a constant pulse width and position-modulated in response to the pulse widths of said first pulses, and light emitting means for emitting said sensing light in response to the second pulses generated by said pulse position modulating means.

8. A photoelectric detector comprising a plurality of photoelectric switches connected to each other in a series, each of said photoelectric switches comprising:

a detection light emitting element for intermittently emitting a sensing light in response to a synch timing signal, a detection light receiving element disposed to receive a reflected portion of said sensing light, whereby the presence of an object is determined on whether the reception of said reflected portion matches in timing with the emission of said sensing light by said detection light emitting element, a transmission light receiving element for receiving a first light pulse signal transmitted through a first optical fiber, synch timing signal generating means for generating said synch timing signal, in synchronism with said light pulse signal, and for outputting said synch timing signal to said detection light emitting element, delay timing signal generating means for generating a delay timing signal delayed by a predetermined period of time from said synch timing signal, a transmission light emitting element for emitting a second light pulse signal in response to said delay timing signal, and a second optical fiber for transmitting the second light pulse signal to a subsequent one of said plurality of photoelectric switches in said series.

9. A photoelectric detector comprising a plurality of photoelectric switches connected to each other in a series, each of said photoelectric switches comprising:

a detection light emitting element for intermittently emitting a sensing light in response to a delay timing signal, a detection light receiving element disposed to receive a reflected portion of said sensing light, whereby the presence of an object is determined on whether the reception of said reflected portion matches in timing with the emission of said sensing light by said detection light emitting element, a transmission light receiving element for receiving a first light pulse signal transmitted through a first optical fiber, signal generating means for generating said delay timing signal in response to said first light pulse signal, said delay timing signal being delayed by a predetermined period of time from said first light pulse signal, and for outputting said delay timing signal to said detection light emitting element, a transmission light emitting element for emitting a second light pulse signal in synchronism with said delay timing signal, and a second optical fiber for transmitting the second light pulse signal to a subsequent one of said plurality of photoelectric switches in said series.

10. A photoelectric detector comprising a plurality of photoelectric switches connected to each other in a series, each of said photoelectric switches comprising:

a detection light emitting element for emitting a sensing light in response to one of a synch timing signal and a delay timing signal, a detection light receiving element disposed to receive a reflected portion of said sensing light, whereby the presence of an object is determined on whether the reception of said reflected portion matches in timing with the emission of said sensing light by said detection light emitting element, a transmission light receiving element for receiving a first light pulse signal, signal generating means for generating, in response to said first light pulse signal, one of said synch timing signal in synchronism with said first light pulse signal and said delay timing signal delayed by a predetermined period of time from said first light pulse signal, and outputting said one of said synch timing signal and said delay timing signal to said detection light emitting element, and a transmission light emitting element for emitting a second light pulse signal in response to said one of said synch timing signal and said delay timing signal, wherein said transmission light receiving element and said transmission light emitting element of each of said plurality of photoelectric switches are directed away from each other, and wherein said plurality of photoelectric switches are aligned on a straight line such that a light receiving axis of each said transmission light receiving element and the light emitting axis of each said transmission light emitting element are aligned with said straight line, so that said second light pulse signal is transmitted from said transmission light emitting element of a first sequential photoelectric switch and received as said first light pulse signal by said transmission light receiving element of a second sequential photoelectric switch.

11. A photoelectric detector comprising a plurality of photoelectric switches connected to each other in a series, each of said photoelectric switches comprising:

a detection light emitting element for intermittently emitting a sensing light in response to one of a synch timing signal and a delay timing signal, a detection light receiving element disposed to receive a reflected portion of said sensing light, whereby the presence of an object is determined on whether the reception of said reflected portion matches in timing with the emission of said sensing light by said detection light emitting element, a reception light refractor for refracting an optical path of a first light pulse signal incident upon said refractor, a transmission light receiving element for receiving said refracted first light pulse signal, signal generating means for generating, in response to said refracted first light pulse signal, one of said synch timing signal in synchronism with said refracted first light pulse signal and said delay timing signal delayed by a predetermined period of time from said refracted first light pulse signal, and outputting said one of said synch timing signal and said delay timing signal to said detection light emitting element, a transmission light emitting element for emitting a second light pulse signal in in response to said one of said synch timing signal and said delay timing signal, a transmission light refractor for refracting said second light pulse signal emitted from said transmission light emitting element such that said refracted second light pulse signal is directed to a next sequential photoelectric switch.

12. A photoelectric detector comprising a plurality of photoelectric switches connected to each other in a series, each of said photoelectric switches comprising:
   a detection light emitting element for intermittently emitting a sensing light in response to one of a synch timing signal and a delay timing signal,
   a detection light receiving element disposed to receive a reflected portion of said sensing light, whereby the presence of an object is determined on whether the reception of said reflected portion matches in timing with the emission of said sensing light by said detection light emitting element,
   reception means disposed on a first side of said photoelectric switch for receiving a pulse-like first magnetic signal,
   signal generating means for generating, in response to said first magnetic signal, one of said synch timing signal in synchronism with said magnetic signal and said delay timing signal delayed by a predetermined period of time from said magnetic signal, and outputting said one of said synch timing signal and said delay timing signal to said light emitting element, and
   excitation means disposed on a second side of said photoelectric switch for outputting a pulse-like second magnetic signal in synchronism with said one of said synch timing signal and said delay timing signal,
   wherein at least one of said reception means and said excitation means includes an auxiliary core provided on a side wall of said case, said plurality of photoelectric switches being aligned such that said reception means, said excitation means and said auxiliary cores of all of said plurality of photoelectric switches are disposed along a common axis such that said second magnetic signal is transmitted from said excitation means of a first photoelectric switch to said reception means of a second photoelectric switch via said auxiliary core.

13. A photoelectric detector in which a plurality of photoelectric switches are serially arrayed in a line, each of said plurality of photoelectric switches comprising:
   a light emitting unit for outputting a pulse-like sensing light,
   a light receiving unit for receiving said sensing light reflected by an object,
   excitation means for generating a pulse-like first magnetic signal and outputting said first magnetic signal to a subsequent one of said plurality of photoelectric switches in said series,
   reception means for receiving a second magnetic signal from said excitation means of a previous one of said plurality of photoelectric switches in said series, and
   a control unit for setting, in response to said second magnetic signal received by said reception means, the output timing of said sensing light in said emitting unit and the output timing of said first magnetic signal in said excitation means,
   said plurality of photoelectric switches being aligned such that respective said excitation means and said reception means lie on a common axis which is parallel to the line in which said photoelectric switches are disposed.

14. A photoelectric detector according to claim 13, wherein said excitation means and said reception means of each said photoelectric switch comprise cores of magnetic material with coils wound around said cores.

15. A photoelectric detector according to claim 13, wherein a recess is provided in each of inner surfaces of a case for each said photoelectric switch, and said excitation means and said reception means are separately fitted into said recesses in a fixed manner.

16. A photoelectric detector according to claim 13, wherein said excitation means and said reception means of each said photoelectric switch are both built in a case.

17. A photoelectric detector according to claim 13, wherein a non-magnetic shield member is provided in each of inner surfaces of a case for each said photoelectric switch, and said excitation means and said reception means are disposed inside said non-magnetic shield member.

18. A photoelectric detector in which a plurality of photoelectric switches are serially arrayed in a line, each of said plurality of photoelectric switches comprising:
   a light emitting unit for outputting a pulse-like first sensing light,
   a light receiving unit for receiving said sensing light reflected by an object,
   excitation means for generating a pulse-like first magnetic signal,
   reception means for receiving said magnetic signal from said excitation means of a previous one of said plurality of photoelectric in said series, and
   a control unit for setting, in response to said second magnetic signal received by said reception means, the output timing of said sensing light in said light emitting unit and the output timing of said first magnetic signal in said excitation means,
   wherein said excitation means comprises two coils wound in opposite directions and connected in series, and said reception means also comprises two coils wound in opposite directions and connected in series, and
   said coils of said excitation means and said reception means being disposed such that one coil of said excitation means of a first photoelectric switch is disposed opposite to one coil of said reception means of an adjacent second photoelectric switch subsequent to said first photoelectric switch in said series and the other coil of said excitation means of said first photoelectric switch is closely opposite to the other coil of said reception means of said adjacent second photoelectric switch.

* * * * *